US010466421B2

United States Patent
Menard et al.

(10) Patent No.: US 10,466,421 B2
(45) Date of Patent: Nov. 5, 2019

(54) METHODS AND SYSTEM FOR WAVELENGTH TUNABLE OPTICAL COMPONENTS AND SUB-SYSTEMS

(71) Applicant: AEPONYX INC., Repentigny (CA)

(72) Inventors: Francois Menard, Trois-Rivieres (CA); Michael Menard, Verdun (CA); Frederic Nabki, Montreal (CA); Martin Berard, Repentigny (CA); Jonathan Briere, Terrebonne (CA)

(73) Assignee: Aeponyx Inc., Montreal, Quebec (CA)

( * ) Notice: Subject to any disclaimer, the term of this patent is extended or adjusted under 35 U.S.C. 154(b) by 0 days.

(21) Appl. No.: 15/124,198

(22) PCT Filed: Mar. 9, 2015

(86) PCT No.: PCT/CA2015/000135
§ 371 (c)(1),
(2) Date: Sep. 7, 2016

(87) PCT Pub. No.: WO2015/131270
PCT Pub. Date: Sep. 11, 2015

(65) Prior Publication Data
US 2017/0017042 A1    Jan. 19, 2017

Related U.S. Application Data

(60) Provisional application No. 61/949,484, filed on Mar. 7, 2014, provisional application No. 61/950,238, filed
(Continued)

(51) Int. Cl.
*G02B 6/12*    (2006.01)
*G02B 6/35*    (2006.01)
(Continued)

(52) U.S. Cl.
CPC ....... *G02B 6/3518* (2013.01); *G02B 6/12002* (2013.01); *G02B 6/124* (2013.01);
(Continued)

(58) Field of Classification Search
CPC .... G02B 6/3512; G02B 6/3518; G02B 6/124; G02B 6/357; G02B 6/3596;
(Continued)

(56) References Cited

U.S. PATENT DOCUMENTS

| 2002/0018496 A1* | 2/2002 | Gutin ...................... H01S 5/141 372/20 |
| 2003/0108284 A1* | 6/2003 | Danagher .............. G02B 6/272 385/24 |

(Continued)

*Primary Examiner* — Thomas A Hollweg
*Assistant Examiner* — Mary A El-Shammaa
(74) *Attorney, Agent, or Firm* — Rosenberg, Klein & Lee

(57) ABSTRACT

Wavelength division multiplexing (WDM) has enabled telecommunication service providers to provide multiple independent multi-gigabit channels on one optical fiber. To meet demands for improved performance, increased integration, reduced footprint, reduced power consumption, increased flexibility, re-configurability, and lower cost monolithic optical circuit technologies and microelectromechanical systems (MEMS) have become increasingly important. However, further integration via microoptoelectromechanical systems (MOEMS) of monolithically integrated optical waveguides upon a MEMS provide further integration opportunities and functionality options. Such MOEMS may include MOEMS mirrors and optical waveguides capable of deflection under electronic control. In contrast to MEMS devices where the MEMS is simply used to switch between two positions the state of MOEMS becomes important in all transition positions. Improvements to the design and implementation of such MOEMS mirrors, deformable MOEMS waveguides, and optical waveguide technologies supporting MOEMS devices are presented where monolithically inte-
(Continued)

grated optical waveguides are directly supported, moved and/or deformed by a MEMS.

22 Claims, 33 Drawing Sheets

Related U.S. Application Data on Mar. 10, 2014, provisional application No. 62/037,655, filed on Aug. 15, 2014.

(51) Int. Cl.
*G02B 6/124* (2006.01)
*H01S 5/12* (2006.01)

(52) U.S. Cl.
CPC ........... *G02B 6/357* (2013.01); *G02B 6/3596* (2013.01); *H01S 5/12* (2013.01); *G02B 2006/12147* (2013.01)

(58) Field of Classification Search
CPC . G02B 6/12002; G02B 6/12007; H01S 5/141; H01S 5/021; H01S 5/02216; H01S 5/12
See application file for complete search history.

(56) References Cited

U.S. PATENT DOCUMENTS

| | | | | |
|---|---|---|---|---|
| 2007/0230867 | A1* | 10/2007 | Chen | G02B 6/2713 385/24 |
| 2009/0232446 | A1* | 9/2009 | Nagy | G02B 6/29311 385/18 |
| 2011/0051143 | A1* | 3/2011 | Flanders | H01S 5/5018 356/451 |
| 2012/0026503 | A1* | 2/2012 | Lewandowski | G01N 21/4795 356/477 |
| 2012/0294321 | A1* | 11/2012 | Ma | G02B 5/288 372/20 |

\* cited by examiner

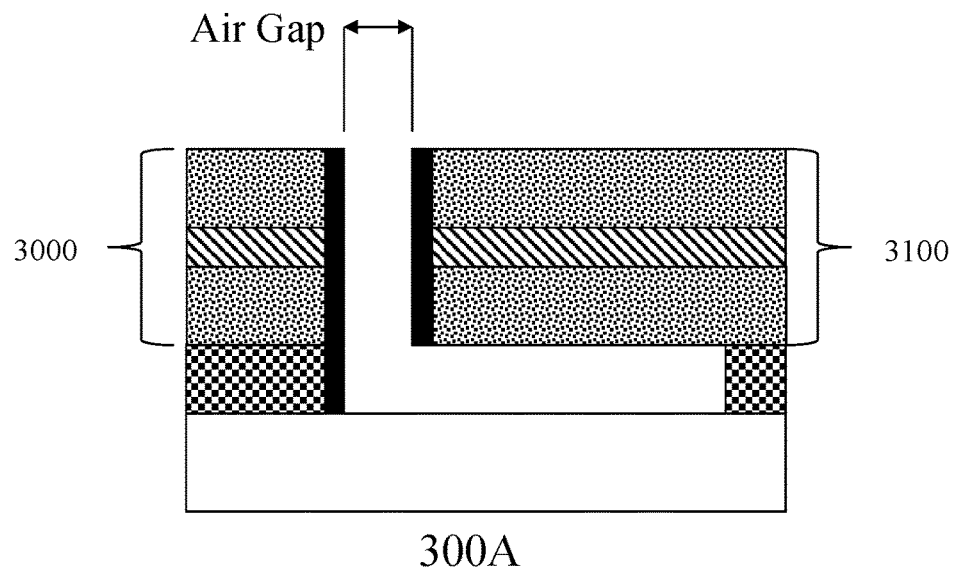
300A
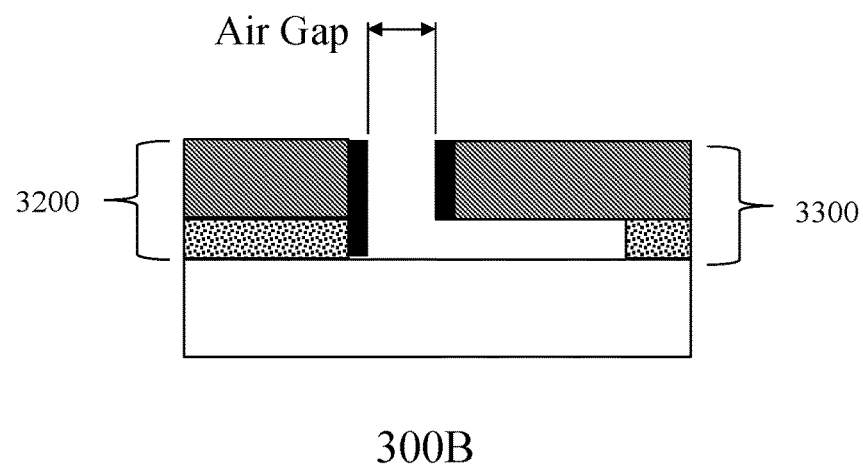
300B
|▓▓▓| 310 Aluminum
|▓▓▓| 320 Silicon
|▓▓▓| 330 Silicon Dioxide (SiO$_2$)
|▓▓▓| 340 Silicon Nitride (Si$_3$N$_4$)
|▓▓▓| 350 Polyimide
|▬▬| 360 Anti-Reflection Coating
Figure 3

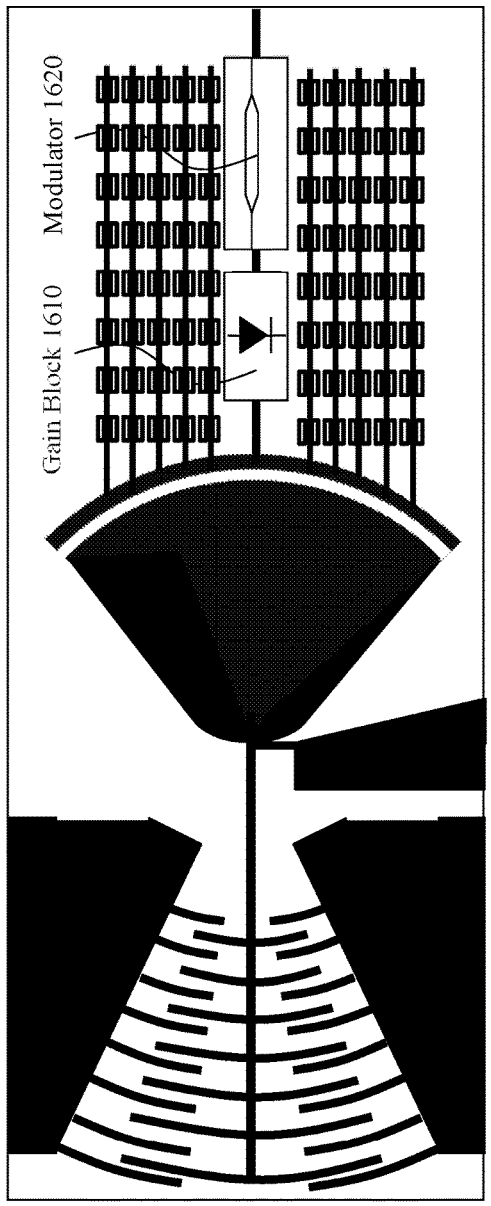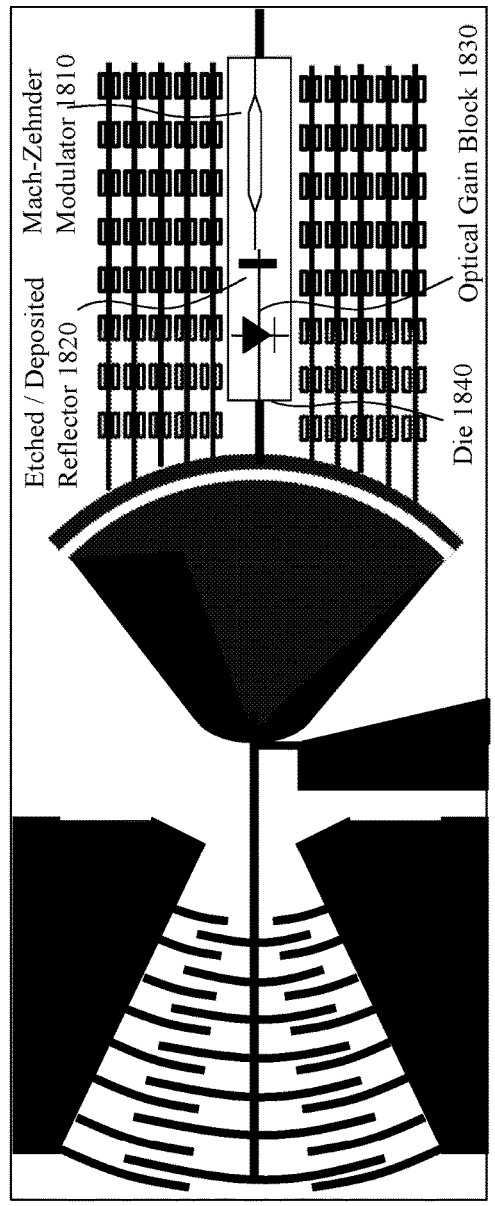
Figure 16  1600
Figure 18  1800

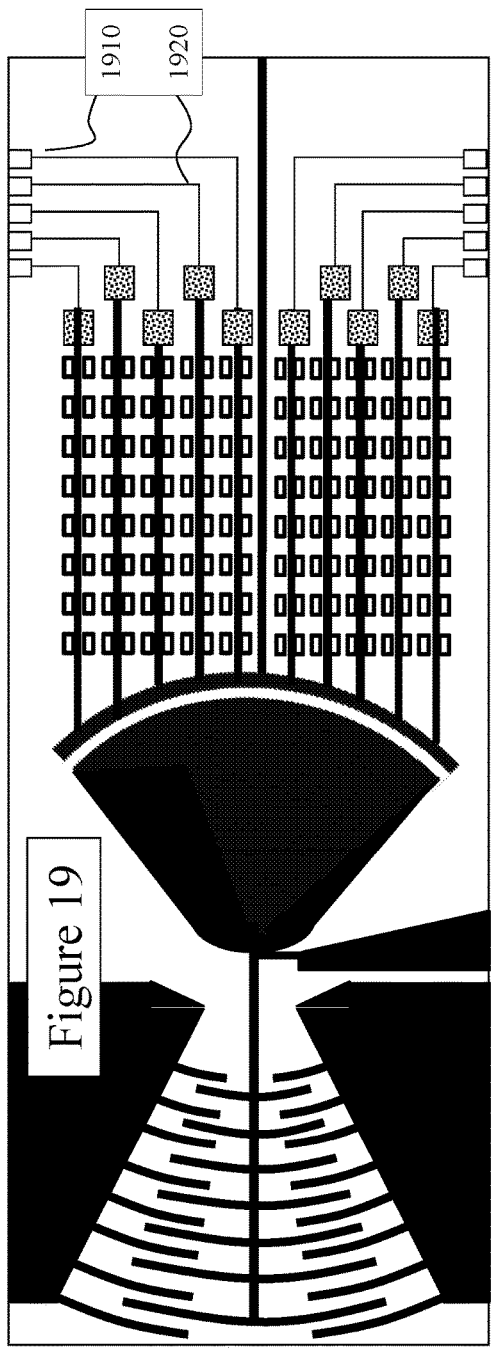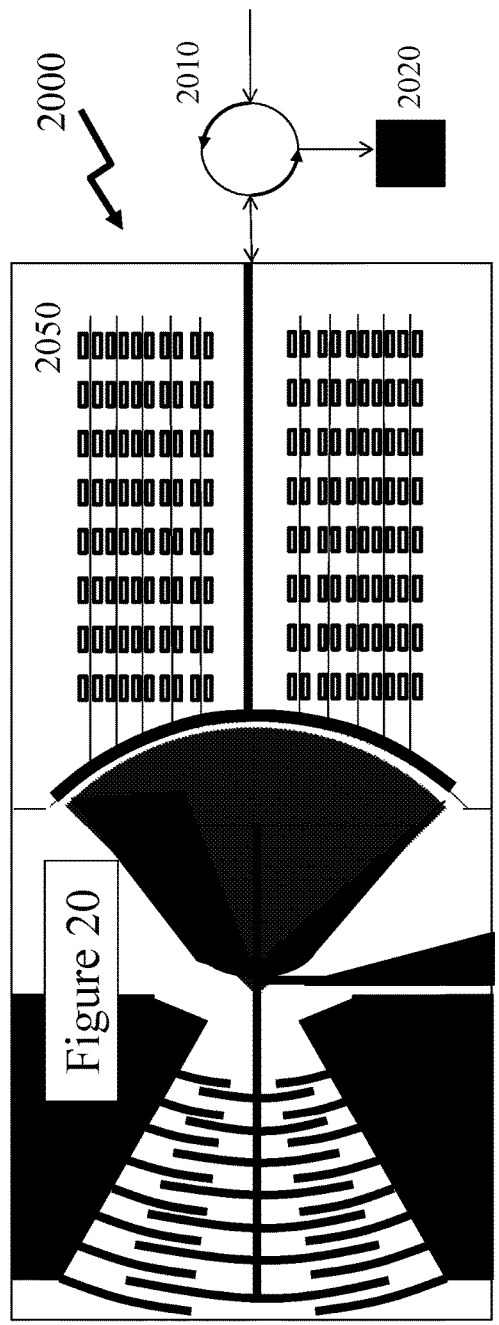

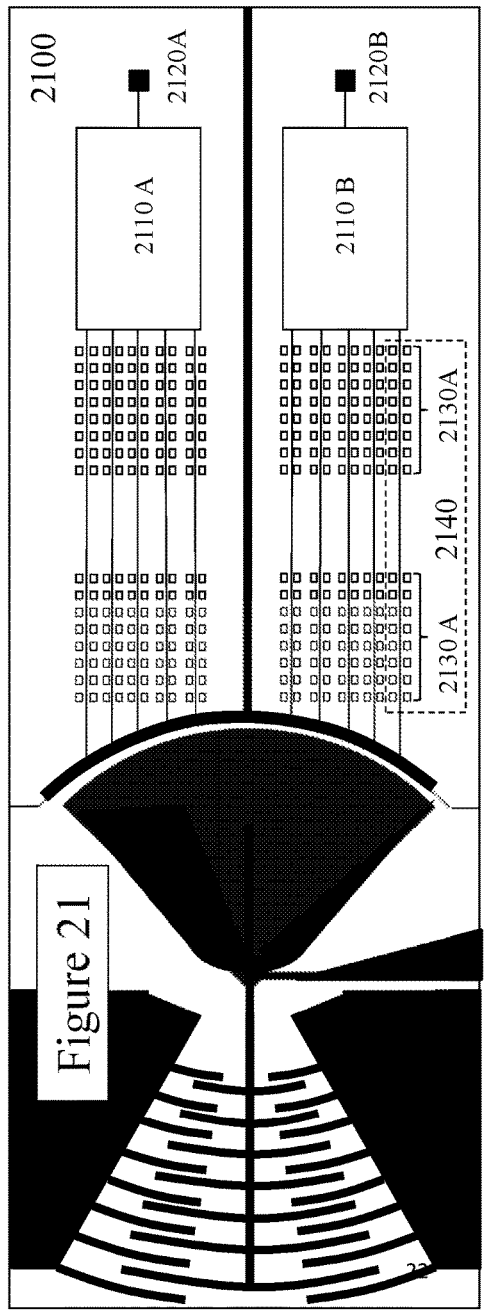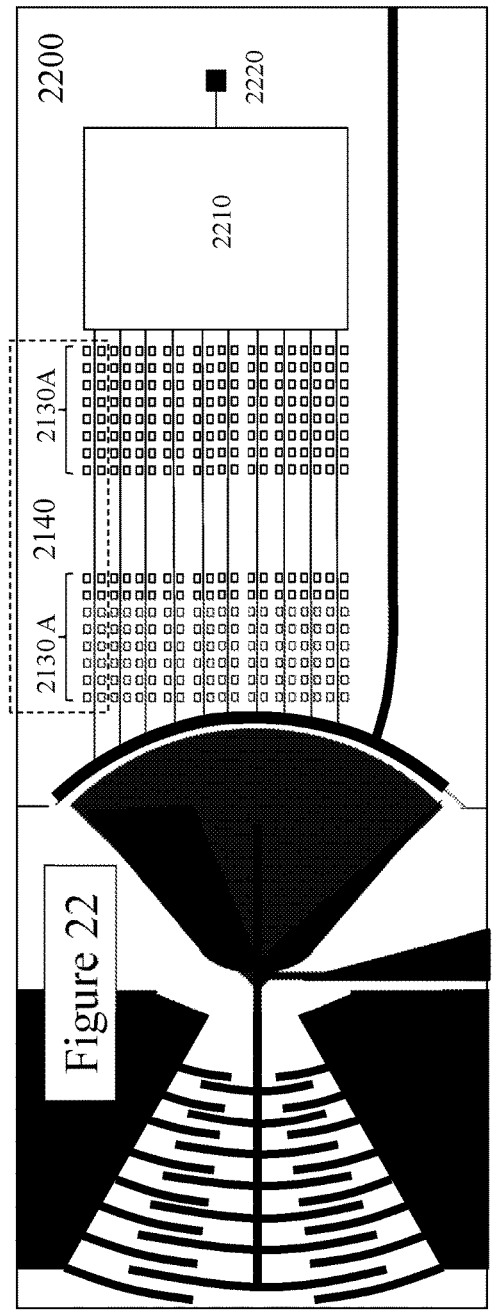

▓▓▓ 380 Gold　　▒▒▒ 330 Silicon Dioxide (SiO$_2$)
▓▓▓ 320 Silicon　▓▓▓ 340 Silicon Nitride (Si$_3$N$_4$)

● 380 Gold  ● 330 Silicon Dioxide (SiO₂)
● 320 Silicon  ● 340 Silicon Nitride (Si₃N₄)

METHODS AND SYSTEM FOR WAVELENGTH TUNABLE OPTICAL COMPONENTS AND SUB-SYSTEMS

REFERENCE TO RELATED APPLICATIONS

This application is being filed as a National Stage of PCT/CA2015/000135, filed 9 Mar. 2015, currently pending, which is based on U.S. Patent Application Ser. No. 61/949,484, filed 7 Mar. 2014; U.S. Patent Application Ser. No. 61/950,238, filed 10 Mar. 2014; and, U.S. Patent Application Ser. No. 62/037,655, filed 15 Aug. 2014.

FIELD OF THE INVENTION

This invention relates to microoptoelectromechanical systems (MOEMS) and more particular to designs and enhancements for optical microelectromechanical systems (MEMS) waveguides and mirrors as well as optical components exploiting such optical MEMS elements.

BACKGROUND OF THE INVENTION

Wavelength division multiplexing (WDM) has enabled telecommunication service providers to fully exploit the transmission capacity of optical fibers in their core network. State of the art systems in long-haul networks now have aggregated capacities of terabits per second. Moreover, by providing multiple independent multi-gigabit channels, WDM technologies offer service providers with a straight forward way to build networks and expand networks to support multiple clients with different requirements. At the same time these technologies have evolved from long haul networks down to the access networks as well as into data centers, to support the continuing inexorable demand for data. In order to reduce costs, enhance network flexibility, reduce spares, and provide reconfigurability many service providers have migrated away from fixed wavelength transmitters, receivers, and transceivers, to wavelength tunable transmitters, receivers, and transceivers as well as wavelength dependent add-drop multiplexers, space switches etc. However, to meet the competing demands for improved performance, increased integration, reduced footprint, reduced power consumption, increased flexibility, reconfigurability, and lower cost the prior art solutions using discrete components must be superseded. Accordingly, within the technologies to exploit/adopt are monolithic optical circuit technologies, hybrid optoelectronic integration, microelectromechanical systems (MEMS), and microoptoelectromechanical systems (MOEMS).

An essential MOEMS element in a WDM system is a MOEMS mirror or waveguide capable of deflection under electronic control. However, unlike most MEMS device configurations where the MEMS is simply used to switch between positions, when the MEMS includes an optical waveguide, the state of MOEMS becomes important in all transition positions. The characteristics of the MEMS determines the characteristics of the WDM system in that it affects the number of wavelength channels and the dynamic wavelength switching capabilities of the system. The role of the MEMS becomes essential in an integrated photonic device such as it is responsible not only for altering the paths of light but directing light through a plurality of wavelength filters which allows the reflection or transmission of a dedicated, mono-chromatic light.

Accordingly, it would be beneficial to improve the performance of such MEMS and thereby the performance of the optical components and optical systems they form part of. Beneficially, the inventors have established a range of improvements to the design and implementation of such MOEMS mirrors and MOEMS waveguides as well as optical waveguide technologies supporting the extension of these device concepts in datacom, telecom, sensors, optical delay lines, and mid-infrared optical spectroscopy for example.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations in the prior art relating to microoptoelectromechanical systems (MOEMS) and more particular to designs and enhancements for optical microelectromechanical systems (MEMS) waveguides and mirrors as well as optical components exploiting such optical MEMS elements.

In accordance with an embodiment of the invention there is provided a device comprising:
an optical waveguide structure comprising a first predetermined portion formed from a plurality of three-dimensional (3D) optical waveguides for routing an optical signal upon a substrate and a second predetermined portion comprising a two-dimensional (2D) optical waveguide for routing the optical signals from a first subset of the plurality of 3D optical waveguides to a second subset of the plurality of 3D optical waveguides; and
a rotational microoptoelectromechanical (MOEMS) element comprising a pivot, an actuator, and the 2D optical waveguide; wherein
a predetermined rotation of the MOEMS element under the motion of the actuator results in the coupling configuration between an optical waveguide of the first subset of the plurality of 3D optical waveguides being coupled to a predetermined optical waveguide within the second subset of the plurality of 3D optical waveguides.

In accordance with an embodiment of the invention there is provided a device comprising:
a rotatable MEMS element forming a predetermined portion of a wavelength tunable reflector having an optical waveguide for coupling optical signals to and from the wavelength tunable reflector;
a reflective optical gain block coupled to the optical waveguide; wherein
the rotatable MEMS element sets the wavelength tunable reflector in dependence upon selection of a wavelength reflective filter from a plurality of wavelength reflective filters by rotation of the rotatable MEMS element wherein the optical signals propagate within a planar waveguide forming a first predetermined portion of the MEMS element and are reflected by a mirror forming a second predetermined portion of the MEMS element.

In accordance with an embodiment of the invention there is provided a rotatable MEMS element which is coupled to a rotational actuator for controlling the rotation of the rotatable MEMS element and a linear actuator for translating the rotatable MEMS element away from a facet of the optical waveguide thereby allowing rotational position setting of the rotatable MEMS actuator prior to re-engaging the rotatable MEMS element against the facet of the optical waveguide.

In accordance with an embodiment of the invention there is provided a rotatable MEMS element comprising at least one first feature upon a surface of the rotatable MEMS element comprising a planar waveguide and a plurality of second features mating to the first feature disposed upon a facet of a device such that the at least one first feature can be mated to a predetermined second feature of the plurality of second features once the rotating MEMS element has been rotated to a predetermined position.

In accordance with an embodiment of the invention there is provided a device comprising:
an optical waveguide coupled to an optical network for receiving optical signals; and
an optical detector coupled to the optical network; wherein the optical signals coupled to the optical detector are wavelength filtered in dependence upon selection of a wavelength reflective filter from a plurality of wavelength reflective filters by rotation of the rotatable MEMS element wherein the optical signals propagate within a planar waveguide forming a first predetermined portion of the MEMS element and are reflected by a mirror forming a second predetermined portion of the MEMS element.

In accordance with an embodiment of the invention there is provided a device comprising:
a rotatable MEMS element forming a predetermined portion of a wavelength tunable reflector having an optical waveguide for coupling optical signals to and from the wavelength tunable reflector;
an optical coupler coupled to the optical waveguide and having a first port coupled to an optical network for receiving optical signals and coupling them to the optical waveguide and a second port for coupling optical signals from the optical waveguide; and
an optical detector coupled to the second port; wherein the optical signals coupled to the optical detector are wavelength filtered in dependence upon selection of a wavelength reflective filter from a plurality of wavelength reflective filters by rotation of the rotatable MEMS element wherein the optical signals propagate within a planar waveguide forming a first predetermined portion of the MEMS element and are reflected by a mirror forming a second predetermined portion of the MEMS element.

In accordance with an embodiment of the invention there is provided a device comprising:
a rotatable MEMS element forming a predetermined portion of a wavelength filter having an optical waveguide for coupling optical signals to and from the wavelength tunable filter;
an optical coupler coupled to the optical waveguide for receiving optical signals and coupling them to the optical waveguide;
an optical detector coupled to the output of the wavelength filter; wherein
the optical signals coupled to the optical detector are wavelength filtered in dependence upon selection of a wavelength filter from a plurality of wavelength filters by rotation of the rotatable MEMS element wherein the optical signals propagate within a planar waveguide forming a first predetermined portion of the MEMS element and are reflected by a mirror forming a second predetermined portion of the MEMS element.

In accordance with an embodiment of the invention there is provided a device comprising:
an optical waveguide structure comprising a first predetermined portion formed from a plurality of three-dimensional (3D) optical waveguides for routing an optical signal upon a substrate and a second predetermined portion comprising an input 3D optical waveguide for routing the optical signals from a first subset of the plurality of 3D optical waveguides to a second subset of the plurality of 3D optical waveguides; and
a rotational microoptoelectromechanical (MOEMS) element comprising a pivot, an actuator, and the input 3D optical waveguide; wherein
a predetermined rotation of the MEMS element under the motion of the actuator results in the alignment of the input 3D optical waveguide with a predetermined 3D optical waveguide of the first subset of the plurality of 3D optical waveguides.

In accordance with an embodiment of the invention there is provided a device comprising:
an optical waveguide structure comprising at least first and second three-dimensional (3D) optical waveguides for routing an optical signal upon a substrate and a second predetermined portion comprising a two-dimensional (2D) optical waveguide for routing optical signals with respect to the first and second 3D optical waveguides; and
a rotational microoptoelectromechanical (MOEMS) element comprising a pivot, an actuator, the 2D optical waveguide, and an optical grating; wherein
a predetermined rotation of the MEMS element under the motion of the actuator results in optical signals within a predetermined wavelength range coupled from the first 3D optical waveguide to the second 3D optical waveguide via the 2D optical waveguide and optical grating.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 3 depicts cross-sections of the MEMS mirror and optical waveguide interface according to embodiments of the invention exploiting silicon nitride and silicon-on-insulator waveguide technologies;

FIG. 16 depicts a wavelength selective MOTUS optical engine according to an embodiment of the invention with hybrid integration of discrete semiconductor optical gain block and external Mach-Zehnder modulator;

FIG. 18 depicts a wavelength selective MOTUS optical engine according to an embodiment of the invention with hybrid integration of a monolithically integrated semiconductor optical gain block and external Mach-Zehnder modulator die;

FIG. 19 depicts a wavelength selective MOTUS optical engine according to an embodiment of the invention with post-wavelength filter detectors;

FIG. 20 depicts a wavelength selective MOTUS optical engine according to an embodiment of the invention acting a wavelength selective receiver;

FIG. 21 depicts a wavelength selective receiver according to an embodiment of the invention exploiting a wavelength selective MOTUS optical engine with Bragg grating based transmissive Fabry-Perot filters and coupler combiners;

FIG. 22 depicts a wavelength selective receiver according to an embodiment of the invention exploiting a wavelength selective MOTUS optical engine with Bragg grating based transmissive Fabry-Perot filters and coupler combiners.

DETAILED DESCRIPTION

The present invention is directed to microoptoelectromechanical systems (MOEMS) and more particular to designs and enhancements for optical microelectromechanical systems (MEMS) waveguides and mirrors as well as optical components exploiting such optical MEMS elements.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

Within this specification the inventors refer to optical waveguides which are planar, confined vertically, but not confined laterally as two-dimensional (2D) optical waveguides (2D) and those optical waveguides which are further confined laterally and vertically as three-dimensional (3D) optical waveguides.

Wavelength Tunable Optical Source

Figure 1A:
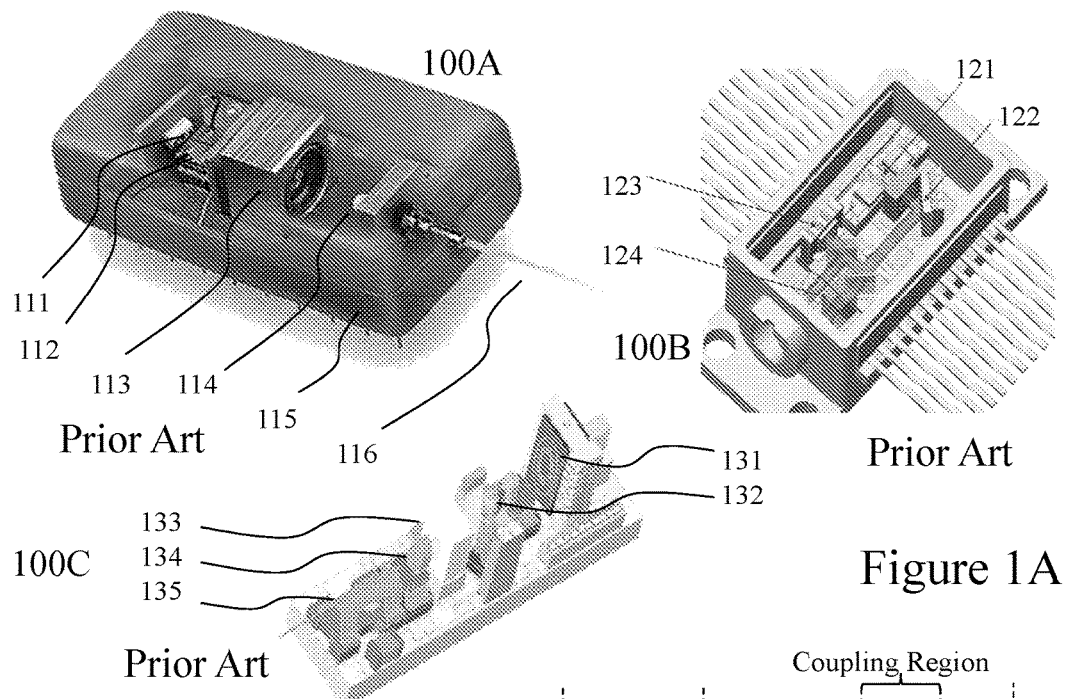
FIG. 1A depicts examples of prior art fixed wavelength and wavelength tunable sources.

As noted supra wavelength tunable optical sources and/or receivers have significant benefit in the provisioning of transmitters, receivers, and transceivers within todays optical communication networks and evolving requirements for optical networks with dynamic wavelength allocation, reduced installation complexity, single line card designs, and reconfigurability. Within the prior art several approaches have been employed to date and whilst these have demonstrated high performance transmitters they suffer limitations such as assembly complexity, achievable performance, and high cost. Two such prior art approaches are depicted in second and third images 100B and 100C respectively in comparison to a standard fixed wavelength laser source in first image 100A in FIG. 1A.

In first image 100A a fixed wavelength laser source is depicted in a dual-in line (DIL) package configuration and comprises monitor photodiode (not identified for clarity) and laser diode die 111 mounted upon a chip carrier 112 which comprises a thermistor (not identified for clarity) for monitoring the temperature as the laser diode die 111 has a fast wavelength versus temperature profile. The output of the laser diode die 111 is coupled via an optical lens-optical isolator assembly 113 such that is focused at a location 113 wherein the optical fiber within a ferrule assembly 114, for example, is positioned and assembled to couple the optical signal to the network via optical fiber pigtail 115. The laser diode die 111 may, for example, be a distributed feedback (DFB) laser, a distributed Bragg reflector (DBR) laser or a monolithic externally modulated DFB laser.

Accordingly, in second image 100B a wavelength settable transmitter assembly prior to optical fiber pigtailing and sealing is depicted. As shown the assembly comprises a laser array 121, MEMS switch array 122, monitor photodiode 123 and wavelength locker 124. The wavelength locker 124 provides a means of locking the laser array 121 to a predetermined grid, such as 100 GHz C-band grid of long-haul telecommunications around 1550 nm. Accordingly, the laser array 121 comprises an array of optical sources monolithically integrated into the same semiconductor die, e.g. 40 DFB lasers. The provisioning of the selected wavelength for the transmitter is determined by the provisioning of electrical drive current to the appropriate DFB laser within the laser array 121 and the switching of the appropriate MEMS switch element within the MEMS switch array 122. As such the approach is costly in that not only must a monolithic indium phosphide (InP) M-channel DFB laser array be implemented but also an array of M MEMS switches. Accordingly, in some instances the free-space optical interconnect from the laser array 121 to optical fiber (not depicted for clarity) is replaced by a wavelength division multiplexer, such as an array waveguide grating (AWG) on the same die as the laser array 121.

Third image 100C depicts an alternate wavelength tunable transmitter exploiting an external cavity laser (ECL) configuration wherein rather than the laser diode die having two high reflectivity facets to support the required cavity oscillation to provide gain within the semiconductor device the laser diode die has one or no high reflectivity facets and forms a resonant optical cavity with one or two external mirrors. In this instance a single external mirror 131 is employed in conjunction with a semiconductor optical amplifier (SOA) die 132 that has a high reflectivity facet towards the optical fiber pigtail 135 and a low reflectivity facet towards the external mirror 131. The resultant laser output is coupled from the SOA die 132 to the optical fiber pigtail 135 via isolator 133 and lens 134. In this instance the external mirror 132 is a tunable Fabry-Perot cavity filter 131 that provides for wavelength dependent reflectivity such that the output of the assembly is wavelength specific according to the settings of the tunable Fabry-Perot cavity filter 131 allowing the emission wavelength to be adjusted. However, the characteristics of the source are now defined by the quality of the Fabry-Perot cavity filter, which even when implemented using a MEMS construction does not achieve the sidelobe rejection of the DFB approaches.

Figure 1B:
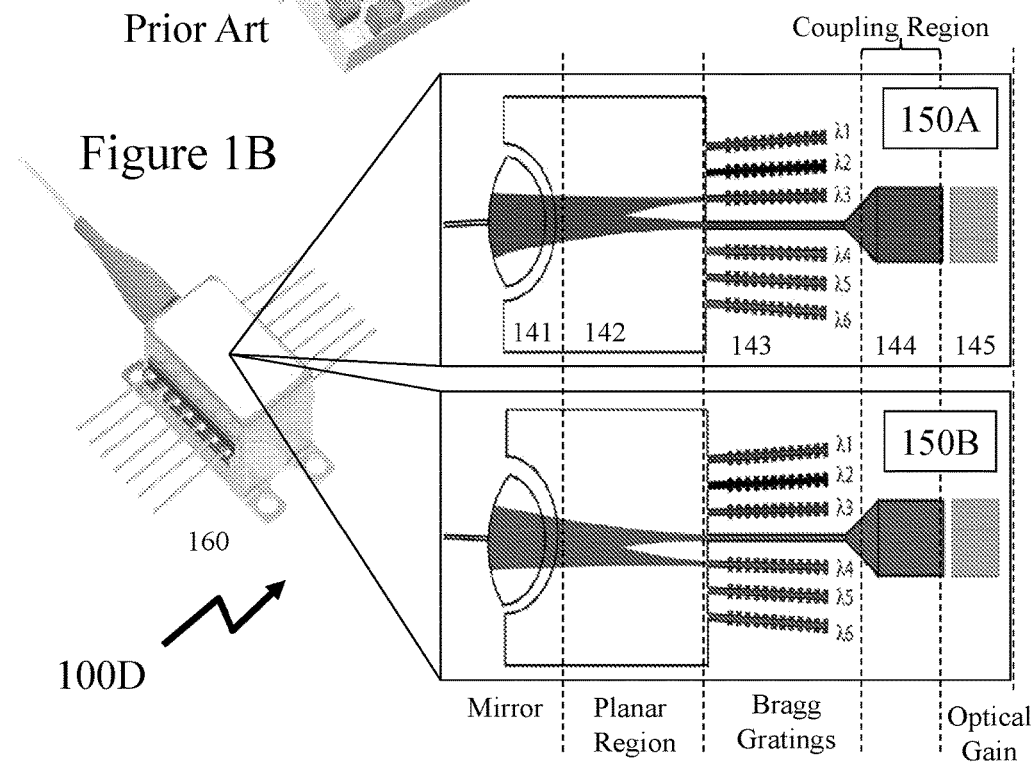
FIG. 1B depicts an example of a wavelength tunable source according to an embodiment of the invention.

Accordingly, it would beneficial to provide a tunable wavelength transmitter which can be fabricated at reduced cost commensurate with the pricing expectations of telecom system providers and telecom original equipment manufacturers (OEMs) for high volume generalized deployment within optical access networks, local area network, and data centers for example. Accordingly, the inventors have established a hybrid circuit implementation exploiting an ECL configuration utilizing an InGaAsP SOA, for 1310 nm or 1550 nm wavelength ranges, in conjunction with selective silicon MEMS addressed wavelength reflector(s). Alternatively other material systems such as GaAs may be employed for shorter wavelength below C-band including the S-band/E-band/O-band operation etc. for wavelength down from 1530 nm to 1260 nm or lower. As depicted in fourth image 100D in FIG. 1B the approach exploits a selective silicon MEMS addressed wavelength reflector(s) tuning element and comprises a coupling region 144 for coupling between the SOA 145, a tunable MEMS mirror 141, and an array of Bragg reflectors 143. The optical signals are coupled between the coupling region 144 and the array of Bragg reflectors 143 by a planar waveguide region 142 wherein the diverging optical signals from the Bragg reflector 143 are re-focussed by the tunable MEMS mirror 141. Accordingly, as depicted in first and second schematics 150A and 150B the wavelength operation of the ECL is therefore controlled by the routing selection of the mirror 141 to a selected Bragg grating within the array of Bragg reflectors 143. The SOA 145 may be a Quantum Well (QW), Quantum Dot (QD) or Quantum Dash (QDa) Reflective Optical Semiconductor Amplifier.

Figure 2:
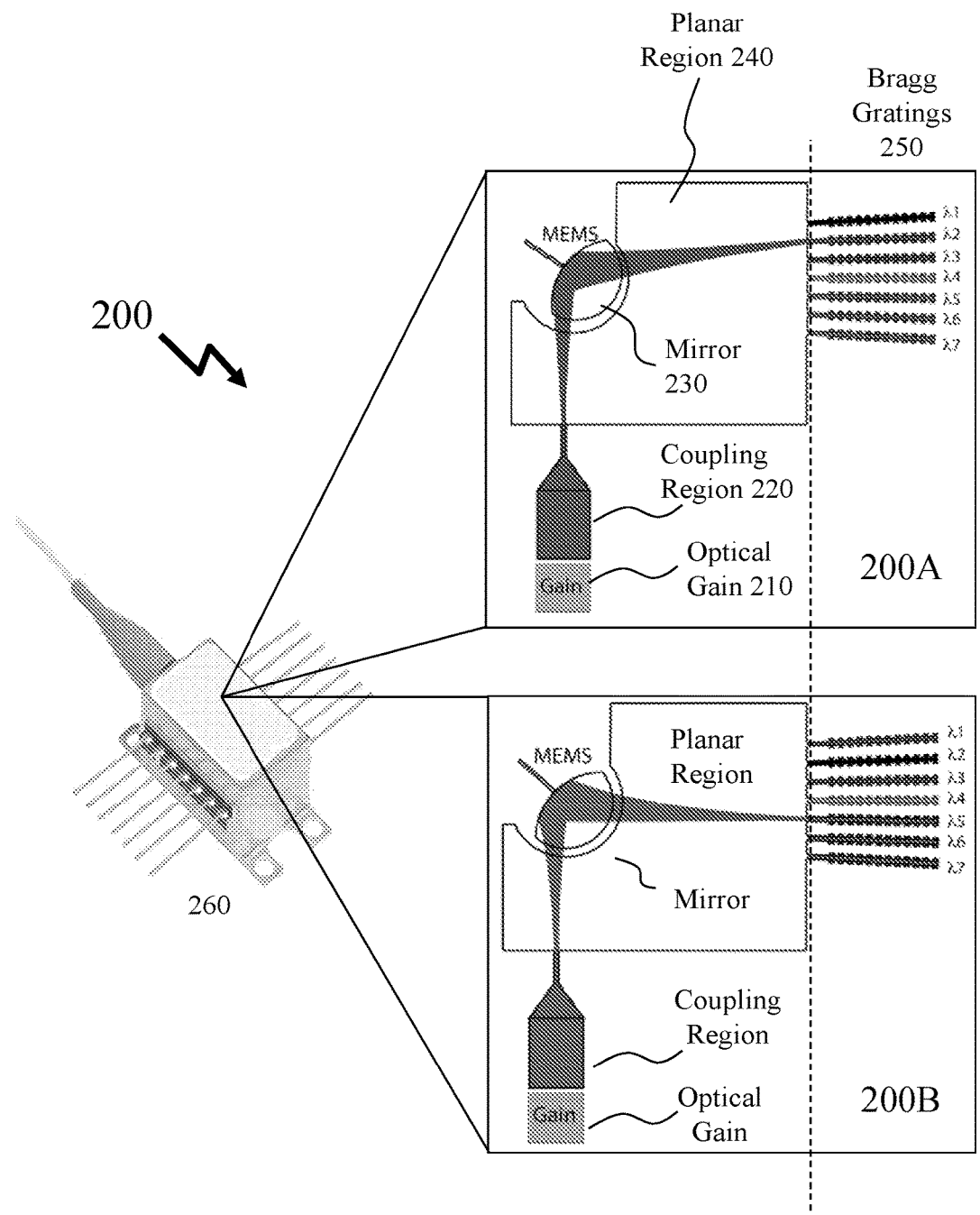
FIG. 2 depicts a wavelength tunable source according to an embodiment of the invention.

Referring to FIG. 2 an alternate configuration 200 for an ECL exploiting silicon photonics and MEMS is depicted in first and second schematics 200A and 200B respectively. Accordingly, an optical gain element 210 is coupled via a coupling region 220 to planar waveguide region 240. The diverging Gaussian shaped optical signal from the optical gain element 210 is coupled to a selected Bragg grating within an array of Bragg reflectors 250 via the planar waveguide region 240 and MEMS mirror 230 wherein the design of the MEMS mirror 230 is such that the optical signal is coupled re-focussed to the plane of the waveguides forming part of the Bragg gratings within the array of Bragg reflectors 250.

It would be evident that in addition to wavelength tunable transmitters the approach of a MEMS mirror in conjunction with an array of Bragg reflectors may also form part of wavelength tunable receivers, reconfigurable optical add-drop multiplexers (ROADMs), wavelength selective optical switches, and other wavelength selective structures, for example.

Optical Waveguide Technologies

According to embodiments of the invention exploiting MEMS mirrors, the substrate of choice is usually silicon due its low cost, breadth of doping options, and the availability of standard MEMS fabrication processes, prototyping facilities, and production operations, e.g. MUMPS (Multi-User MEMS Processes) from MEMSCAP, Sandia National Laboratories SUMMiT V processes, Teledyne DALSA's Multi-Project Wafer "Shuttle" runs and production facilities, and STMicroelectronics high volume MEMS manufacturing facilities for example.

Silicon Nitride Core Waveguide Platform

Amongst the optical waveguide technology options that are compatible with deposition over SOI MEMS wafer for optical waveguides in the telecommunication windows at 1300 nm & 1550 nm are silicon nitride ($Si_3N_4$) cored waveguides with silicon dioxide ($SiO_2$) cladding. An example of such a waveguide geometry is depicted in first waveguide cross-section 300A in FIG. 3 which may be employed according to embodiments of the invention. Accordingly, the optical waveguide 3000 comprises a 5 μm lower silicon dioxide 330 cladding, a 70 nm silicon nitride ($Si_3N_4$) 340 core, and a 5 μm upper silicon dioxide 330 cladding. The waveguide cross-section 300B is depicted where the optical waveguide couples via the air gap to the MEMS mirror (MEMSM) 3100. As the optical waveguide is ≈10 μm thick the MEMSM 3100 at the air gap interface may be the same material structure atop an actuated silicon (Si) MEMS structure formed within the Si substrate. The optical waveguide 3100 has below it before the Si substrate a layer of polyimide which is also etched back to form part of the pivot for the MEMSM 3100. Deposited onto the vertical end wall of the optical waveguide 3000 and wall of the MEMSM 3100 are anti-reflection coatings.

Silicon on Insulator Waveguide Platform

Amongst the optical waveguide technology options that are compatible with deposition over SOI MEMS wafer for optical waveguides in the telecommunication windows at 1300 nm & 1550 nm are silicon-on-insulator waveguides with air cladding at the top and silicon dioxide ($SiO_2$) cladding at the bottom. Referring to second waveguide cross-section 300B in FIG. 3 there is depicted a waveguide geometry 3200 according to an embodiment of the invention comprising a lower silicon dioxide ($SiO_2$) 330 buried oxide cladding, a silicon 320 core, and relying on the refractive index of air or another material to confine total internal reflection. The waveguide cross-section 300B is similarly depicted where the optical waveguide 3200 couples via the air gap to the MEMSM 3300.

However, due to the high refractive index of Si the thickness limit of the silicon (Si) for a single-mode waveguide is 220 nm which is too thin for MEMS devices. However, at a thickness of 1 μm 5 modes exist within a silicon planar waveguide having modal indices of n=3.405, 3.203, 2.845, 2.281, 1.487 and accordingly a rib waveguide geometry may be employed in order to select the fundamental mode. Accordingly, the MEMSM 3300 for 1 μm Si may be formed from the same material. Due to the refractive indices the anti-reflection (AR) layer on the air gap of the optical waveguide 3200 and MEMSM 3300 can be formed from parylene with a refractive index of 1.66. The thickness of the AR coating would be approximately 233 nm.

Silicon Nitride Core Waveguide MEMS Circuit Designs

Figure 4:
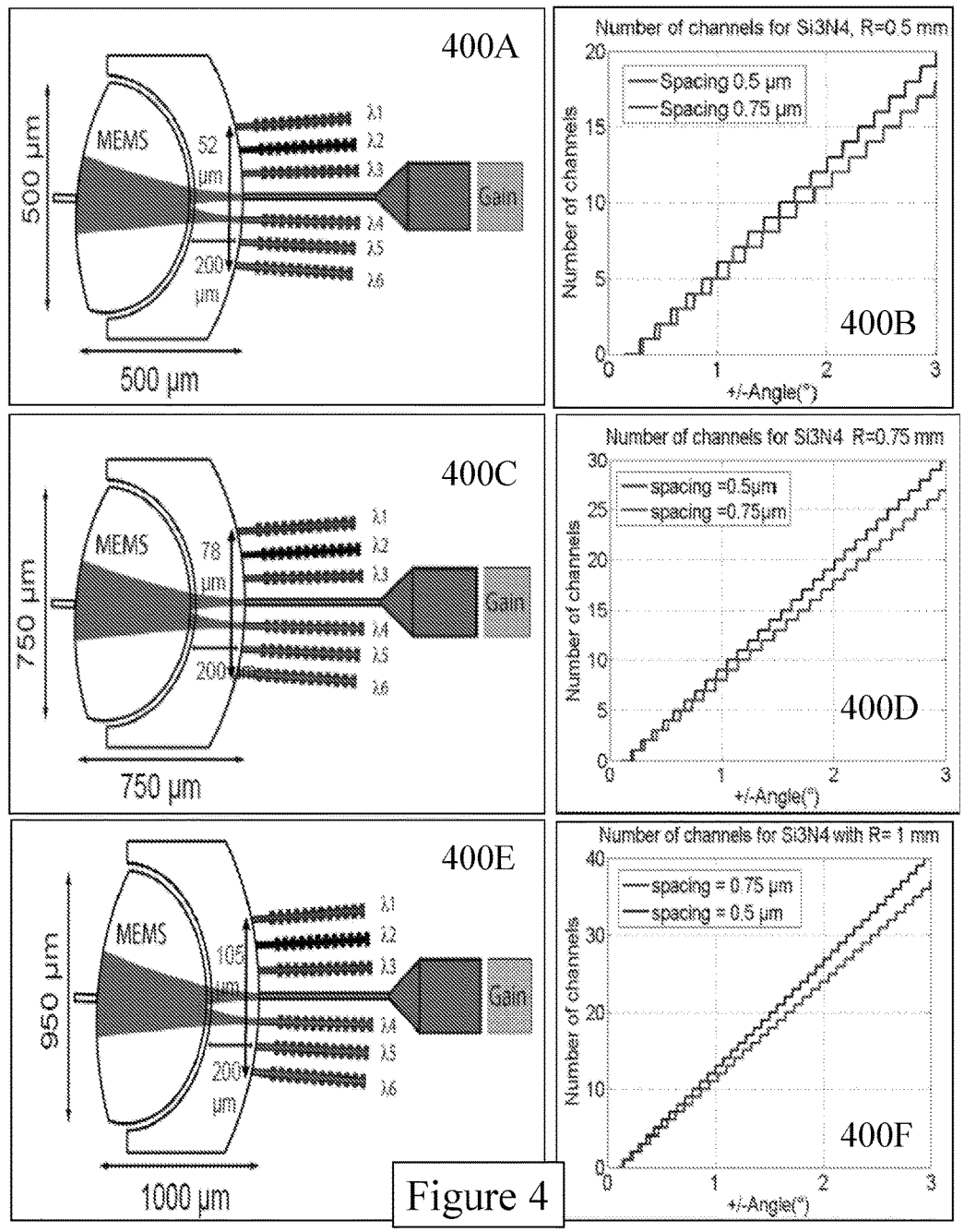
FIG. 4 depicts exemplary designs and channel counts for MEMS mirror actuated waveguide interrogators exploiting silicon nitride waveguides according to embodiments of the invention.

Referring to FIG. 4 there are depicted first to third circuits 400A, 400C, and 400E respectively for MEMSM with design radii of 0.5 mm, 0.75 mm, and 1.00 mm. In each instance the optical waveguides coupling to the Bragg reflectors are spaced 200 μm away from the edge of the MEMSM and in each instance the distance from the pivot mounting of the MEMSM to the optical waveguides is equal to the radius of the MEMSM. Accordingly, the resulting widths of the MEMSM in the three designs depicted in first to third circuits 400A, 400C, and 400E respectively are 500 μm, 750 μm, and 950 μm. Accordingly considering a maximum angular rotation of the MEMSM as ±3° then the lateral spacing between the upper and lower end waveguides are 52 μm, 78 μm, and 105 μm respectively. Referring to first to third graphs 400B, 400D, and 400F respectively there are therefore depicted the number of accessible channels for optical waveguides having spacings of 0.5 μm and 0.75 μm respectively. Accordingly, for 0.75 μm spaced waveguides the maximum number of channels accessible are 36 (±18 channels from centre), 54 (±27 channels from centre), and 74 (±37 channels from centre) at design radii of 0.5 mm, 0.75 mm, and 1.00 mm. The corresponding maximum numbers of channels accessible for these design radii with 0.5 μm channel spacing are 40, 60, and 80 respectively.

Accordingly it would be evident that with a $Si_3N_4$ waveguide technology that the number of channels can be significant and equal the number of channels (40) in a standard C-band 100 GHz telecommunications network channel plan or at 80 channels either the equivalent ITU 50 GHz C-band channel plan or both of the ITU C and L bands within a single device.

Silicon-on-Insulator Waveguide MEMS Circuit Designs

Figure 5:
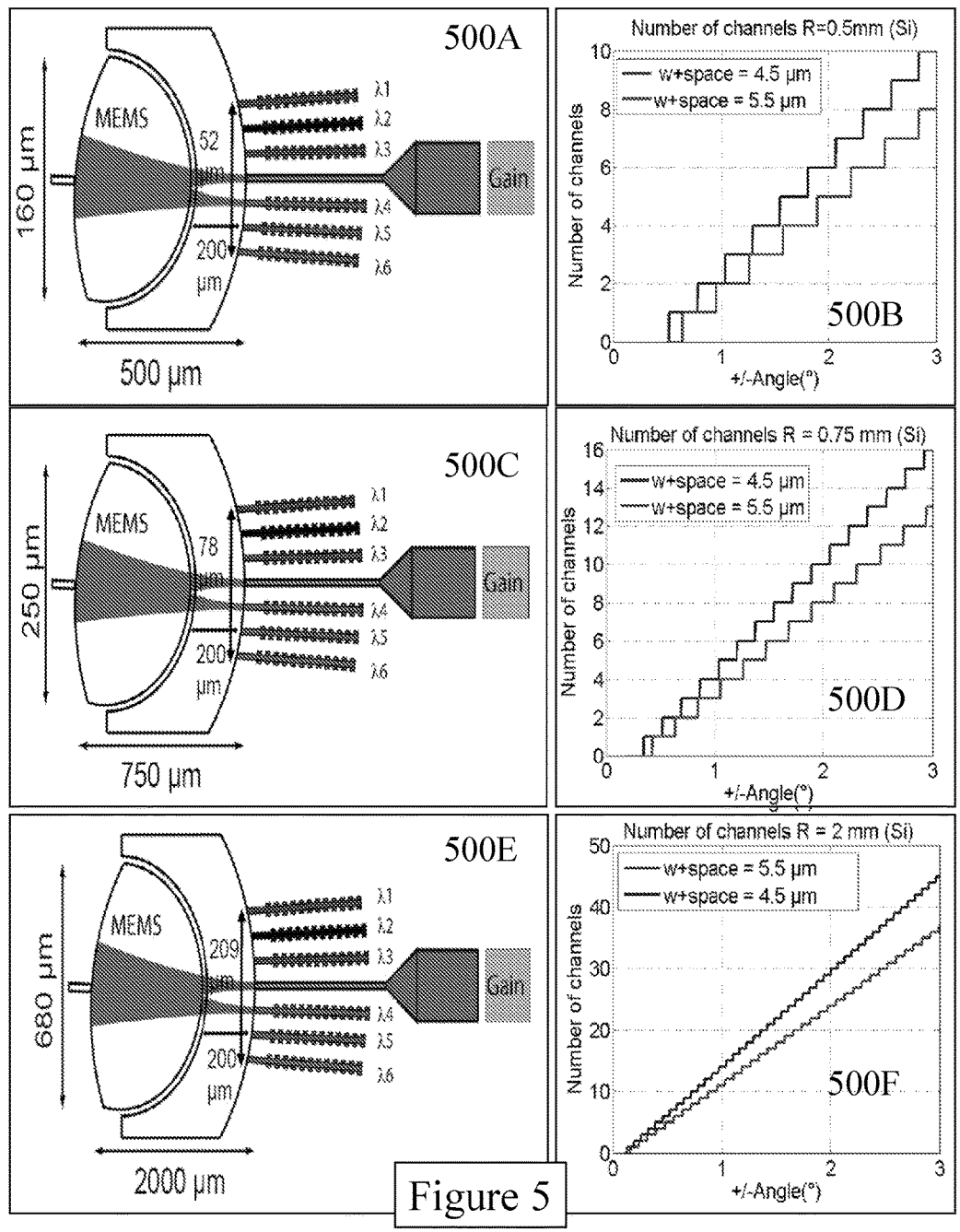
FIG. 5 depicts exemplary designs and channel counts for MEMS mirror actuated waveguide interrogators exploiting silicon-on-insulator waveguides according to embodiments of the invention.

Referring to FIG. 5 there are depicted first to third circuits 500A, 500C, and 500E respectively for MEMSM with design radii of 0.5 mm, 0.75 mm, and 2.00 mm respectively. In each instance the optical waveguides coupling to the Bragg reflectors are spaced 200 μm away from the edge of the MEMSM and in each instance the distance from the pivot mounting of the MEMSM to the optical waveguides is equal to the radius of the MEMSM. Accordingly, the resulting widths of the MEMSM in the three designs depicted in first to third circuits 500A, 500C, and 500E respectively are 160 μm, 250 μm, and 680 μm. Accordingly considering a maximum angular rotation of the MEMSM as ±3° then the lateral spacing between the upper and lower end waveguides are 52 μm, 78 μm, and 209 μm respectively. Referring to first to third graphs 1500B, 1500D, and 1500F respectively there are therefore depicted the number of accessible channels for optical waveguides having spacings of 4.50 μm and 5.5 μm respectively. Accordingly, for 5.5 μm spaced waveguides the maximum number of channels accessible are 16 (±8 channels from centre), 26 (±13 channels from centre), and 74 (±37 channels from centre) at design radii of 0.5 mm, 0.75 mm, and 2.00 mm respectively. The corresponding maximum numbers of channels accessible for these design radii with 4.50 μm channel spacing are 20, 32, and 90 respectively.

Accordingly it would be evident that with a Si waveguide technology that the number of channels is typically lower than the number with $Si_3N_4$ waveguide technology but that it can still be significant and equal or exceed the number of channels (40) in a standard C-band 100 GHz telecommunications network channel plan or the equivalent ITU 50 GHz C-band channel plan or both of the ITU C and L bands within a single device. However, generally Si tunable wavelength devices will be lower channel count as their footprint is smaller than the equivalent $Si_3N_4$ circuits both in terms of the MEMSM and the footprint for the Bragg gratings enabling lower costs silicon photonics applications such as called for by the ITU-T G.989.2 standard where the number of DWDM channels that need to be selected is smaller than in pure WDM-PON.

MEMS & Optical Waveguide Manufacturing Process Flow—Silicon Nitride Core

The manufacturing sequence described below in respect of FIGS. 6 to 9 exploits standard Si manufacturing processes and Si MEMS technology in order to fabricate the MEMSM with arrayed Bragg reflectors and optical waveguides. Whilst the process flow is for $Si_3N_4$ the process flow for Si and other optical waveguide-MEMS platforms upon silicon would be very similar. For the Si process flow there is clearly no requirement to deposit and pattern the $SiO_2$—$Si_3N_4$—$SiO_2$ waveguides whilst in others such as silicon oxynitride, polymer, spin-on-glass, and doped $SiO_2$ deposition and patterning steps would be present.

Figure 6:
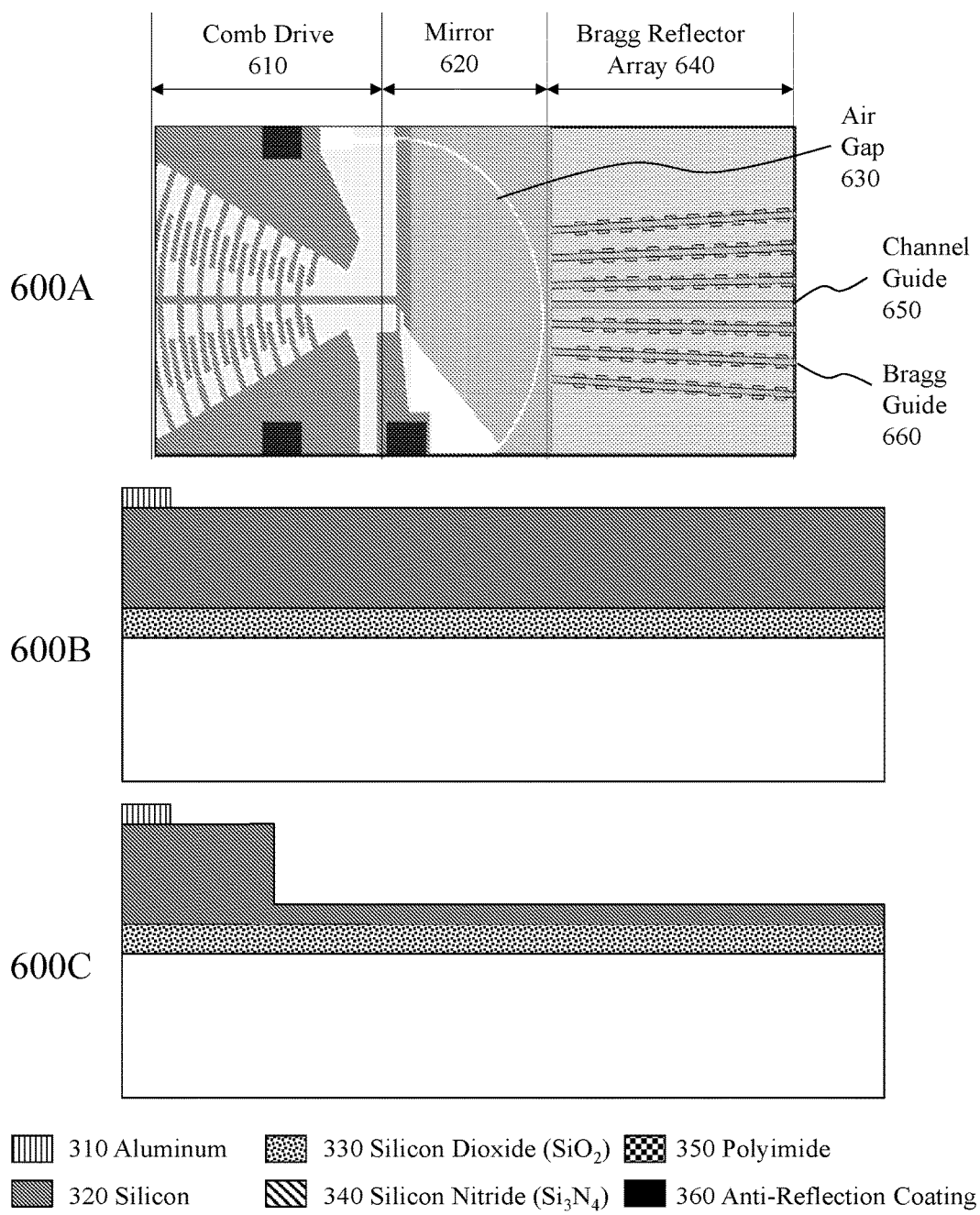
FIGS. 6 through 9 depict an exemplary process flow for the manufacture of a MEMS mirror actuated Bragg waveguide interrogator exploiting silicon nitride waveguides according to an embodiment of the invention.

Referring to first schematic 600A in FIG. 6 there is depicted a plan view of a MOems-TUunable Silicon (MO-TUS) optical engine comprising an SC-MEMSM mirror 620 attached to a comb drive 610 and then a Bragg reflector array 640 comprising a central channel waveguide 650 which couples light into and out of the wavelength dependent reflector circuit and arrays of Bragg waveguides 660 disposed either side of the channel waveguide. In other embodiments of the wavelength dependent reflector circuit the Bragg waveguides 660 may be disposed symmetrically either side of the channel waveguide, asymmetrically with different channel counts either side of the channel waveguide, and asymmetrically to one side of the channel waveguide. Such design considerations may be based upon factors including, but not limited to, the angular rotation range of the SC-MEMSM mirror 620, the number of wavelength channels, the design of the MEMS comb drive 610, and the design of the electrostatic driver circuit for the MEMS comb drive 610.

Accordingly, referring to second schematic 600B in FIG. 6 a cross-section of the MOTUS circuit is depicted in cross-sectional view comprising silicon dioxide (SiO2) 330, silicon (Si) 320, and aluminum (Al) 310 which has already been patterned and etched. Considering a typical silicon-on-insulator (SOI) substrate then the Si 320 is 5 µm thick. The Al 310 may be sputtered with a thickness of 300 nm which after patterning through a lithography process may be removed using a standard Al wet etch process. Subsequently in third schematic 600C the MOTUS circuit is depicted after the exposed Si 320 has been pattered lithographically and deep etched to remove 4.5 µm using a deep reactive ion etching (DRIE) process using sulphur hexafluoride ($SF_6$) and octafluorocyclobutane ($C_4F_8$) after which the resist is stripped.

Figure 7:
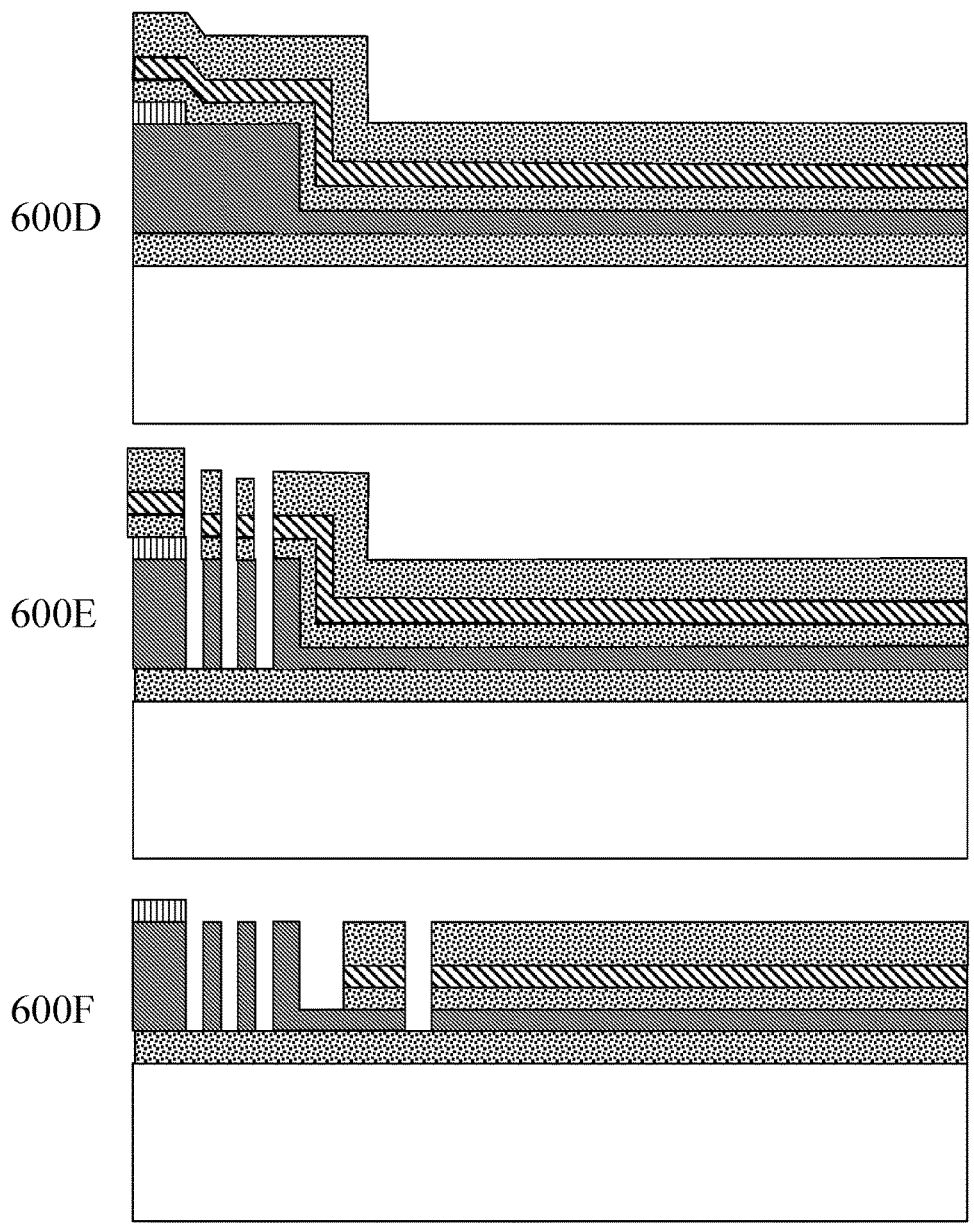
Figure 8:
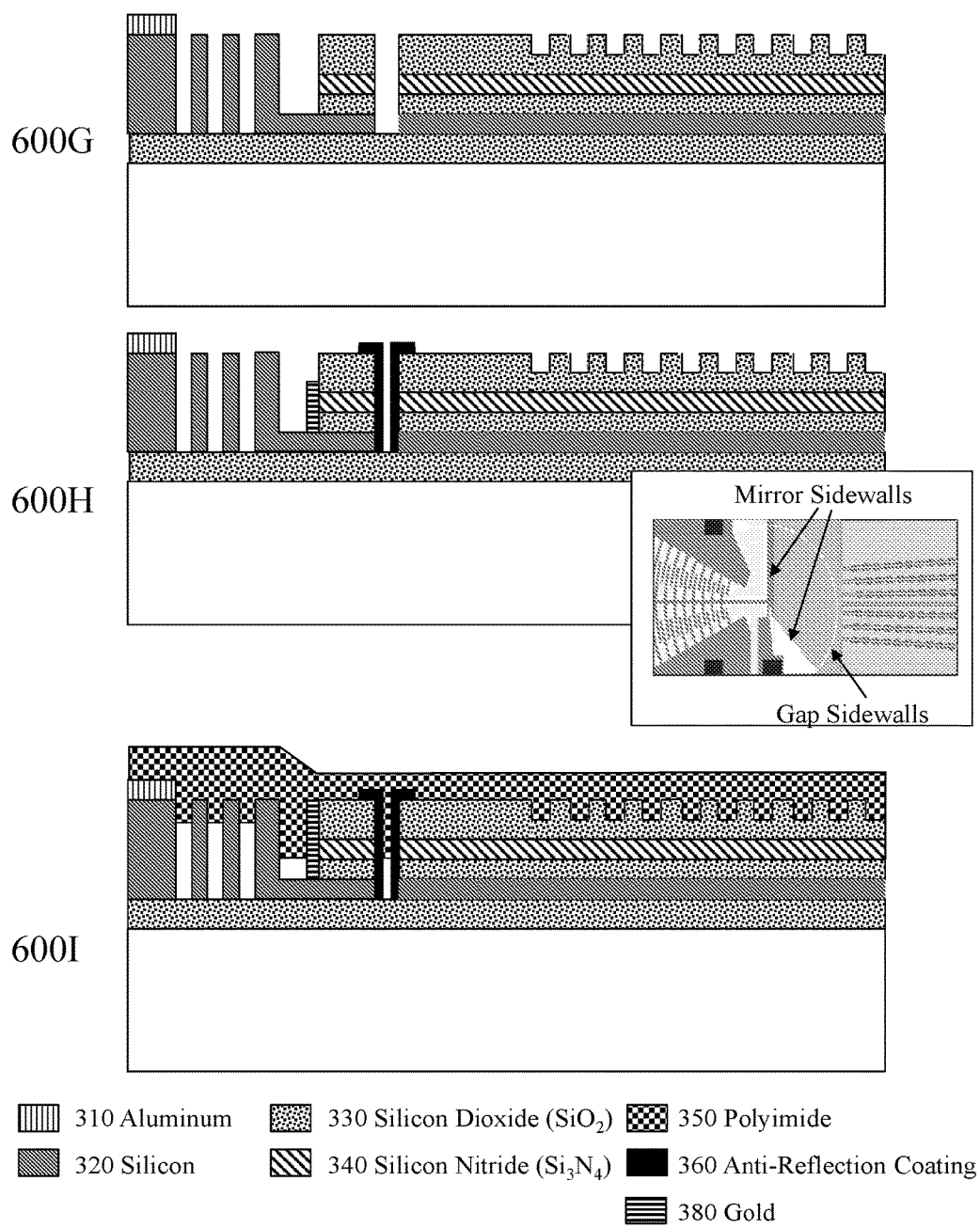

Now referring to fourth schematic 600D in FIG. 7 the optical waveguide layer stack is deposited comprising 4 µm $SiO_2$ 330, 100 nm silicon nitride ($Si_3N_4$) 340, and 4 µm $SiO_2$ 330 according to another design embodiment of the $Si_3N_4$ waveguide platform rather than the 5 µm·$SO_2$-70 nm·$Si_3N_4$-5 µm·$SO_2$ described supra in respect of FIG. 3. The deposition being for example through chemical vapor deposition (CVD).

Next in fifth schematic 600E in FIG. 7 the MOTUS circuit is depicted after the optical waveguides and comb drive openings have been defined, using a DRIE etching process with a $SF_6$—$C_4F_8$-Argon (Ar) process having an aspect ratio of 1:1.6 to etch the 4 µm $SiO_2$ 330-100 nm silicon nitride ($Si_3N_4$) 340-4 µm $SO_2$ 330 stack, and the comb drive has been defined using a DRIE etching process with a $SF_6$—$C_4F_8$ process having an aspect ratio of 1:1 to etch the 5 µm Si 320. Optionally, other manufacturing sequences such as dual step processes employing DRIE for MEMS patterning and RIE processing for optical waveguide structures may be employed to provide reduced sidewall roughness and Teflon free processing.

Subsequently in sixth schematic 600F in FIG. 7 the MOTUS circuit cross-section is depicted after the air gap has been formed and the excess regions of the optical waveguides atop the comb drive etc. have been removed. These steps are achieved using a DRIE etching process with a $SF_6$—$C_4F_8$-Argon (Ar) process having an aspect ratio of 1:8 to etch the $SiO_2$ 330-$Si_3N_4$ 340-$SiO_2$ 330 stack, and the comb drive has been defined using a DRIE etching process with a $SF_6$—$C_4F_8$ having an aspect ratio of 2:1 to etch the 0.5 µm Si 320. Whereas the preceding steps were carried out with a critical dimension of approximately 5 µm the photolithography for the air gap processes have a critical dimension of approximately 1 µm. Next in seventh schematic 600G in FIG. 8 the Bragg grating sections of the optical Bragg reflectors are photolithographically defined and etched using a DRIE etching process with a $SF_6$—$C_4F_8$-Argon (Ar) process having an aspect ratio of 1:8 to partially etch the upper cladding comprising $SiO_2$ 330.

Alternatively, the process sequence resulting in fifth and sixth schematics 600E and 600F may be reversed such that the waveguide is first removed above the MEMS actuator part and then it would be patterned using a more optimized mask. Now referring to eighth schematic 600H in FIG. 8 a reflective layer, gold (Au) 380, is deposited and patterned onto the SC-MEMSM mirror sidewalls and anti-reflection (AR) coatings are deposited and patterned onto the SC-MEMSM mirror sidewall and optical waveguide sidewall either side of the air gap. The AR coating may be magnesium fluoride, $MgF_2$, for example with a thickness of 280 nm. Subsequently as depicted in ninth schematic 600I the front surface of the MOTUS circuit is protected for wafer backside processing steps that follow. Accordingly, polyimide 350 with a thickness of 5 µm may be spin-coated onto the wafer and cured, e.g. 300° C. for 2 hours. Optionally at this point the substrate may also be thinned using Chemical Mechanical Polishing (CMP) for example. Polyimide 350 may, optionally, be photoresist rather than polyimide.

Figure 9:
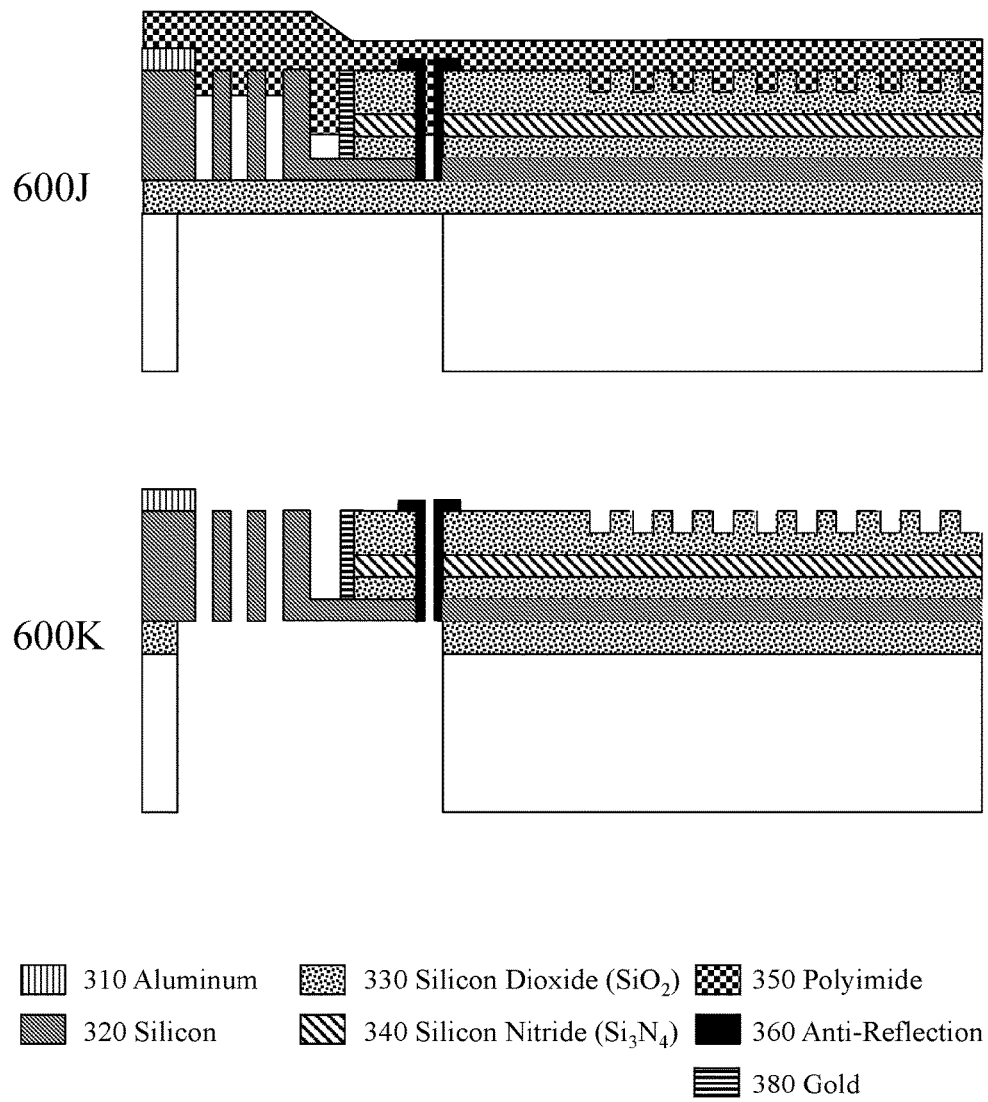

In ninth schematic 600I in FIG. 9 the substrate, e.g. silicon, is lithographically processed to define the trench below the MEMS comb drive and SC-MEMSM mirror sections of the MOTUS circuit. This may, for example, be via a DRIE using $SF_6$—$C_4F_8$ stopping at the $SiO_2$ 320 layer. Then in tenth schematic 600J the $SiO_2$ 320 is etched from the backside using an ME process, for example, followed by resist stripping, wafer dicing, polyimide removal by plasma ashing, for example, and mechanical polishing of the MOTUS circuit die sidewall for connection between the channel waveguide and optical fiber.

Semi-Circular MEMS Mirror (SC-MEMSM) & Actuator Design

As discussed supra in respect of the MOTUS an optical signal is coupled from an initial optical waveguide to a MEMS mirror wherein it is reflected and coupled to a subsequent optical waveguide having a Bragg grating formed within. The reflected optical signals from the Bragg grating then traverse the reverse path. Accordingly, the MEMS mirror rotates to couple to different optical waveguides with different Bragg gratings and thence provide the required wavelength tunability. In order to minimize losses the optical signal is maintained in waveguides all the way through this process and accordingly the region between the ends of the waveguides and the mirror is a waveguide as well. This results in a semi-circular MEMS mirror (SC-MEMSM) so that the mirror can rotate, the optical signal is maintained within the waveguide, and the waveguide can rotate relative to the channel waveguide section of the MOTUS optical engine.

Figure 10A:
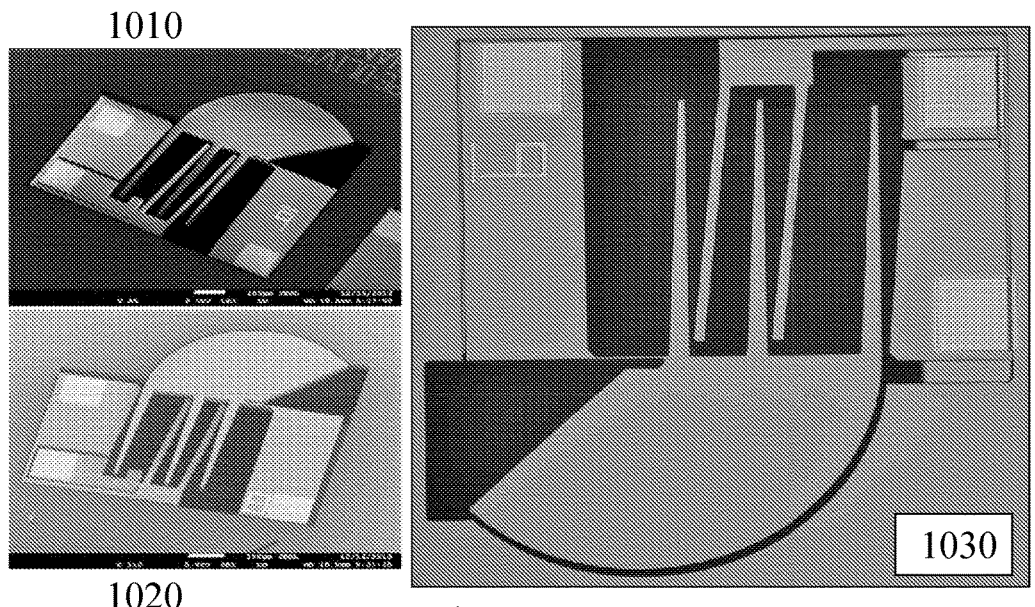
FIGS. 10A and 10B depict exemplary fabricated MEMS mirrors with their electrostatic comb actuators according to an embodiment of the invention.

Accordingly, referring to FIG. 10A and first to third images 1010 to 1030 respectively there is depicted a semi-circular MEMS mirror (SC-MEMSM) design according to an embodiment of the invention exploiting electrostatic actuation with slanted fingers. Accordingly, as designed the SC-MEMSM will rotate when the 8 µm SC-MEMSM fingers are electrostatically attracted to the drive contacts. The SC-MEMSM finger adjacent the solid $V_{DD}$ electrode is angled at 4.5° whilst the other SC-MEMSM fingers adjacent $V_{DD}$ electrode fingers are angled at 6°. The disc of the SC-MEMSM subtends an arc of 135° and is attached via a 3 µm pivot element to the $V_{SS}$ electrode. Towards the end of the solid $V_{DD}$ electrode by the SC-MEMSM finger a stopper electrode is provided which is selectively biased to $V_{SS}$.

Figure 10B:
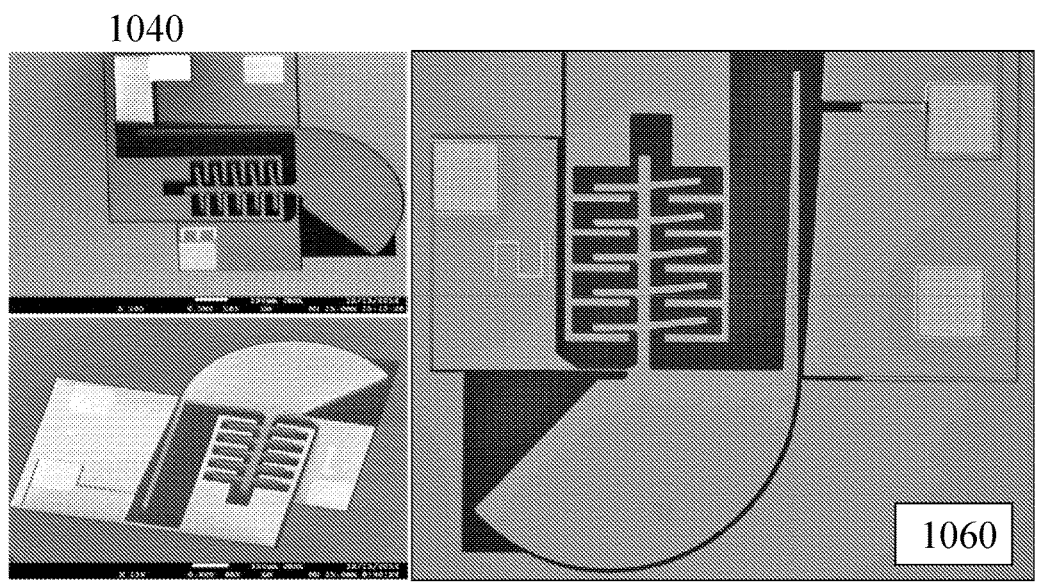

Referring to fourth to sixth images 1040 to 1060 respectively in FIG. 10B there is depicted a semi-circular MEMS mirror (SC-MEMSM) design according to an embodiment of the invention exploiting electrostatic actuation with a comb drive and slanted fingers. Accordingly as designed the SC-MEMSM will rotate when the 11 μm SC-MEMSM fingers within the comb drive are electrostatically attracted to the drive contacts. The SC-MEMSM also comprises a SC-MEMSM finger adjacent the solid $V_{DD}$ electrode is angled at 4.5° whilst the SC-MEMSM comb drive fingers that rotate are angled at 6° where these are attracted towards the other comb drive fingers (right-hand side) and are not angled where these will be repelled away from the other comb drive fingers (left-hand side). The disc of the SC-MEMSM subtends an arc of 135° and is attached via a 3 μm pivot element to the $V_{SS}$ electrode. Towards the end of the solid $V_{DD}$ electrode by the 8 μm SC-MEMSM finger a stopper electrode is provided which is selectively biased to $V_{SS}$.

SC-MEMSM Mirror Design

Within the embodiments of the invention, process flows, and variants discussed and described supra in respect of FIGS. 1 to 10 it would be evident to one skilled in the art that whilst SC-MEMSM designs feature throughout that there are two different classes of SC-MEMSM within these figures that each share a semicircular disk rotating with a small air gap adjacent to a curved planar waveguide structure. However, the rear reflecting mirror surface of the SC-MEMSM differs in the two classes.

The first class is where the rear reflecting mirror surface is a planar mirror such that the optical signals impinging upon it at an angle β° to the normal of the planar surface are reflect and propagate away at an angle β° on the other side of the normal. Such a rear reflecting planar mirror is depicted in the SEM images in FIG. 10. Accordingly a collimated optical signal will reflect and maintain collimation whilst a diverging beam with reflect and still diverge.

The second is a curved back mirror where the reflecting mirror surface has a predetermined profile such that the normal to the mirror surface varies across the surface and hence whilst locally each optical signal will reflect according to the normal at its point of incidence the overall effect of the mirror on beam is determined by the profile of the mirror and the point at which the optical beam impinges. Considering the rear reflecting planar mirror as depicted in FIGS. 1 (100D), 2, 4-6, and 9 the surface is concave with respect to the impinging optical beam which is aligned to the axis of the curved mirror surface. As a result the concave rear reflecting mirror results in focusing of a diverging beam such that where the radius of curvature of the rear surface equals its distance from the source of a diverging optical beam it will refocus the beam back at the same distance but rotationally offset according to the rotation angle of the SC-MEMSM. Hence, for example the MOTUS depicted in third schematic 500E in FIG. 5 has a radius of curvature for the rear reflecting surface of the SC-MEMSM of 2000 μm with the pivot point 2000 μm from the central channel waveguide. The front surface of the SC-MEMSM is the curved surface of radius 1,800 μm. In contrast is first schematic 500A in FIG. 5 the radius of curvature of the rear reflecting surface is 500 μm whilst the front surface of the SC-MEMSM is the curved surface of radius 300 μm.

However, it would be evident that other profiles for the rear reflecting mirror surface may be employed according to the functionality of the overall optical circuit and the characteristics of the mirror required. For example, the rear surface may have a radius of curvature lower than the distance from the waveguides such that the optical signals are focused within the body of the SC-MEMSM and are diverging at the plane of the optical waveguides.

Figure 11A:
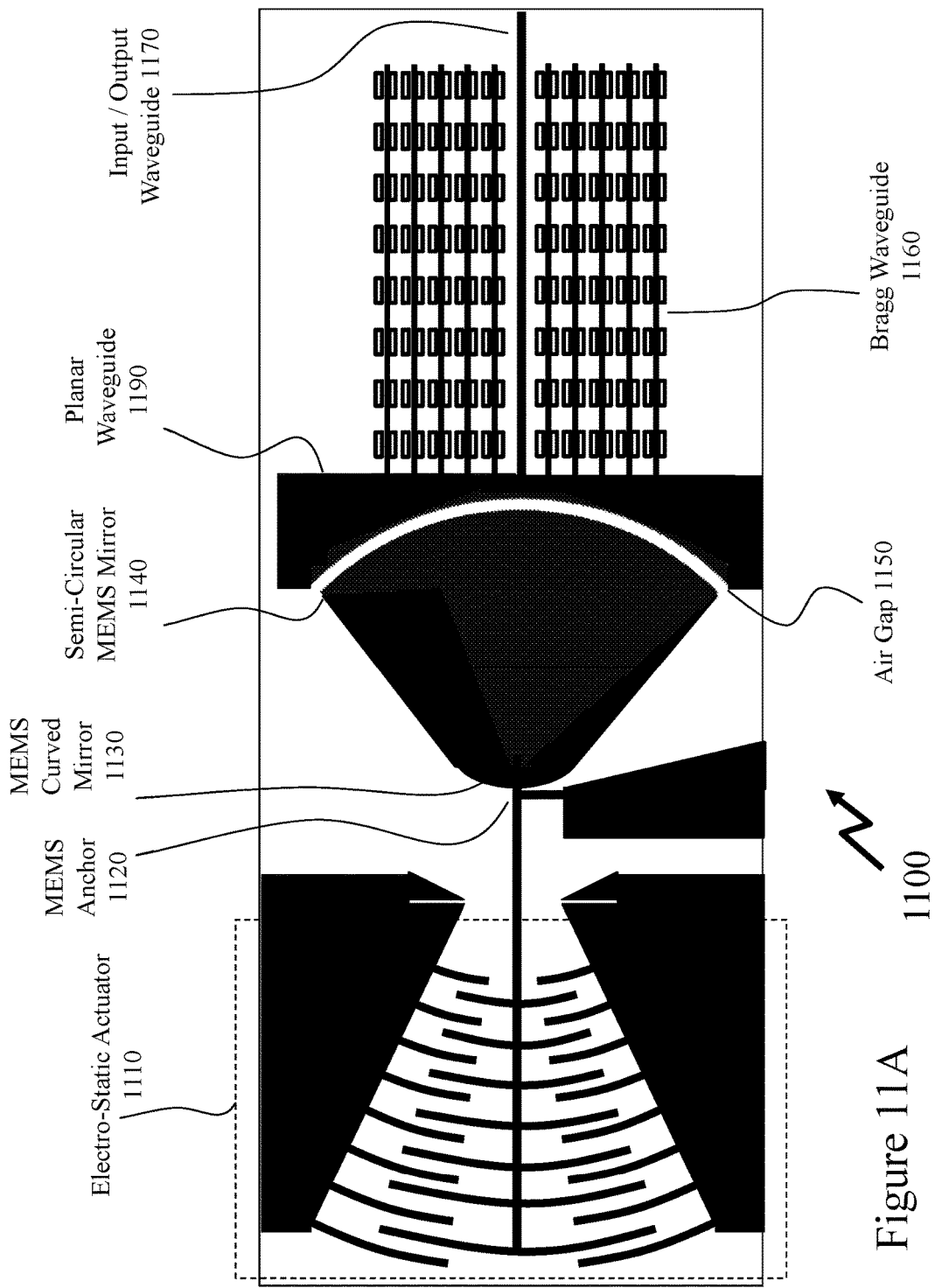
FIG. 11A depicts an exemplary wavelength selective MOems-TUunable Silicon (MOTUS) optical engine according to an embodiment of the invention.

Referring to FIG. 11A there is depicted a schematic of a first MOTUS optical engine 1100 which comprises an input/output waveguide 1170 that couples to the semicircular MEMS mirror (SC-MEMSM) 1140 via a planar waveguide 1190 and air gap 1150. According, the optical signal from the input/output waveguide 1170 is reflected and coupled to one of the distributed Bragg reflectors (DBRs) within its associated Bragg waveguide 1160. The optical signals reflected from the selected DBR are then guided back via its associated Bragg waveguide 1160, through the planar waveguide 1190 and SC-MEMSM 1140 before being reflected again back towards the input/output waveguide 1170. Accordingly, a wideband optical signal is filtered by the appropriately selected DBR within its Bragg waveguide 1160 or a cavity formed comprising the selected DBR within the Bragg waveguide 1160 and an external optical gain medium with a broadband reflector may become a wavelength settable laser source. The SC-MEMSM 1140 is anchored at MEMS anchor 1120 and driven through rotary electrostatic actuator 1110 such that the SC-MEMSM rotates to the required angle to couple optical signals from the input/output waveguide 1170 to the desired Bragg waveguide 1160. Optionally the planar waveguide 1190 may be similarly curved and of finite width.

Figure 11B:
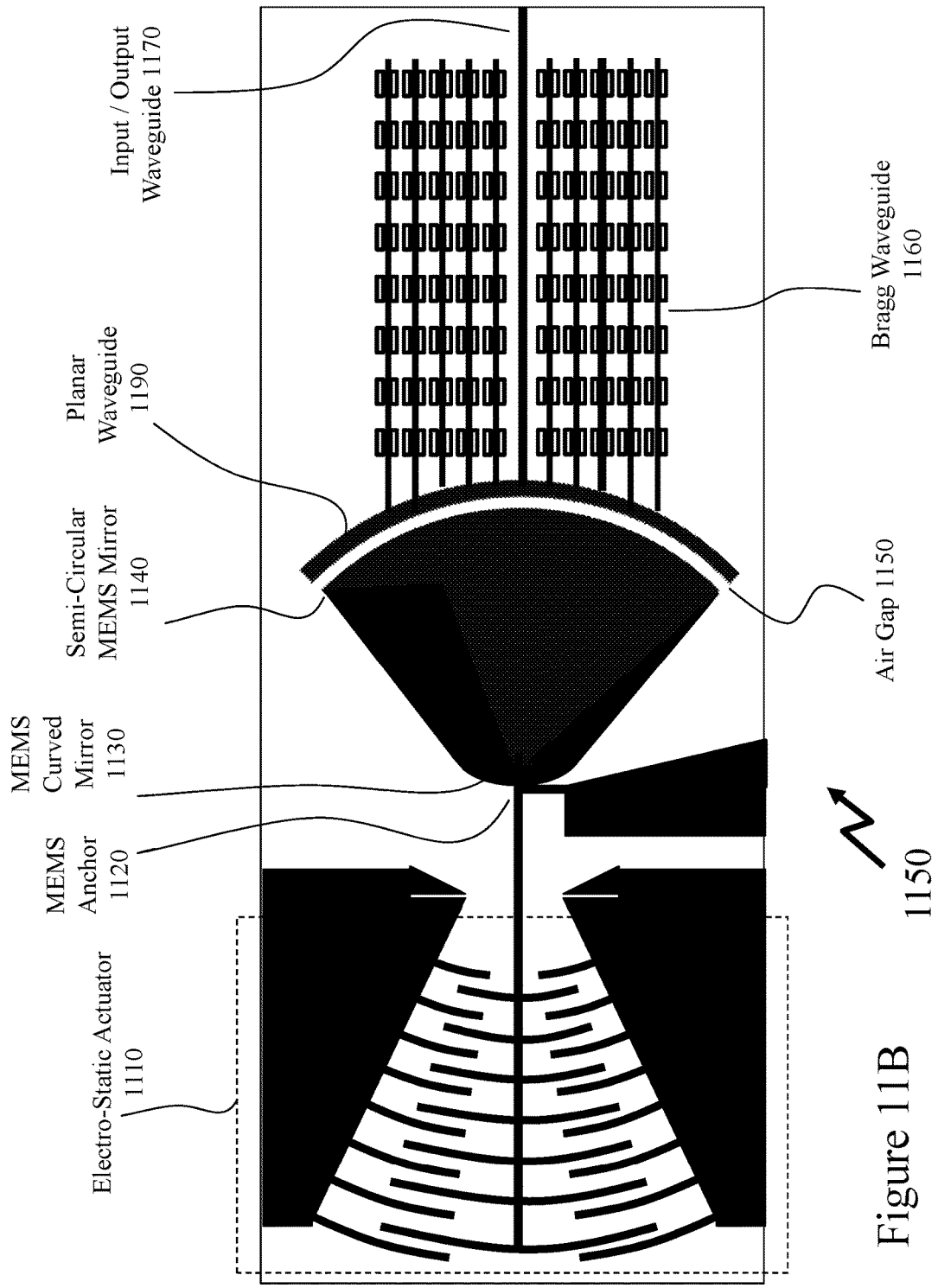
FIG. 11B depicts an exemplary wavelength selective MOTUS optical engine according to an embodiment of the invention.

Beneficially, the small planar region with a larger optical mode makes the insertion loss of the MOTUS optical engine 1100 less sensitive to edge roughness. Referring to FIG. 11B there is depicted a variant 1150 of the first MOTUS optical engine 1100 wherein the planar waveguide 1190 is absent and the Bragg waveguides 1160 and input/output waveguide 1170 terminate within this close to the air gap 1150. Optionally in other designs no planar waveguide 1190 is provided and the Bragg waveguides 1160 may terminate at the air gap 1150 or a predetermined distance from the air gap 1150. Whilst not evident in these schematics the Bragg waveguides 1160 may be angled at their junction with the planar waveguide 1190 or air gap 1150 to align the waveguide axis with the incident optical beam. Optionally, the number of gratings either side of the input/output waveguide 1170 may be equal, unequal, of one grating passband characteristic, of multiple passband characteristics (e.g. a combination of 50 GHz+100 GHz, 100 GHz+200 GHz, or 100 GHz+CWDM ITU passband profiles).

Figure 12A:
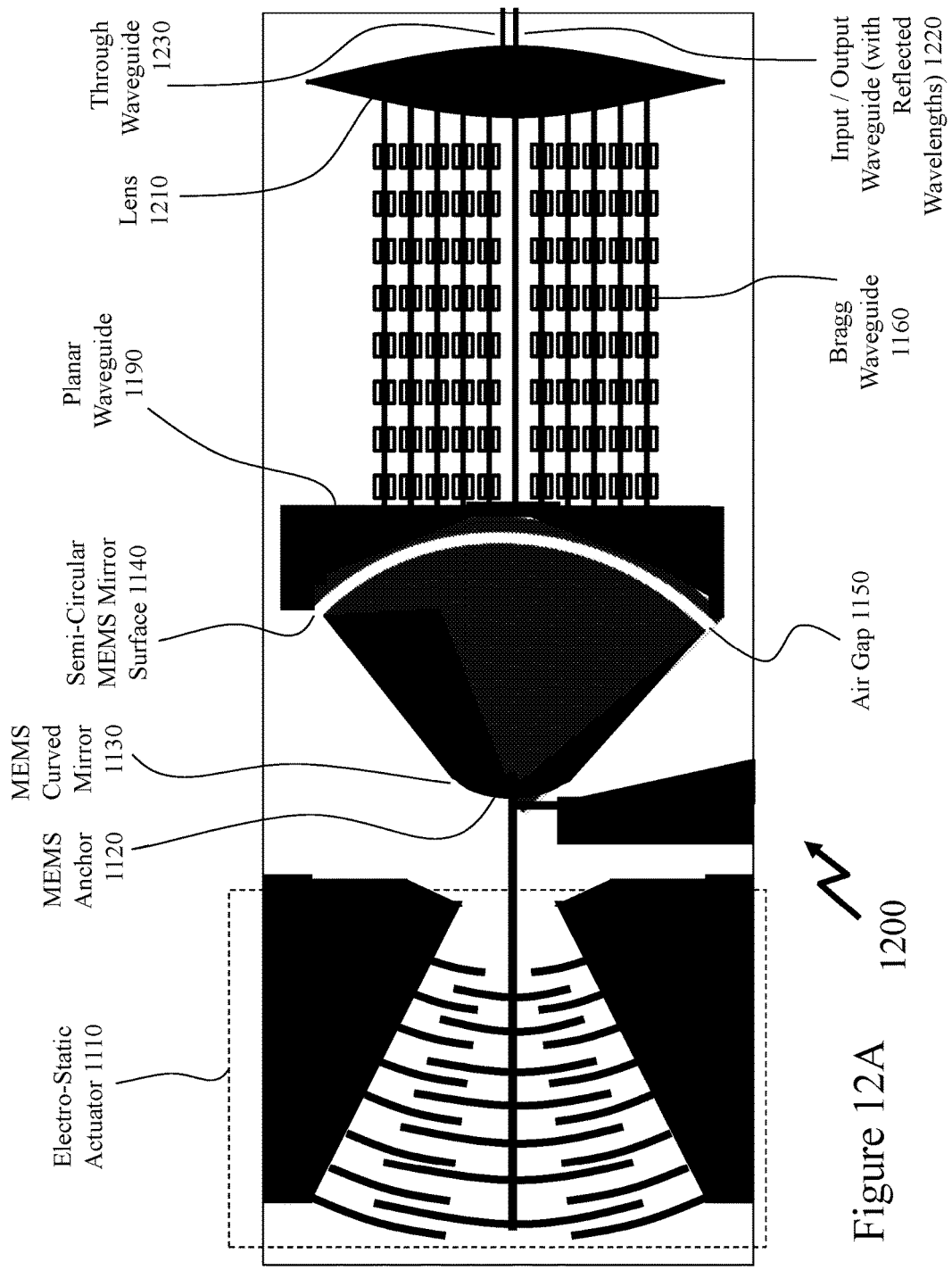
FIG. 12A depicts an exemplary wavelength selective MOTUS optical engine according to an embodiment of the invention.

Referring to FIG. 12A there is depicted a schematic of a second MOTUS optical engine 1200 which comprises an input/output waveguide 1220 that couples to the semicircular MEMS mirror (SC-MEMSM) 1140 via a lens 1210, a planar waveguide 1190 and air gap 1150. According, the optical signal from the input/output waveguide 1220 is reflected and coupled to one of the distributed Bragg reflectors (DBRs) within its associated Bragg waveguide 1160. The optical signals reflected from the selected DBR are then guided back via its associated Bragg waveguide 1160, through the planar waveguide 1190 and SC-MEMSM 1140 before being reflected again back towards the input/output waveguide 1220. Accordingly, a wideband optical signal is filtered by the appropriately selected DBR within its Bragg waveguide 1160 or a cavity formed comprising the selected DBR within the Bragg waveguide 1160 and an external optical gain medium with a broadband reflector may become a wavelength settable laser source. The SC-MEMSM 1140 is anchored at MEMS anchor 1120 and driven through rotary electrostatic actuator 1110 such that the SC-MEMSM rotates to the required angle to couple optical signals from the input/output waveguide 1220 to the desired Bragg waveguide 1160. Optionally the planar waveguide 1190 may be similarly curved and of finite width. Beneficially, the small planar region with a larger optical mode makes the insertion loss of the MOTUS optical engine 1100 less sensitive to edge roughness.

In contrast to the first MOTUS optical engine 1100 the second MOTUS optical engine 1200 optical signals coupled from the input/output waveguide 1220 to the Bragg grating within a Bragg waveguide 1160 that are not reflected propagate further within the Bragg waveguide 1160 until they couple to lens 1210 and are focussed onto through waveguide 1230. Accordingly, if, for example 40 channels of 100 GHz spaced C-band (e.g. ITU channels 21-60) are coupled to the second MOTUS optical engine 1200 and a Bragg waveguide is designed to reflect a sub-band comprising channels 21-24 then the remaining channels 25-60 will be coupled through the Bragg grating unaffected into the lens 1210 and thence to the through waveguide 1230.

Figure 12B:
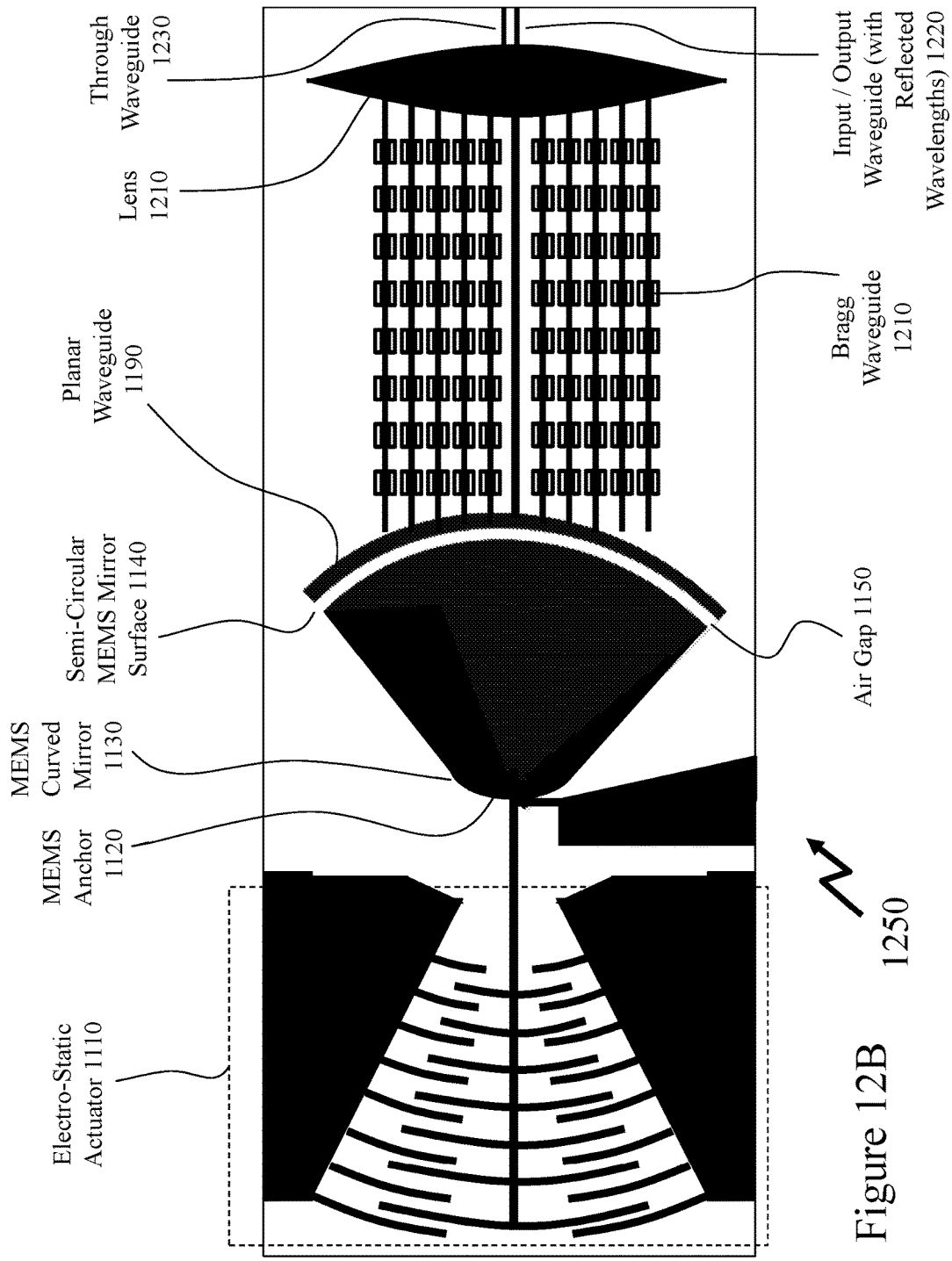
FIG. 12B depicts an exemplary wavelength selective MOTUS optical engine according to an embodiment of the invention.

Referring to FIG. 12B there is depicted a variant 1250 of the second MOTUS optical engine 1200 wherein the planar waveguide 1190 is absent and the Bragg waveguides 1160 and input/output waveguide 1170 terminate within this close to the air gap 1150. Optionally in other designs no planar waveguide 1190 is provided and the Bragg waveguides 1160 may terminate at the air gap 1150 or a predetermined distance from the air gap 1150. Whilst not evident in these schematics the Bragg waveguides 1160 may be angled at their junction with the planar waveguide 1190 or air gap 1150 to align the waveguide axis with the incident optical beam. Optionally, the number of gratings either side of the input/output waveguide 1170 may be equal, unequal, of one grating passband characteristic, of multiple passband characteristics (e.g. a combination of 50 GHz+100 GHz, 100 GHz+200 GHz, or 100 GHz+CWDM ITU passband profiles).

Figure 13:
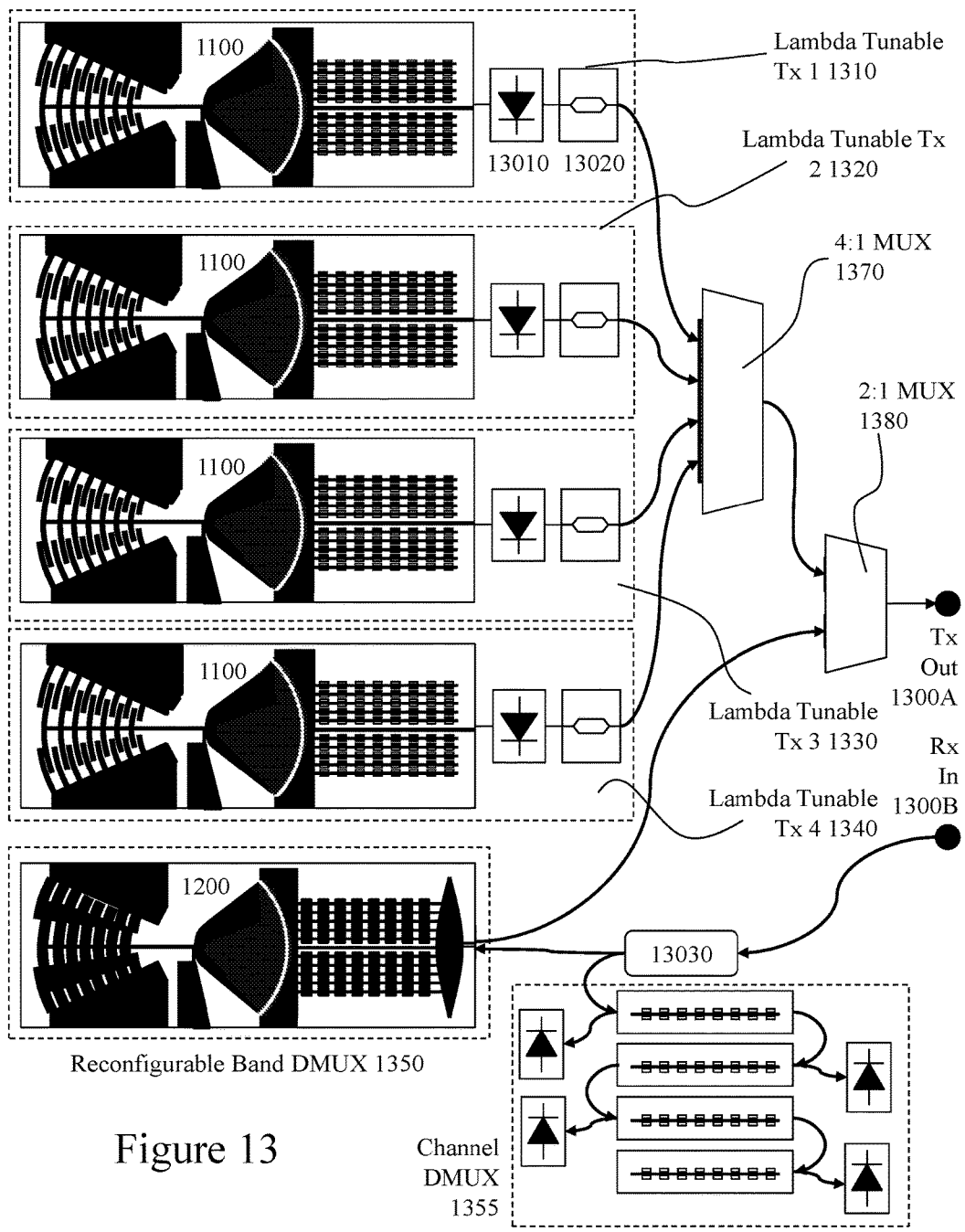
FIG. 13 depicts a Reconfigurable Optical Add-Drop Module (ROADM) exploiting MOTUS optical engines to select a wavelength or a group of wavelengths according to an embodiment of the invention.

Now referring to FIG. 13 there is depicted a schematic of what the inventors refer to as a Reconfigurable Optical Add/Drop Signal and Electronically Regenerated (ROADSTER), a tunable add-drop module. Accordingly, the schematic depicts a 4-channel ROADSTER exploiting first and second MOTUS optical engines 1100 and 1150 respectively. As such the ROADSTER provides for the extraction of 4 wavelengths, in this embodiment, of a predefined sub-band and reinsertion of the same wavelengths with newly generated signals on the optical medium. When the full optical band signals is received at the ROADSTER (Rx) at Rx In port 1300B the signals are coupled initially to a MOTUS based Reconfigurable Band DMUX 1350 via a circulator 13030. The Reconfigurable Band DMUX 1350 tunes to a selectable sub-band filter and accomplishes two distinct operations. First, the selected sub-band is dropped and secondly, the remaining channels are coupled to 2:1 MUX 1380 and therein recoupled to the network via Tx Out port 1300A. The selected sub-band is then coupled to a Channel DMUX 1355 wherein the discrete wavelengths in the sub-band are separated and coupled to 4 photodetectors (PDs) devices thus extracting the modulated optical signals into an electrical quadruple communication port programming interface (CPPI-4) at the host level within controller 1390. The non-selected sub-bands are optically amplified with Optical Amplifier 1385 before re-launch into the optical network. Accordingly, Reconfigurable Band DMUX 1350 exploits a second MOTUS optical engine such as described in respect of FIGS. 12A and 12B and represented here by second MOTUS optical engine 1200.

Channel DMUX 1355 may be formed from grating assisted directional couplers in order to provide the required separation of the reflected optical signals from the transmitted optical signals. Alternatively, rather than 4 filters the channel DMUX 1355 may employ 3 serially connected filters and simply couple the output of the third filter to the last photodetector. Alternatively, channel DMUX 1355 may comprise 3 sets of 10 Bragg gratings configured in a 1-skip-3 configuration and daisy chained through 4 optical circulators and connected to the 4 photodiodes.

Also depicted are four MOTUS based Lambda Tunable transmitters Tx1 1310 to Lambda Tunable transmitter Tx4 1340 respectively which are used to generate the new optical signals within the dropped sub-band for re-insertion into the network. The electrical CPPI-4 sub-band signal from a host is modulated to the right wavelengths on each MOTUS based Lambda Tunable transmitters Tx1 1310 to Lambda Tunable transmitter Tx4 1340 respectively. Each of the Lambda Tunable transmitters Tx1 1310 to Lambda Tunable transmitter Tx4 1340 respectively has 10 programmable wavelengths of operation such that the 10 sub-bands are supported by the appropriate selection of the distributed Bragg reflector (DBR), e.g. Bragg grating, within the MOTUS optical engine. Accordingly, the Actuator Driver Circuit 1395 aligns the silicon MEMS mirrors within the four transmitting MOTUS optical engines to the desired sub-band. Accordingly, the tunable source comprising either a wideband laser in combination with the MOTUS optical engine or an optical gain block within a resonant cavity with the MOTUS optical engine provides the appropriate wavelength from the selected sub-band which is then coupled to an external modulator within each of the Lambda Tunable transmitters Tx1 1310 to Lambda Tunable transmitter Tx4 1340 respectively. The optical signals are then coupled to 4:1 MUX 1370 such that at this stage the four newly generated signals are combined together and then in 2:1 MUX 1380 are coupled to the remaining passed-through sub-bands.

Accordingly, Lambda Tunable transmitters Tx1 1310 to Lambda Tunable transmitter Tx4 1340 respectively which exploit the first MOTUS optical engine 1100 in conjunction with an optical gain element 13010 and external modulator 13020. Any optical amplification within the ROADSTER 600 has been omitted for clarity. As depicted the Channel DMUX 655 is an array of Bragg grating devices, such as grating assisted reflective directional couplers or grating assisted transmissive directional couplers for example in order to remove the requirement for isolators to separate reflected optical signals from the forward propagating signals. The Bragg grating devices may be cyclic, low free spectral range, geometries such that one Channel DMUX 655 operates on all bands.

MOTUS Semiconductor Integration

As discussed supra in respect of embodiments of the invention the MOTUS optical engine has been described as forming part of a tunable optical source in conjunction within an optical gain medium. If a semiconductor optical gain block is provided having one facet with low reflectivity and another facet with high reflectivity then if the facet with low reflectivity is coupled via the MOTUS optical engine to a wavelength selective reflector then the resulting wavelength dependent optical cavity will oscillate and lase at the wavelength defined by the wavelength selective reflector. With a MOTUS optical engine the resulting laser will be programmable in wavelength according to each of the Bragg reflectors selected through the SC-MEMSM.

Figure 14:
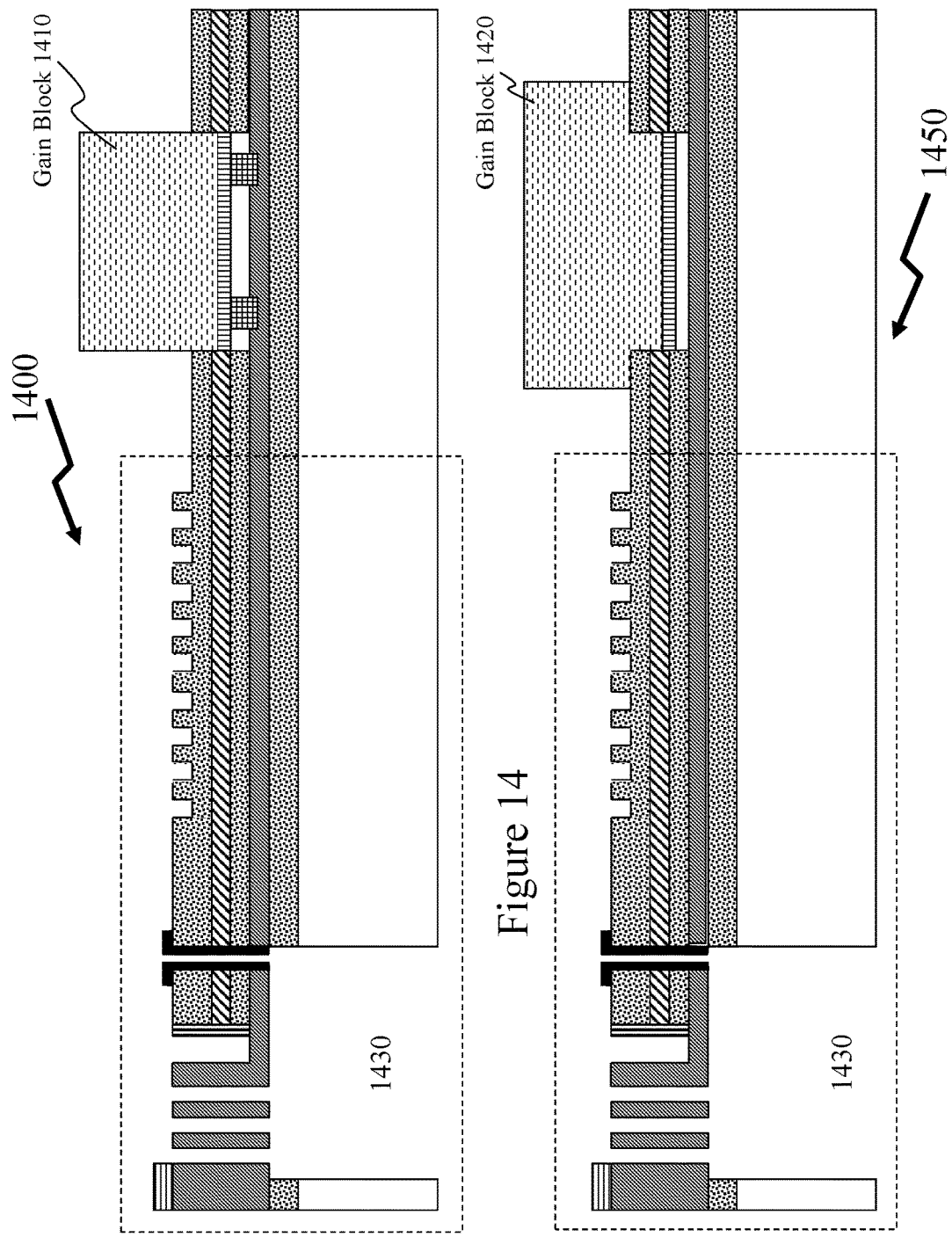
FIG. 14 depicts cross-sections through wavelength selective MOTUS optical engines according to an embodiment of the invention with hybrid flip-chip assembly of a semiconductor optical gain block with silicon nitride core waveguides.

As the MOTUS optical engine is based upon MEMS devices exploiting silicon on insulator substrates within the embodiments of the invention described supra then it would be evident that the semiconductor optical gain block may be integrated onto the MOTUS optical engine. Referring to FIG. 14 there are depicted first and second schematics for the integration of a semiconductor optical gain block with the MOTUS optical engine 1430 exploiting a $SiO_2$—$Si_3N_4$—$SiO_2$ waveguide upon a silicon-on-insulator (SOI) substrate.

In first schematic 1400 a gain block 1410, which typically comprises an InGaAsP stack upon an InP substrate which is etched to form a rib or rib-loaded waveguide, has deposited upon it alignment features which key to features etched into the silicon underlying the $SiO_2$—$Si_3N_4$—$SiO_2$ waveguide. Accordingly, the position of the gain block 1410 is laterally defined by the features etched into the silicon which may be provided as part of the same processing sequence as the formation of the MOTUS optical engine. The vertical position of the gain block 1410 relative to the $SiO_2$—$Si_3N_4$—$SiO_2$ waveguide is determined by the features etched into the silicon, the alignment features deposited onto the gain block 1410, and the tolerances of the $SiO_2$—$Si_3N_4$—$SiO_2$ waveguide layers.

In second schematic 1450 a gain block 1420 is aligned to an optical waveguide formed within a $SiO_2$—$Si_3N_4$—$SiO_2$ waveguide. In this instance, the vertical alignment of the optical waveguide within the gain block 1420 to the $SiO_2$—$Si_3N_4$—$SiO_2$ waveguide is determined by the depth of the InP substrate etching of the gain block 1420 and the $SiO_2$—$Si_3N_4$—$SiO_2$ waveguide tolerances whilst lateral alignment is achieved through physical features formed within the $SiO_2$—$Si_3N_4$—$SiO_2$ structure and the gain block 1420 but now these are solely for lateral alignment.

Figure 15A:
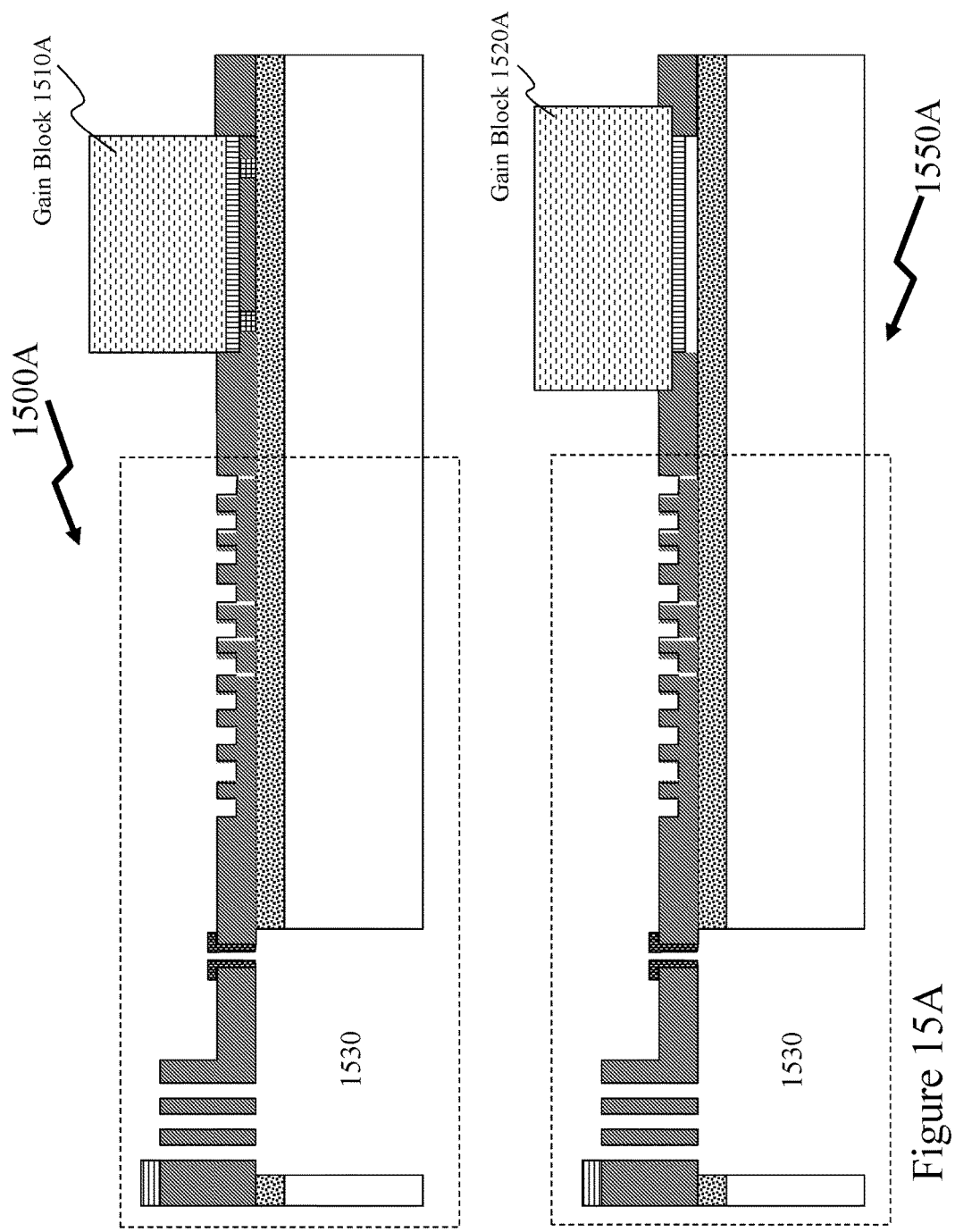
FIG. 15A depicts cross-sections through wavelength selective MOTUS optical engines according to an embodiment of the invention with hybrid flip-chip assembly of a semiconductor optical gain block with silicon core waveguides.

Now referring to FIG. 15A there are depicted first and second schematics 1500A and 1550A for the integration of a semiconductor optical gain block with a MOTUS optical engine 1530 exploiting a Si waveguide upon a silicon-on-insulator (SOI) substrate with a SOI waveguide rather than a $SiO_2$—$Si_3N_4$—$SiO_2$ waveguide. In first schematic 1500A a gain block 1510, which typically comprises an InGaAsP stack upon an InP substrate which is etched to form a rib or rib-loaded waveguide, has deposited upon it alignment features which key to features etched into the silicon layer which also forms the optical waveguide. Accordingly, the position of the gain block 1510 is laterally defined by the features etched into the silicon which may be provided as part of the same processing sequence as the formation of the MOTUS optical engine. The vertical position of the gain block 1510 relative to the optical waveguide is determined by the features etched into the silicon, the alignment features deposited onto the gain block 1510, and the tolerance of the Si waveguide layers.

In second schematic 1550A a gain block 1520 is aligned to an optical waveguide formed within a Si waveguide. In this instance, the vertical alignment of the optical waveguide within the gain block 1420 to the Si waveguide is determined by the depth of the InP substrate etching of the gain block 1420 and the etch depth, Si waveguide tolerances whilst lateral alignment is achieved through physical features formed within the Si layer and the gain block 1420 but now these are solely for lateral alignment.

Figure 15B:
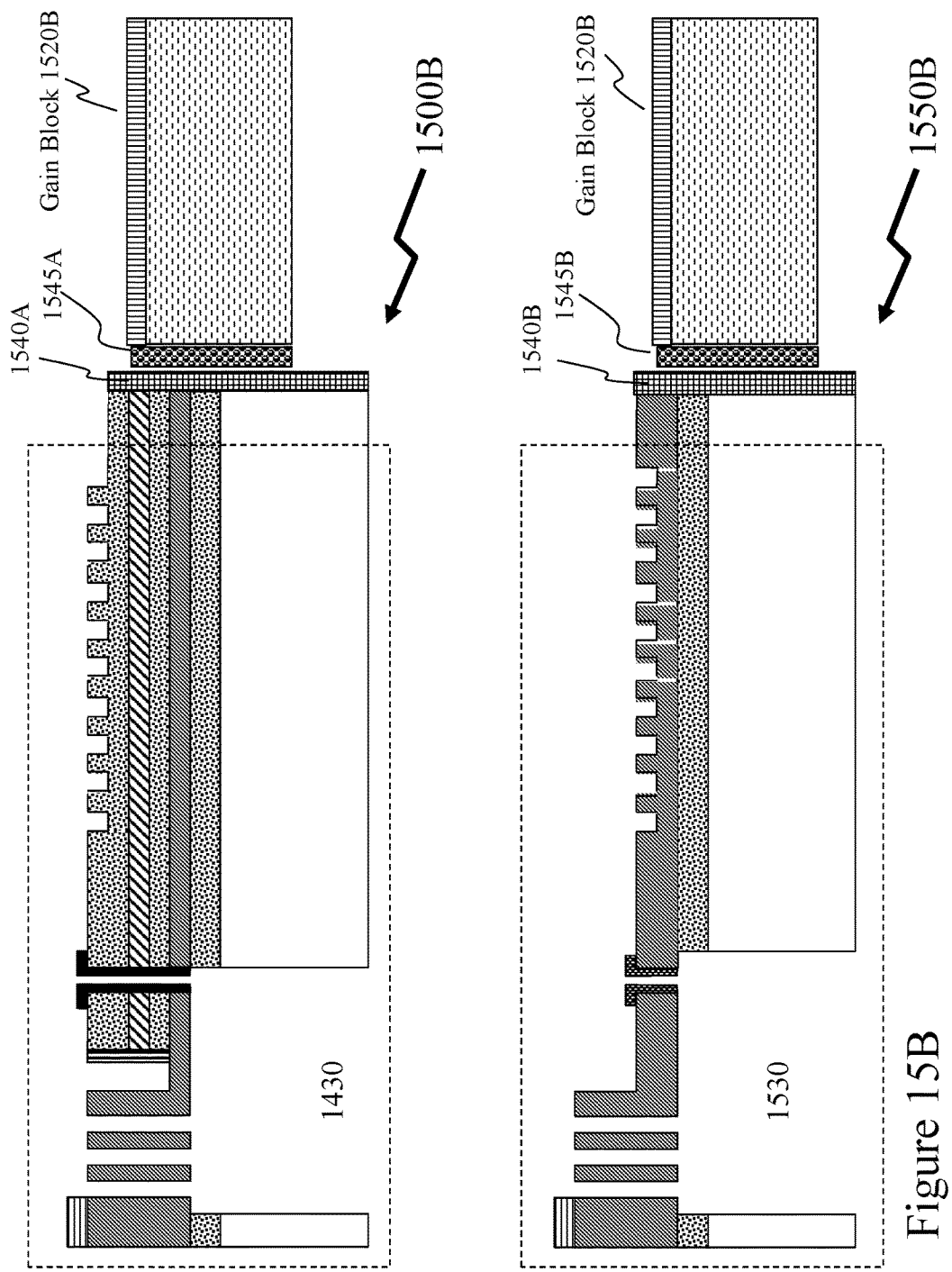
FIG. 15B depicts cross-sections through wavelength selective MOTUS optical engines according to an embodiment of the invention with hybrid butt coupling assembly of a semiconductor optical gain block with MOTUS where anti-reflectivity is improved by way of the combination of an angle in the waveguide in the gain block and anti-reflectivity coatings on the gain block, MOTUS or both.

Referring to FIG. 15B there are depicted first and second cross-sections 1500B and 1550B respectively through wavelength selective MOTUS optical engines according to an embodiment of the invention with hybrid butt coupling assembly of a semiconductor optical gain block 1520B with silicon nitride cored MOTUS 1430 and silicon cored MOTUS 1530 respectively. Accordingly, as depicted in each of first and second cross-sections 1500B and 1550B respectively the semiconductor optical gain block 1520B is aligned vertically, laterally, and longitudinally to the appropriate common waveguide with each of the silicon nitride cored MOTUS 1430 and silicon cored MOTUS 1530 respectively. As depicted in each anti-reflection (AR) coatings 1540A/1545A and 1540B/1545B are applied to the MOTUS and the semiconductor optical gain block 1520B respectively. These AR coatings may be established assuming a small air interface within the transition region or no air gap. Alternatively, a single coating may be applied to one or other of the MOTUS and semiconductor optical gain block assuming no air gap. Optionally, the semiconductor optical gain block 1520B may be mounted to a separate element of an overall assembly or it may be mounted to an underlying silicon substrate that has been appropriately patterned and deep etched for placement of the semiconductor optical gain block.

The optical interface between the semiconductor optical gain block 1520B and the silicon nitride cored MOTUS 1430 and silicon cored MOTUS 1530 respectively may also comprise angled facets relative to the optical waveguides with each of the semiconductor optical gain block 1520B and the silicon nitride cored MOTUS 1430 and silicon cored MOTUS 1530 respectively. Alternatively, the facets may be normal and the waveguides angled relative to the facets. The angled interfaces may reduce the reflectance and/or increase the AR coating manufacturing tolerances.

In addition to the optical gain block an external modulator may also be hybridly integrated with the MOTUS optical engine either as a discrete element or integrated with the optical gain block. It would also be evident that whilst the optical gain block is shown at the end of the MOTUS optical engine distal from the SC-MEMSM that in other embodiments of the invention according to the number of channels, rotation angle of the SC-MEMSM, acceptable handling width of optical gain block, etc., that the gain block 1610 discretely or the gain block 1610 and modulator 1620 may be disposed closer to the SC-MEMSM thereby reducing the length of the optical cavity forming the laser cavity as depicted in FIG. 16.

Figure 17:
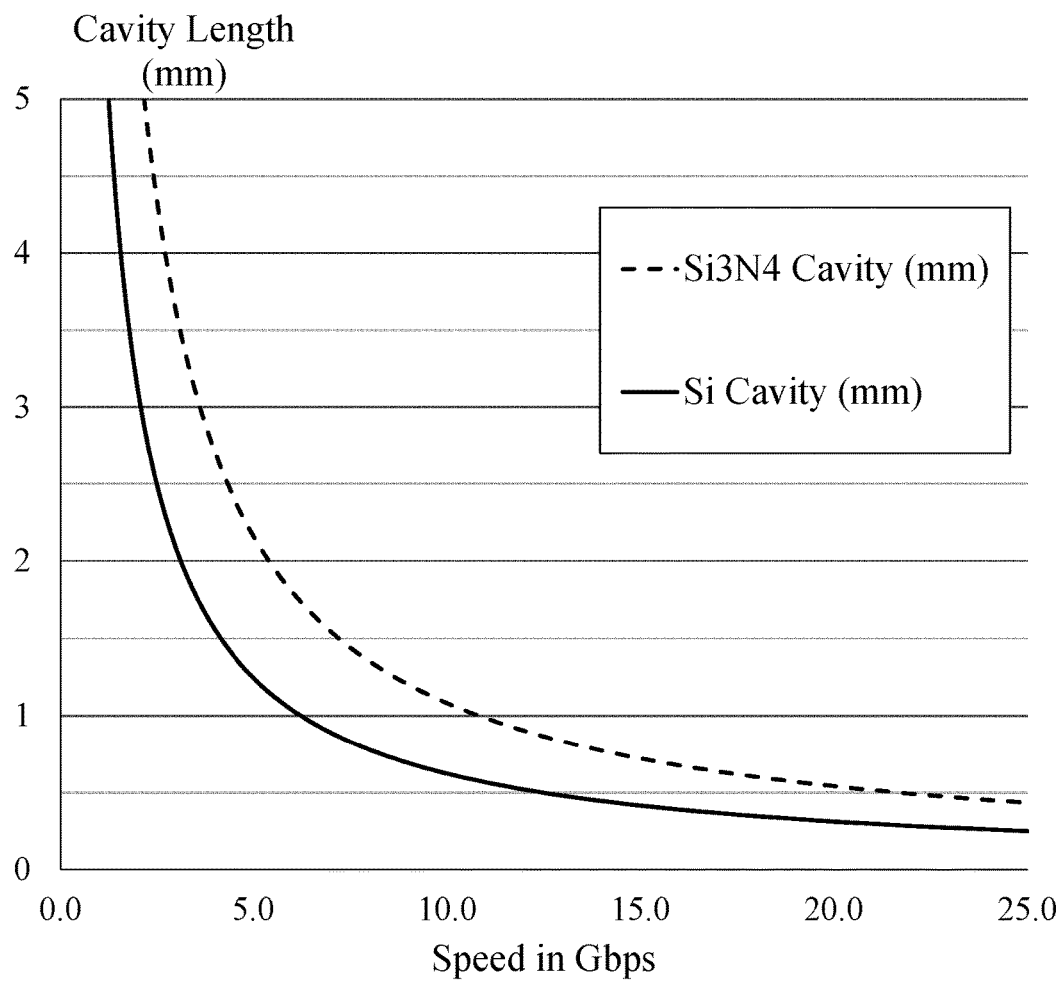
FIG. 17 depicts maximum modulation speed versus cavity length for an external cavity laser comprising a semiconductor optical gain block with a wavelength selective MOTUS optical engine for wavelength setting for both silicon nitride and silicon waveguide cores.

Accordingly, referring to FIG. 17 there is depicted analysis of the maximum modulation speed of a cavity comprising a facet of a gain block and a Bragg reflector versus the length of the cavity. Accordingly, for OC-48 data transmission at 2.5 Gb/s the cavity length with a $Si_3N_4$ cored waveguide should be less than approximately 4 mm compared to 2.5 mm for Si. With increasing speed the cavity length decreases to the point that at OC-192 (10 Gbps) cavity lengths should be less than 1 mm.

Referring to FIG. 18 there is depicted a wavelength selective MOTUS optical engine 1800 according to an embodiment of the invention with hybrid integration of a semiconductor die 1840 which comprises monolithically integrated form a semiconductor optical gain block 1830, a high reflectivity mirror 1820, and external Mach-Zehnder modulator 1810 such that the multiple distributed Bragg reflector-external tunable cavity laser (MDBR-ECTL) is externally modulated by the Mach-Zehnder modulator 1810. The high reflectivity mirror 1820 operates in conjunction with the wavelength selective Bragg grating within the MOTUS optical engine to provide the required cavity for lasing operation in conjunction with the semiconductor optical gain block 1830.

Now referring to FIG. 19 there is depicted a wavelength selective MOTUS optical engine according to an embodiment of the invention with post-wavelength filter optical detectors 1920 at the ends of the optical channel waveguides within which the Bragg gratings are formed. Each optical detector 1920 is coupled to the circuit edge via a track 1910. Accordingly, the optical power detected by an optical detector 1920 may be employed to provide feedback control for the semiconductor optical gain block within the laser structure. This is possible as the Bragg grating is not 100% reflective and accordingly some of the laser signal reaches the optical detector 1920 and as the laser oscillates at the wavelength of the Bragg grating the power detected on that channel detector 1920 is proportional to the laser output. Additionally, optical power comparison between the optical detector 1920 for the selected wavelength and those channels adjacent may be employed to provide additional feedback information.

Referring to FIG. 20 there is depicted a wavelength selective MOTUS 2050 optical engine according to an embodiment of the invention acting as the tuning element for a wavelength selective receiver 2000. Accordingly an input optical signal is coupled to an optical circulator 2010 wherein it is coupled to the MOTUS 2050. The reflected signal at the wavelength selected by tuning the SC-MEMSM within the MOTUS 2050 is then coupled back to the optical circulator 2010 and therein to the photodetector 2020.

Whilst the optical circulator 2010 provides for separation of the input forward propagating signals and backward propagating signals these can be bulky and expensive devices. Accordingly, referring to FIG. 21 there is depicted a wavelength selective receiver (WSR) 2100 according to an embodiment of the invention exploiting a wavelength selective MOTUS optical engine with Bragg grating based transmissive Fabry-Perot filters and coupler combiners. Accordingly the SC-MEMSM mirror allows for selection of the appropriate Fabry-Perot filter 2140 within the array of Fabry-Perot filters. Each Fabry-Perot filter 2140 is comprised of first and second Bragg gratings 2130A and 2130B that act in conjunction with one another to provide a high finesse filter, see for example Legoubin et al in "Free Spectral Range Variations in Grating-Based Fabry-Perot Filters Photowritten in Optical Fibers" (J. Opt. Soc. Am. A, Vol. 12, No. 8, pp-1687-1694). The outputs of the upper and lower waveguide groups are each coupled to a multi-mode interferometer (MMI), first and second MMI 2110A and 2110B respectively, and therein to first and second photodetectors 2120A and 2120B. Optionally, directional couplers and/or Mach-Zehnder interferometers may be cascaded to provide similar functionality.

As noted supra the design of the MOTUS optical engine allows for asymmetry in the waveguides. An example of this is depicted in FIG. 22 where there is depicted a WSR 2200 according to an embodiment of the invention exploiting a wavelength selective MOTUS optical engine with Bragg grating based transmissive Fabry-Perot filter array and offset input waveguide. Accordingly, as in FIG. 21 each waveguide comprises a Fabry-Perot filter 2140 is comprised of first and second Bragg gratings 2130A and 2130B that act in conjunction with one another to provide a high finesse filter. Now, however, the outputs of these are coupled via a single MMI 2210 to a single photodetector 2220.

Figure 23:
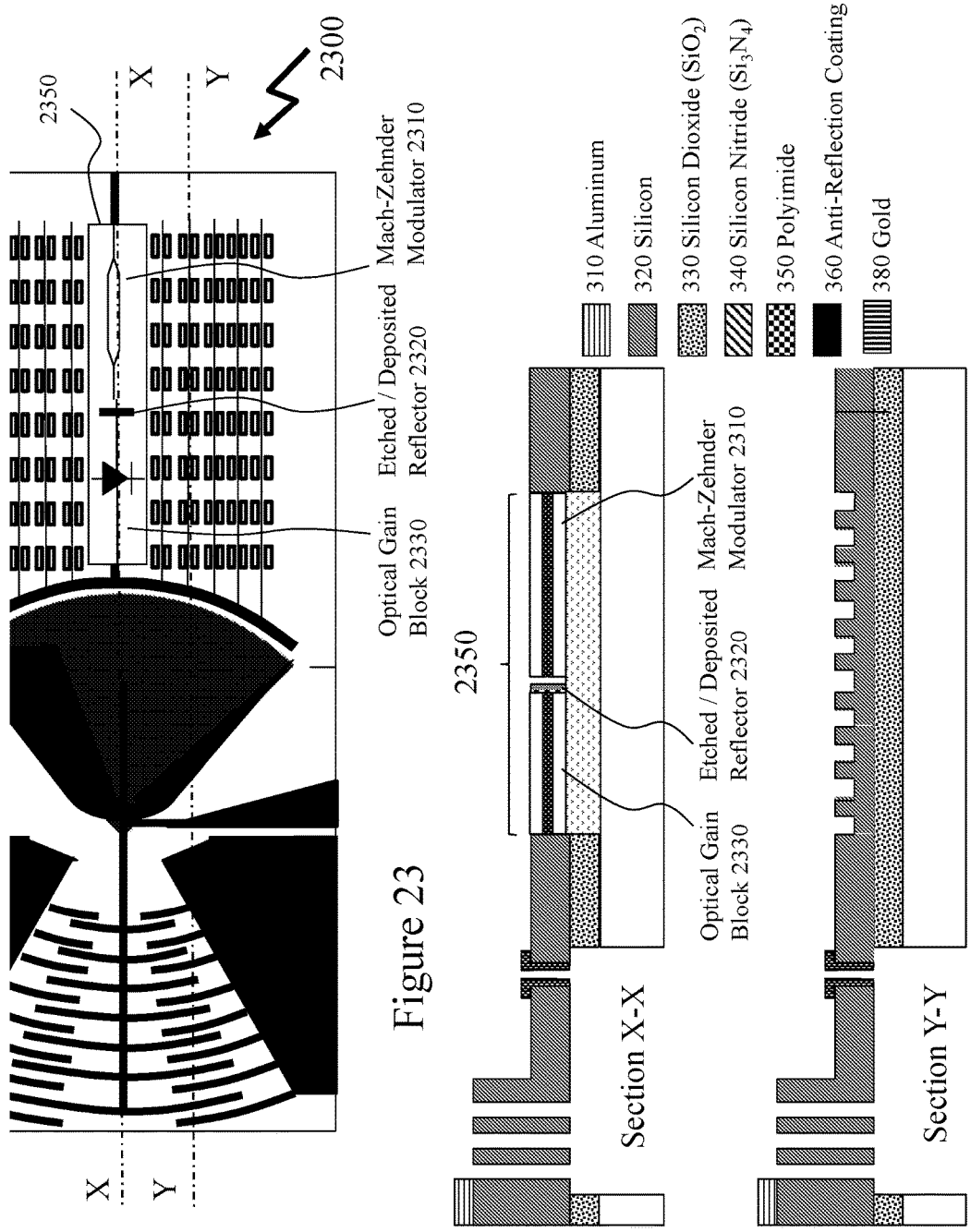
FIG. 23 depicts cross-sections through a wavelength selective optical transmitter according to an embodiment of the invention incorporating integrated semiconductor die with semiconductor optical gain blocks, high reflectivity mirror, and external Mach-Zehnder filter.

Now referring to FIG. 23 there are depicted first and second cross-sections X-X and Y-Y through a wavelength selective optical transmitter according to an embodiment of the invention incorporating integrated semiconductor structure 2350 comprising a semiconductor optical gain block 2330, high reflectivity mirror 2320, and external Mach-Zehnder modulator 2310. Second cross-section Y-Y is similar to that depicted in eleventh image 600K in FIG. 9 for a finished MOTUS optical engine depicted the cross-section through the SC-MEMS and Bragg waveguide grating. As depicted in first cross-section X-X according to this embodiment of the invention the semiconductor structure 2350 has been deposited directly onto the silicon substrate of the silicon-on-insulator structure such the waveguide sections of the semiconductor structure 2350 are butt-coupled to the silicon core waveguides of the MOTUS optical engine. Whilst these interfaces are depicted as being perpendicular within FIG. 23 these interfaces may be angled to suppress return loss as in fact they may also be in the other embodiments of the invention in FIGS. 14 and 15 for example wherein hybrid flip-chip integration is depicted. According to the operating wavelength of the MOTUS the semiconductor structures may be AlGaInAs, InGaAsP, and GaAs based for example.

Within other embodiments of the invention according to variations of flip-chip mounting the semiconductor optical gain block and external modulator evanescent coupling from the passive waveguides, see for example Park et al. in "A Hybrid AlGaInAs—Silicon Evanescent Amplifier" (IEEE Phot. Tech. Lett., Vol. 19, pp. 230-232) and Bowers et al. in "Integrated Optical Amplifiers on Silicon Waveguides" (Proc. Integrated Photonics and Nanophotonics Research and Applications, Paper ITuG1, 2007).

Within other embodiments of the invention the semiconductor optical laser may be formed within the silicon core waveguides using concepts including, but not limited to, microring lasers. At other wavelength ranges, e.g. 1300 nm, structures such as semiconductor components comprising a Si substrate, an active region, and a Si capping layer on said active region. The active region, see U.S. Pat. No. 6,403,975, may be a superlattice comprising alternating layers of $Si(1-y)C(y)$ and $Si(1-x-y)Ge(x)C(y)$. In another embodiment it is a superlattice comprising a plurality of periods of a three-layer structure comprising Si, $Si(1-y)C(y)$ and $Si(1-x)Ge(x)$ and in another a plurality of periods of a three-layer structure comprising Si, $Si(1-y)C(y)$ and $Si(1-x-y)Ge(x)C(y)$ layers.

Within the embodiments of the invention a conventional semiconductor gain block based upon a semiconductor optical amplifier (SOA) may be employed for the gain block. Alternatively, a quantum dot SOA (QD-SOA) may be employed with appropriate coatings to provide the gain block or as an optical amplifier within optical circuits such as the ROADSTER for example. In some embodiments of the invention a pair of QD-SOA amplifiers may be employed rotated with respect to one another by 90° in order to compensate for polarization dependent effects within the QD-SOAs. Alternatively, a polarization diversity circuit with dual optical amplifiers may be employed.

Now referring to FIGS. 24A to 26 there are depicted micro-positioner concepts according to embodiments of the invention as established by the inventors in U.S. Provisional Patent Application 62/037,655 "Methods and Systems for Microelectromechanical Packaging" filed Aug. 15, 2014, the entire contents of which are herein included by reference. Accordingly in FIG. 13A there is depicted a cross-section of the waveguide/MEMS structure of an optical component exploiting MEMS such as a MOTUS as described supra in respect of embodiments of the invention wherein in addition to MEMS mirror a MEMS micro-actuator is implemented for active/dynamic alignment. Accordingly, a silicon 320 substrate of nominal thickness 675 µm has formed upon it a 1-3 µm layer of $SiO_2$ 330 and then a silicon 320 layer of minimum thickness 11-16 µm depending upon the optical waveguide structure which forms the basis of the MEMS elements. Within the waveguide region(s) the waveguide is comprised of a lower cladding layer of $SiO_2$ 330 with thickness 2-4 µm, a silicon nitride ($Si_3N_4$) core of thickness 70 nm≤t≤220 nm, and upper cladding layer of $SiO_2$ 330 with thickness 2-4 µm. Accordingly, based upon the etching of the lower 1-3 µm layer of $SiO_2$ 330 and silicon 320 substrate different regions of the device may be formed including supported MEMS structure 2410, free standing MEMS structure 2420, Micro-Opto-Electro-Mechanical structure 2430, and optical waveguide structure 2440.

Within other embodiments of the invention different SOT, waveguide core thicknesses may be employed according to the design criteria of the MOTUS. For example, at 1550 nm in singlemode optical waveguides reduced polarization dependence can be achieved through the use of square waveguides with $SiO_2$ upper and lower cladding. For example, a 600 nm×600 nm core may be employed.

Figure 24A:
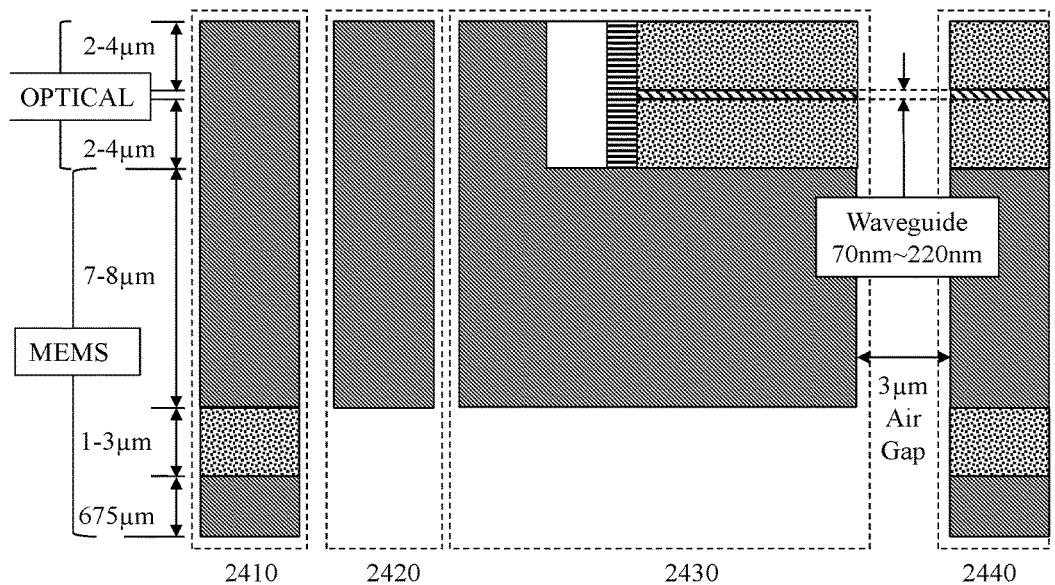
FIGS. 24A to 24C depict cross-sections of alternate structures for a MOEMS according to embodiments of the invention.
Figure 24B:
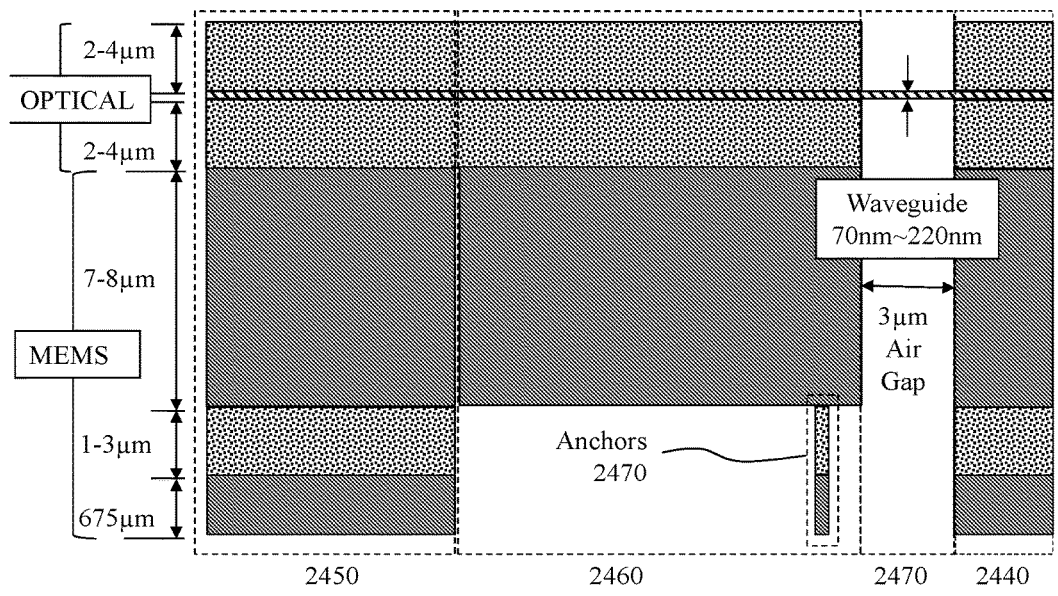

Now referring to FIG. 24B there is depicted a cross-section of a MOEMS exploiting a waveguide/MEMS structure similar to that depicted in FIG. 24A and of an optical component exploiting MEMS such as a MOTUS as described supra in respect of embodiments of the invention wherein in addition to MEMS mirror a MEMS micro-actuator is implemented for active/dynamic alignment. As with FIG. 24A the layer stack comprises a silicon 320 substrate of nominal thickness 675 µm has formed upon it a 1-3 µm layer of $SiO_2$ 330 and then a silicon 320 layer of minimum thickness 11-16 µm depending upon the optical waveguide structure which forms the basis of the MEMS elements was originally formed but has been etched down to 7-8 µm. The optical waveguide structure is comprised of a lower cladding layer of $SiO_2$ 330 with thickness 2-4 µm, a silicon nitride ($Si_3N_4$) core of thickness 70 nm≤t≤220 nm, and upper cladding layer of $SiO_2$ 330 with thickness 2-4 µm. Accordingly, the MOEMS is structured with 4 different cross-sections including supported MOEMS 2450, unsupported MOEMS 2460, exposed core 2470, and optical waveguide structure 2440. In unsupported MOEMS 2460 the underlying silicon 320 substrate and silicon dioxide 330 have been removed, except for anchor(s) 2470, leaving the optical waveguide supported on the MEMS silicon 320. In exposed core 2470 the underlying silicon 320 substrate, sacrificial silicon dioxide 330, MEMS silicon 320, and upper/lower silicon dioxide 330 claddings have been removed leaving a short region of exposed silicon nitride 240 core. Within other embodiments of the invention exposed core 2470 may be alternatively be the optical waveguide absent MEMS silicon 320 support or the optical waveguide with reduced thickness upper and/or lower cladding.

Figure 24C:
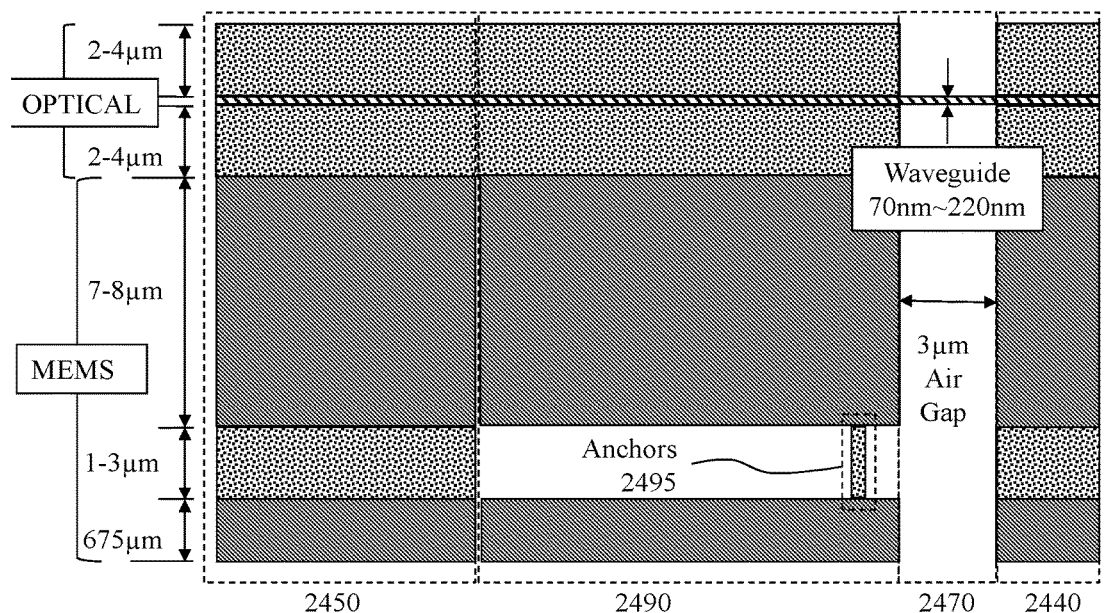

Now referring to FIG. 24C there is depicted a cross-section of a MOEMS exploiting a waveguide/MEMS structure similar to that depicted in FIGS. 24A and 24B comprising a silicon 320 substrate of nominal thickness 675 µm; a 1-3 µm layer of $SiO_2$ 330; a silicon 320 mechanical layer; and an optical waveguide structure comprised of a lower cladding layer of $SiO_2$ 330 with thickness 2-4 µm, a silicon nitride ($Si_3N_4$) core of thickness 70 nm 220 nm, and upper cladding layer of $SiO_2$ 330 with thickness 2-4 µm. In this instance the unsupported MOEMS 2460 is replaced with released MOEMS 2490 wherein the mechanical silicon 320 layer has been released from the silicon 320 substrate by etching the lowermost $SiO_2$ 330 but the silicon 320 substrate has not been removed. Accordingly, the anchors 2480 have now been replaced with anchors 2495 formed solely within the sacrificial $SiO_2$ 330 layer.

Figure 25:
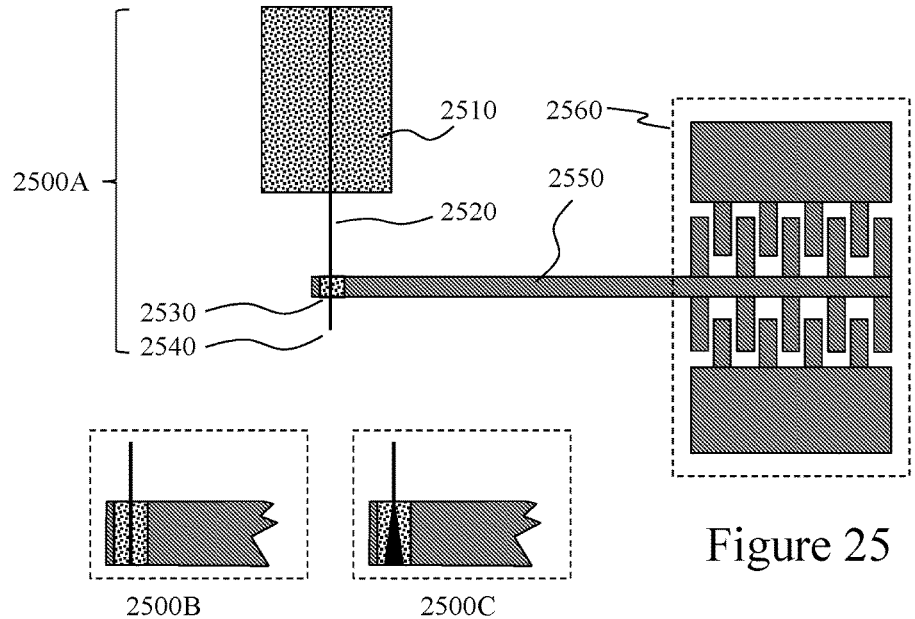
FIG. 25 depicts a lateral waveguide micro-positioner design according to an embodiment of the invention for the alignment/misalignment of an optical waveguide with another optical waveguide or optical component.

Now referring to FIG. 25 there is depicted a MOEMS optical waveguide micro-positioner (MOEMS OWMP) 2500A according to an embodiment of the invention together with first and second variant MOEMS OWMPs 2500B and 2500C respectively. As depicted the MOEMS OWMP 2500A comprises the following regions:
  an initial section upon non-suspended waveguide 2510, equivalent to optical waveguide structure 2410;
  a first exposed core region 2520, equivalent to exposed core 2470;
  optical waveguide upon actuator 2530, equivalent to unsupported MOEMS 2460; and
  a second exposed core region 2540, equivalent to exposed core 2470.

As depicted the optical waveguide upon actuator 2530 is supported by MEMS beam 2550 which is connected to MEMS actuator 2560. Accordingly, motion of the MEMS actuator 2560 results in translation of the optical waveguide upon actuator 2530 and second exposed core region 2540 relative to either another optical waveguide or an optical component. As such, with a pair of optical waveguides of which the MOEMS OWMP 2500A forms part then a variable optical attenuator (VOA) functionality can be directly integrated into the MOEMS for power management etc. First and second variant MOEMS OWMPs 2500B and 2500C respectively depict designs without the second exposed core region 2540 and with an optical waveguide taper respectively. Other variants such as an optical waveguide taper forming part of the second exposed core region 2540 may be implemented, for example, as would be evident to one of skill in the art.

Figure 26:
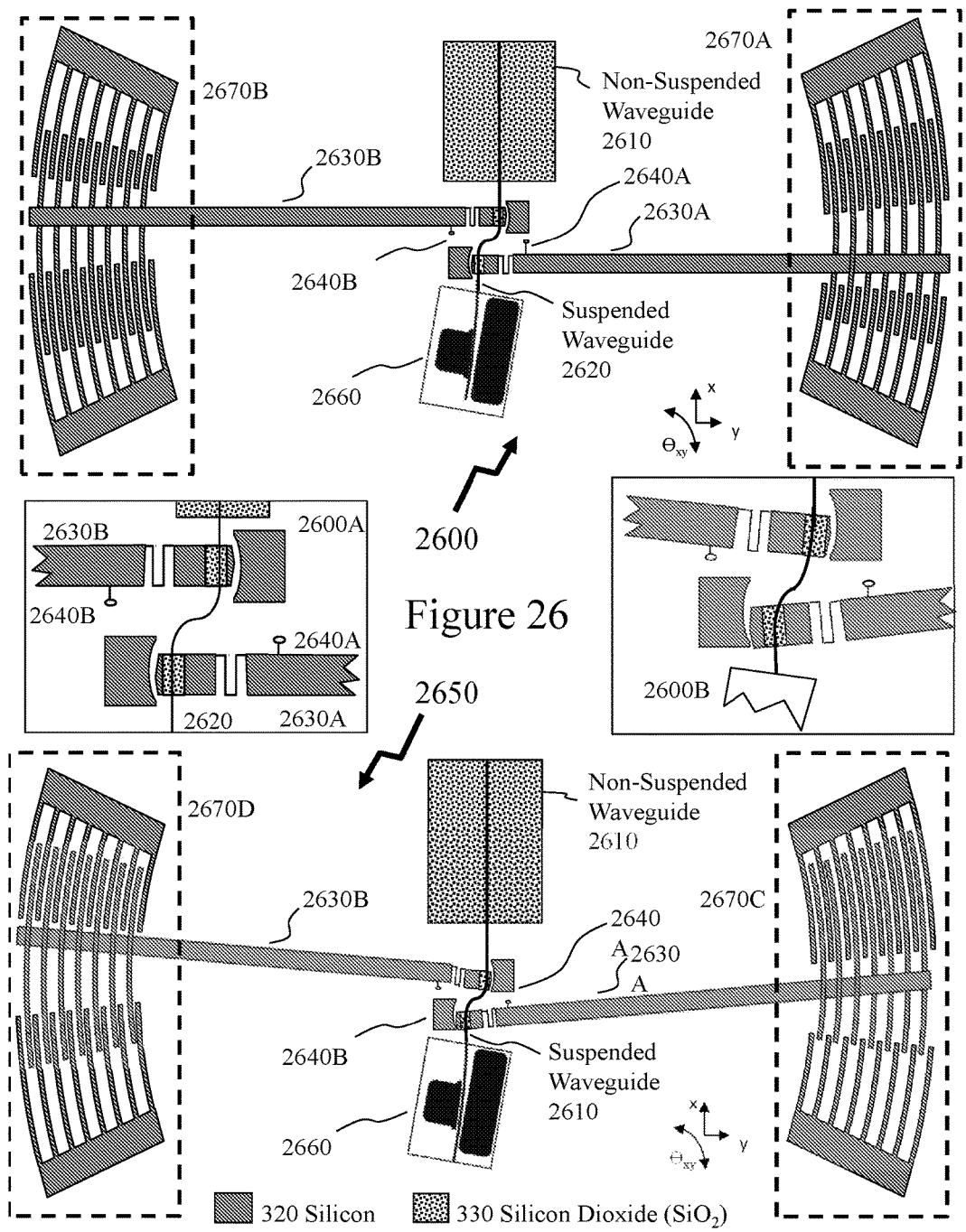
FIG. 26 depicts a waveguide micro-positioner design according to an embodiment of the invention for the alignment/misalignment of an optical waveguide with another optical waveguide or optical component as employed in the manipulation of a silicon nitride-on-silicon waveguide within a MOEMS exploiting MEMS micro-positioners.

Now referring to FIG. 26 there is depicted a MOEMS optical waveguide micro-positioner according to an embodiment of the invention in first position 2600 and second position 2650. As depicted first and second actuators 2630A and 2630B are coupled at one end to first and second angular comb drives 2670A and 2670B respectively. At the other ends upon the first and second actuators 2630A and 2630B are optical waveguide 2620 sections. As evident from FIG. 26 and inset 2600 the optical waveguide 2620 comprises:
  an initial section upon non-suspended waveguide 2610, equivalent to supported MOEMS 2450;
  a first exposed core region, equivalent to exposed core 2470;
  optical waveguide upon second actuator 2630B, equivalent to unsupported MOEMS 2460;
  a second exposed core region, equivalent to exposed core 2470;
  optical waveguide upon first actuator 2630A, equivalent to unsupported MOEMS 2460; and
  a third exposed core region, equivalent to exposed core 2470 and the portion of the optical waveguide 2620 closest to the optical gain block die 2660.

Accordingly, activation of one or other or both of the first and second angular comb drives 2670A and 2670B results in the movement of the respective one of the first and second actuators 2630A and 2630B which pivot about their respective anchors 2640A and 2640B such that the distal ends of the first and second actuators 2630A and 2630B from the first and second angular comb drives 2670A and 2670B similarly move thereby moving the optical waveguide supported by these distal ends of the first and second actuators 2630A and 2630B. In FIG. 26 in first configuration 2600 and inset 2600A the MOEMS optical waveguide micro-positioner is depicted in a first state, e.g. as manufactured or alternatively as the first and second angular comb drives 2670A and 2670B have been driven to position the first and second actuators 2630A and 2630B to these positions. Now referring to second configuration 2650 and second inset 2600B then the MOEMS OWMP according to an embodiment of the invention is depicted after rotation and/or further rotation of the first and second angular comb drives 2670C and 2670D which result in the pivoting of the distal ends of the first and second actuators 2630A and 2630B around first and second anchors 2640A and 2640B which result in the optical waveguide geometry being varied to that of suspended waveguide 2610 and the position of the end of the optical waveguide shifting.

Within telecommunication architectures such as those supporting the full service access network many variants of passive optical networks (PONs) have been considered. Amongst, these are next generation PON architectures exploiting WDM and TDM such as the cost called Next Generation PON stage 2 (NG-PON2) which exploits a coloured optical line terminal (OLT) coupled to an optical distribution network (ODN) with colorless optical network units (ONUs) coupled to the distributive ODN. In such networks colorless implies that the ONU or other element operates over a range of optical wavelengths without requiring the network operator to select and deploy wavelength specific (coloured) components/devices. One approach is the exploitation of small free spectral range components whilst another is to deploy wavelength tunable/settable components. Within an NG-PON2 the OLT determines the bandwidth and wavelength for each ONU such that both the receiver and the transmitter within the ONU must be wavelength settable.

Figure 27A:
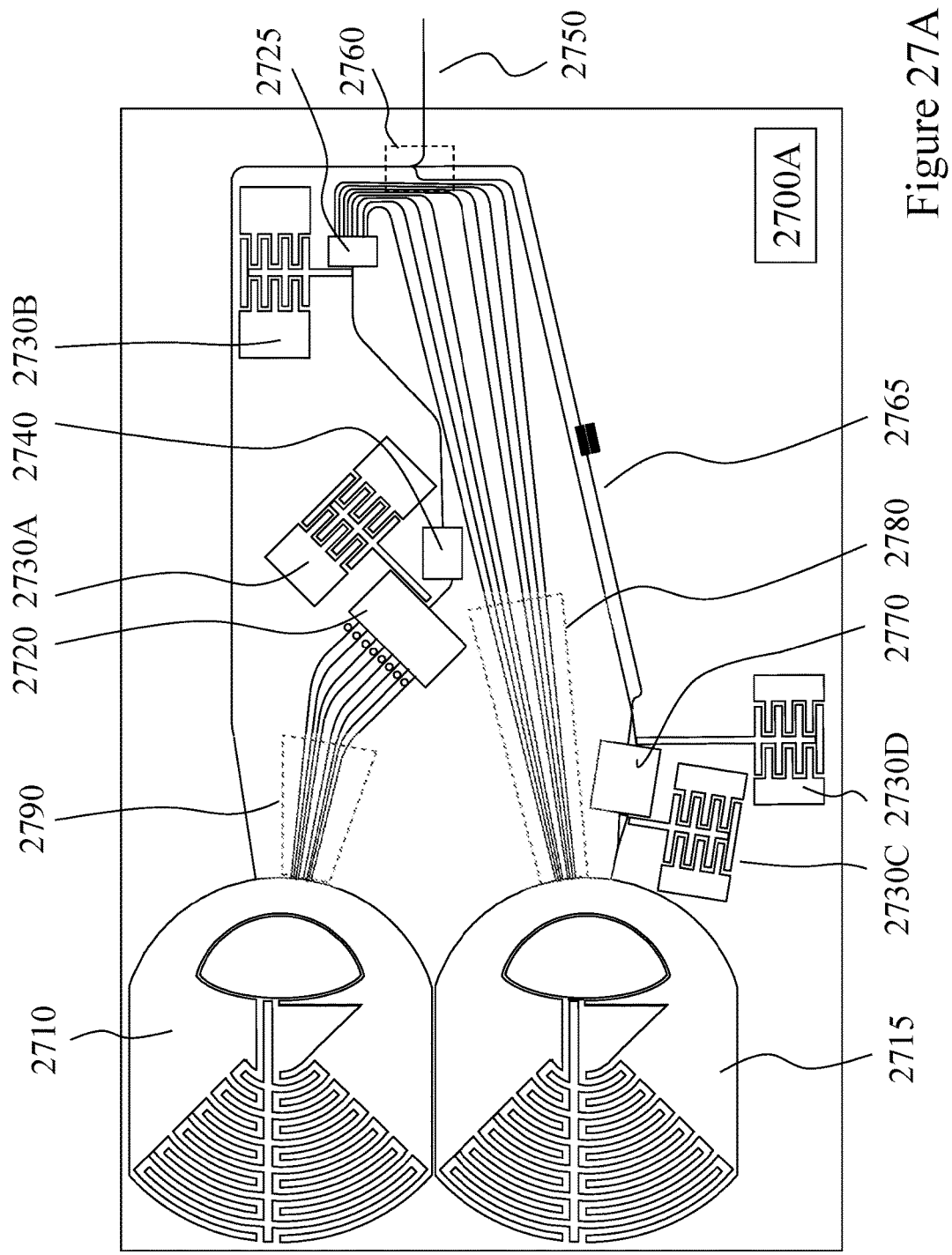
FIGS. 27A and 27B depict wavelength tunable dual-band transceivers for next generation networks exploiting wavelength selective MOTUS optical engines with Bragg grating based transmissive and reflective filters in conjunction with InP optical amplifiers, APDs, and Mach-Zehnder modulator.

Now referring to FIG. 27A there is depicted such an 8-wavelength tunable ONU according to an embodiment of the invention for an NG-PON2 application employing a dual-band transceiver circuit 2700A exploiting a pair of wavelength selective MOTUS optical engines 2710 and 2715 respectively. As depicted the transceiver circuit 2700A is coupled to an optical fiber 2750 and comprises a band filter circuit 2760 which receives a L-band wavelength signal from second wavelength selective MOTUS optical engine 2715 and couples it to the optical network via the band filter circuit 2760 whilst C-band optical signals from the optical network are coupled from the band filter circuit 2715 to the first wavelength selective MOTUS optical engine 2710. The first wavelength selective MOTUS optical engine 2710 employs transmissive filters, such as described and depicted in respect of the WSR 2200 in FIG. 22, within transmissive filter array 2790 which are coupled to a photodetector circuit 2740 via first combiner circuit 2720. Accordingly, the selected C-band channel is filtered and coupled to a receive photodetector within photodetector circuit 2740.

In contrast the second wavelength selection MOTUS optical engine 2715 employs an array of reflective filters 2780 in combination with a reflective SOA (RSOA) element 2770 to form a wavelength selective resonating cavity wherein the resulting wavelength specific output from the high reflectivity facet of the RSOA element 2770 is coupled via a Mach-Zehnder modulator 2765 to the band filter circuit 2760 and therein to the optical fiber 2750. The outputs from the array of reflective filters 2780 are combined via second combiner circuit 2725 and coupled to photodetector circuit 2740. Optical alignment within the transceiver circuit 2700A is provided via first to fourth MEMS actuators 2730A to 2730D wherein these respectively provide:

Alignment from first combiner circuit 2720 to the optical waveguide coupling to the photodetector circuit 2740;
Alignment from second combiner circuit 2725 to the optical waveguide coupling to the photodetector circuit 2740;
Alignment between optical waveguide coupled to second wavelength selection MOTUS optical engine 2715 and RSOA element 2770; and
Alignment between high reflectivity facet of RSOA element 2770 and optical waveguide coupling to the Mach-Zehnder modulator 2765.

For example, first and second combiner circuits 2720 and 2725 may employ a tree-structure of directional coupler wavelength division multiplexers (WDMs) and/or Mach-Zehnder interferometer WDMs as well as single to multi-mode couplers, array waveguide grating (AWG) WDMs etc. The photodetector circuit 2740 may be implemented within the same silicon circuit as the passive optical waveguides, transmissive and reflective wavelength filters, first and second wavelength selective MOTUS optical engines 2710 and 2715 etc. The photodetector circuit 2740 comprises a high speed photodetector for the received data on the C-band optical signal filtered and a low speed photodetector for the outputs from the array of reflective filters 2780 within the L-band. Alternatively, the photodetector circuit 2740 may be an InP die flip-chipped to the transceiver circuit 2700A with or without additional actuators for alignment depending upon the alignment tolerances of the optical photodetector(s). The RSOA element 2770 would be an InP die flip-chipped to the transceiver circuit 2700A.

Figure 27B:
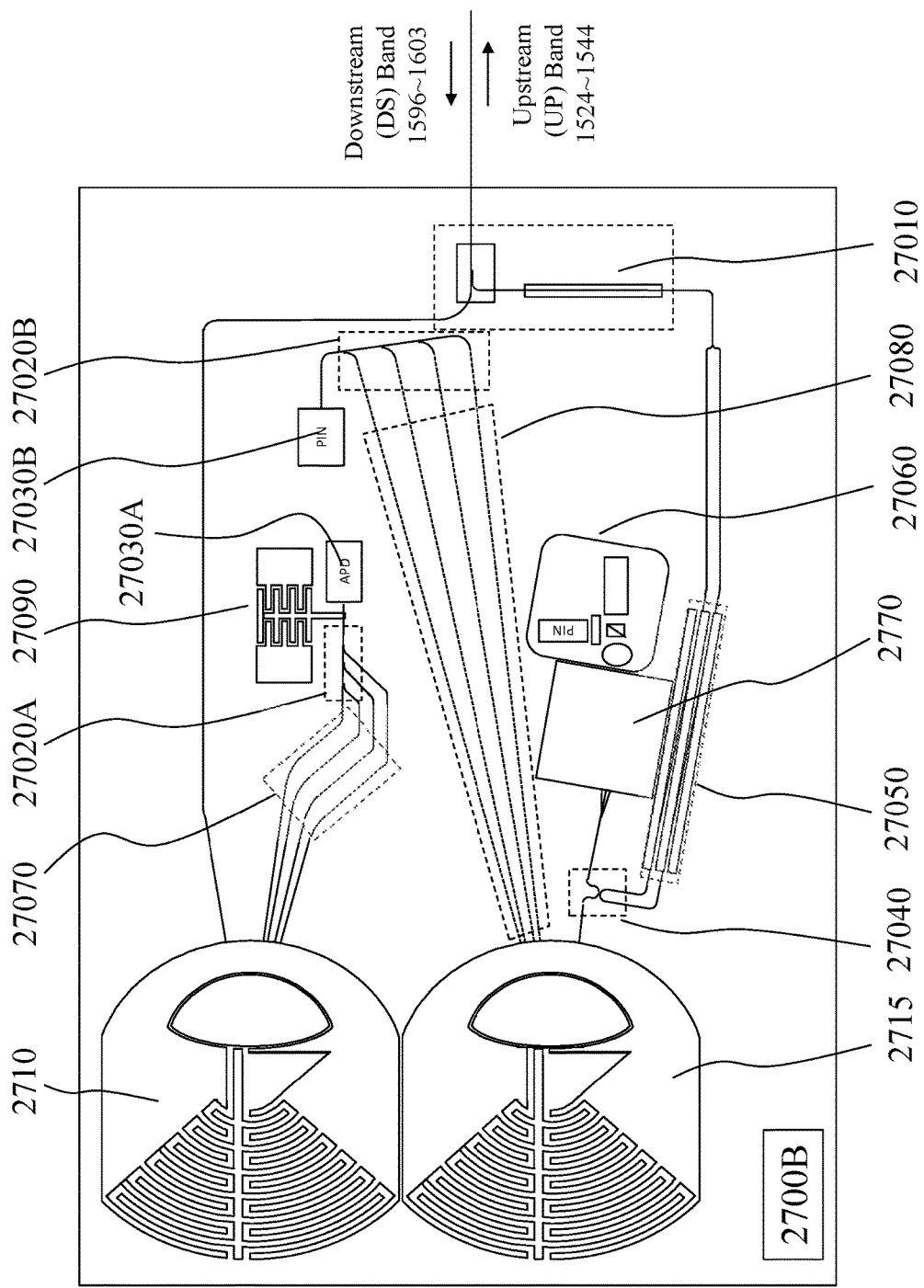

Now referring to FIG. 27B there is depicted such a 4-wavelength tunable ONU according to an embodiment of the invention for an NG-PON2 application employing a dual-band transceiver circuit 2700B exploiting a pair of wavelength selective MOTUS optical engines 2710 and 2715 respectively. As depicted the dual-band transceiver circuit 2700B receives a downstream (DS) band signal between 1596-1603 nm whilst transmitting an upstream (UP) band signal between 1524-1544 nm. Accordingly, the network connection is made via an optical filter circuit 27010 comprising a directional coupler and DS/UP Bragg filter. The DS band signal is coupled and selected via the first wavelength selective MOTUS optical engines 2710 and transmissive optical filters 27070 to first optical photodetector 27030A via first combiner circuit 27020A. The UP band signal is coupled to the network via optical filter circuit 27010 having been generated via a tunable optical source comprising RSOA element 2770 with second wavelength selective MOTUS optical engines 2715 in conjunction with Bragg reflective filter array 27080 and wavelength locker 27060. The tunable optical source has disposed within a tap coupler 27040 which couples via a Mach-Zehnder modulator 27050 to the optical filter circuit 27010. The outputs from the Bragg reflective filter array 27080 are coupled via second combiner circuit 27020B to second optical photodetector 27030B.

Also depicted within dual-band transceiver circuit 2700B in FIG. 27B is a MEMS OWMP 27090 according to an embodiment of the invention disposed between the first combiner circuit 27020A on the output optical waveguide and coupling it to the second optical photodetector 27030B. As such the MEMS OWMP 27090 can perform micro-positioning for alignment tolerances of the flip-chip mounting of the optical photodetector 27030B, e.g. an avalanche photodiode (APD), but also perform optical power management under controller feedback to limit and/or avoid saturation of the APD under higher optical powers received at the dual-band transceiver circuit 2700B.

Within dual-band transceiver circuit 2700B the optical filter circuit 27010 may be replaced by a directional coupler. Any upstream signals reflected within the network are isolated from the transmitter through the split ratio of the tap coupler 27040 in conjunction with double pass excess loss of the Mach-Zehnder modulator 27050 and double pass excess loss of the coupler at the front-end of the dual-band transceiver circuit 2700B. Within other transceivers WDM components for coupling the upstream/downstream signals from and to the transceiver.

Figure 28A:
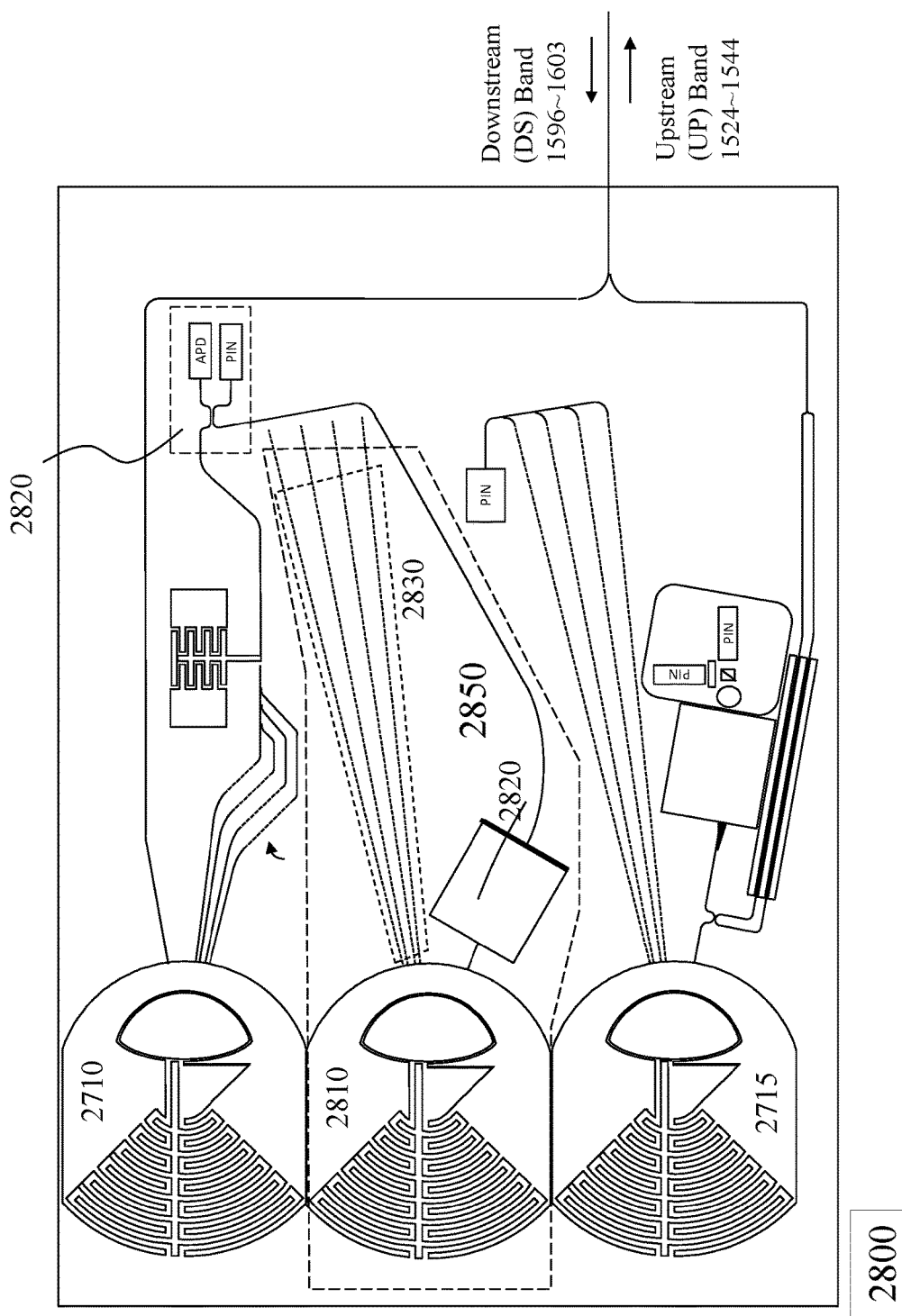
FIG. 28A depicts a wavelength tunable dual-band transceivers for next generation networks employing optical coherent receiver for the downstream link.

Now referring to FIG. 28A there is depicted a 4-wavelength tunable ONU according to an embodiment of the invention for a next generation telecommunications network application employing a dual-band transceiver circuit 2800 exploiting a pair of wavelength selective MOTUS optical engines 2710 and 2715 respectively such as described supra in respect of FIG. 27B. First wavelength selective MOTUS optical engine 2710 being coupled to the downstream channel and providing wavelength filtering but rather than being coupled to a single APD the wavelength filtered output is coupled to a coherent receiver circuit 2820 comprising a polarization splitter and a pair of APDs for mixing of the received optical signal with a local oscillator for phase and/or frequency keyed data to be downconverted. The second wavelength selective MOTUS optical engine 2715 forms part of a wavelength tunable upstream transmitter employing reflective Bragg gratings in combination with an OSA and wavelength locker such as described in FIG. 27B. However, the dual-band transceiver circuit 2800 now also comprises third wavelength selective MOTUS optical engine 2810 which in conjunction with reflective OSA 2820 and Bragg filter array 2830 to provide wavelength tunable optical source 2850 to provide the local oscillator (LO) for the coherent receiver circuit 2820.

Figure 28B:
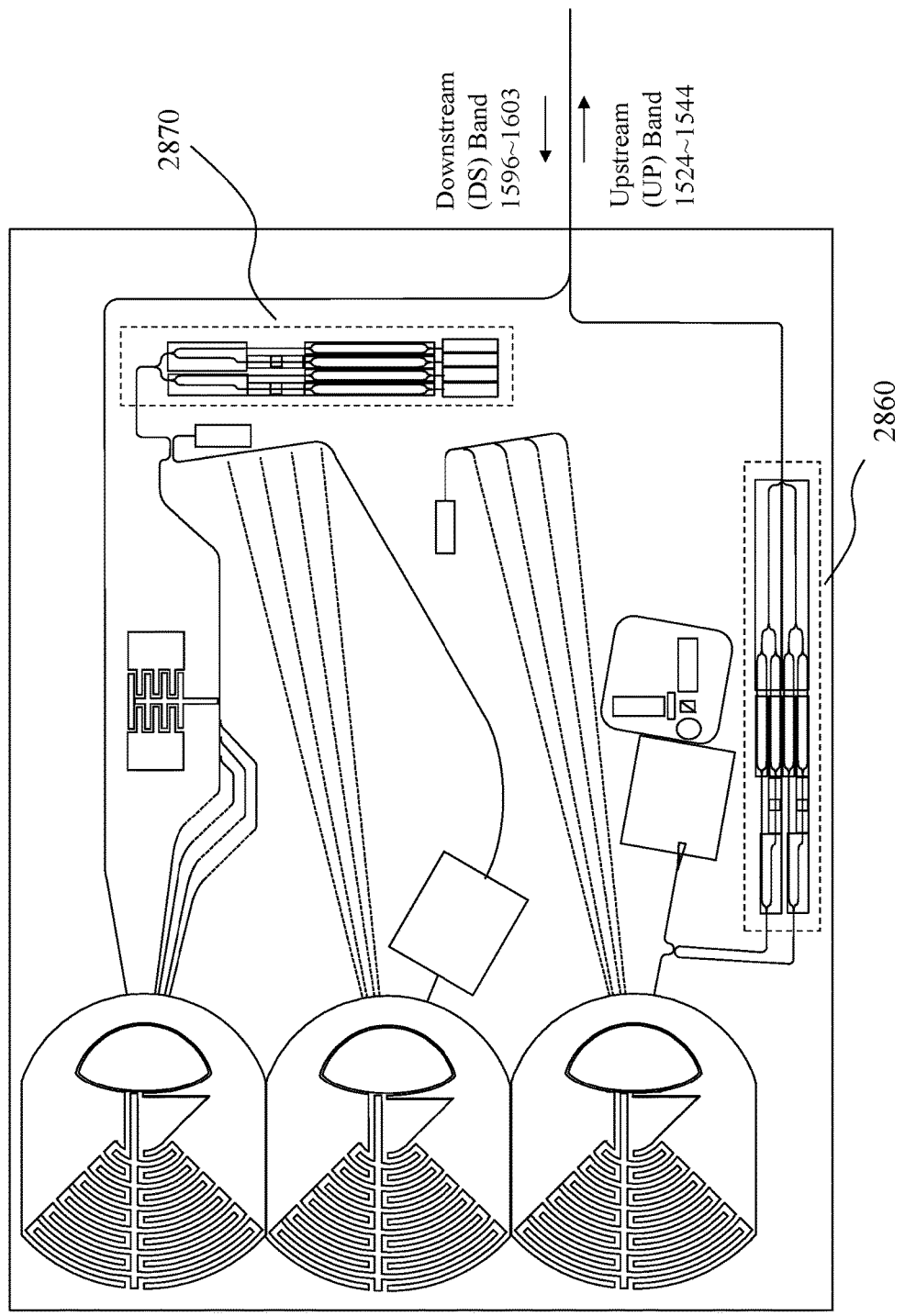
FIG. 28B depicts a wavelength tunable dual-band QPSK transceivers for next generation networks exploiting wavelength selective MOTUS optical engines with Bragg grating based transmissive and reflective filters in conjunction with InP optical amplifiers, APDs, and Mach-Zehnder modulators.

Now referring to FIG. 28B there is depicted a 4-wavelength tunable ONU according to an embodiment of the invention for a next generation telecommunications network application employing a dual-band transceiver circuit 2800B which is configured essentially the same as the 4-wavelength tunable ONU described and depicted in dual-band transceiver circuit 2800 in FIG. 28A except that it supports bidirectional Quadrature Phase Shift Keying (QPSK) communications through QPSK modulator 2860 on the upstream channel and coherent QPSK detector circuit 2870 on the downstream channel.

In contrast to other wavelength tunable lasers within other transmitters and transceivers the LO should provide both TE and TM polarisations such that incoming variations in the state of polarization do not result in receiver signal fade as the LO and received signal become orthogonal in polarization. This can be achieved either through design of the optical waveguides/gratings in conjunction with the OSA or through employing a polarization scrambler/rotator such as known in the prior art employing, for example, dual core waveguides. Optionally, dual polarizations may be exploited as dual carriers such that dual polarization (DP) transmission may be undertaken with each polarization encoded using quadrature phase shift keying (QPSK), for example, to provide DP-QPSK modulation.

Figure 29A:
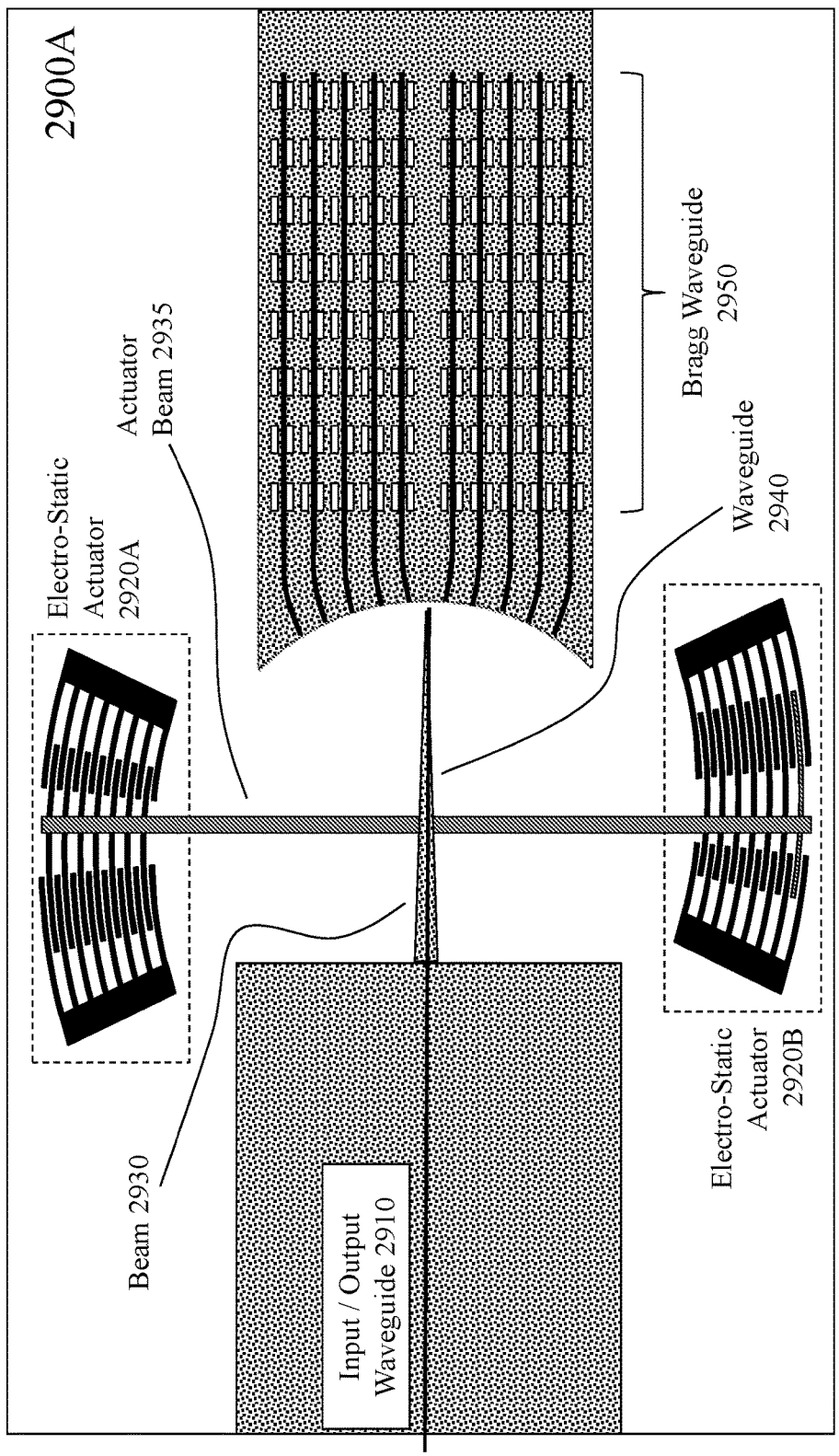
FIGS. 29A and 29B depict an alternate waveguide to wavelength selective filter coupling mechanism according to embodiments of the invention exploiting direct waveguide coupling from the tilted beam of a MEMS actuator.
Figure 29B:
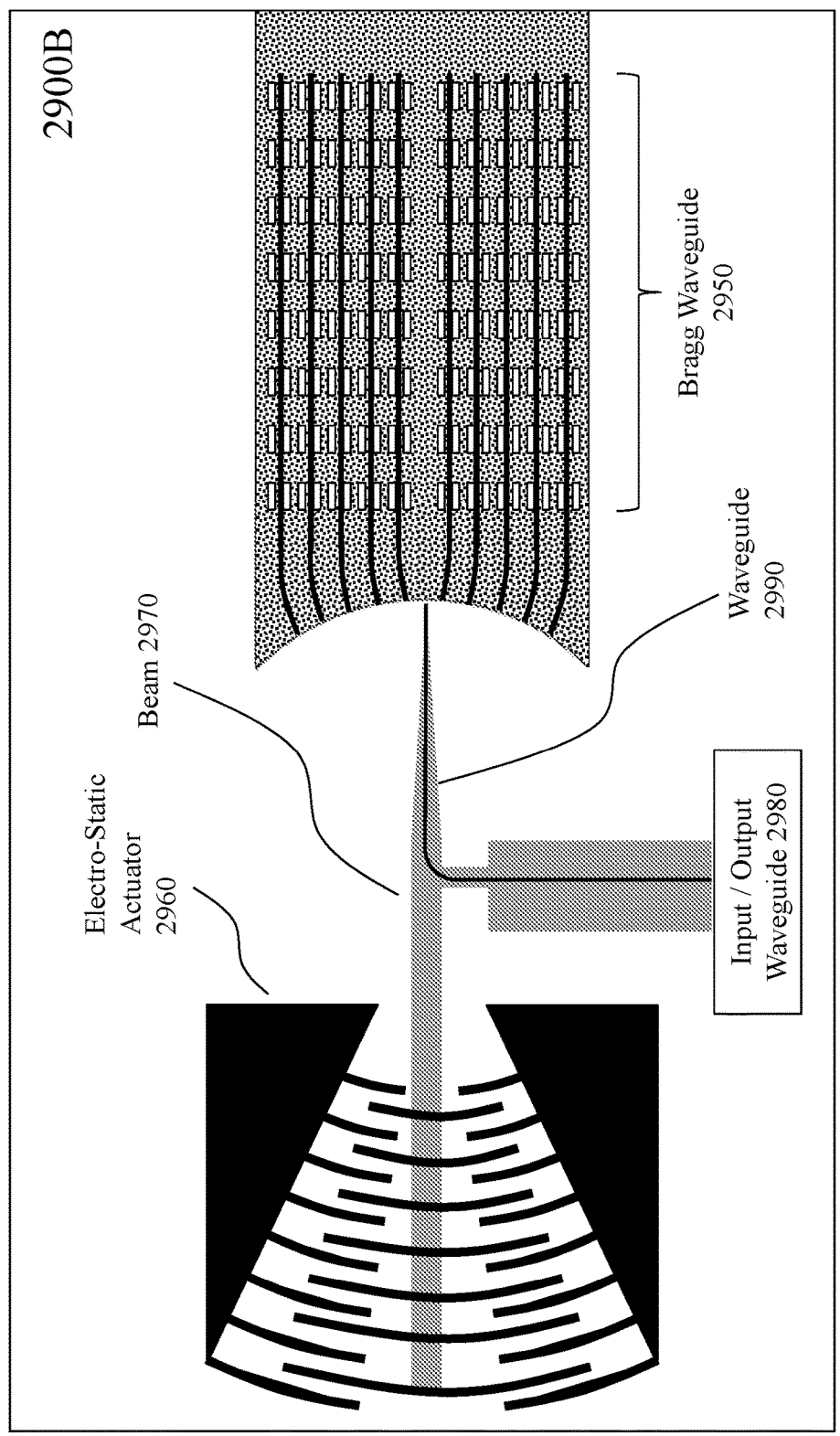

Now referring to FIGS. 29A and 29B there are depicted first and second wavelength selective filters 2900A and 2900B respectively according to an alternate waveguide to wavelength selective filter coupling mechanism according to embodiments of the invention exploiting direct waveguide coupling from the tilted beam of a MEMS actuator. Referring to FIG. 29A and first wavelength selective filter 2900A an array of Bragg gratings 2950 are depicted as discussed and described supra in respect of embodiments of the invention. In contrast to the MOEMS mirror an input/output waveguide 2910 becomes unsupported waveguide 2940 and is disposed upon free standing beam 2930 which is coupled to the actuator beam 2935 of a MEMS actuator comprising first and second electro-static MEMS actuators 2920A and 2920B respectively such as described supra in respect of embodiments of the invention. Accordingly, rotation of the first and second electro-static MEMS actuators 2920A and 2920B respectively rotates the actuator beam 2935 and therein the beam 2930 based upon its pivot point, the pivot not being depicted for clarity. Accordingly, the waveguide end facet of waveguide 2940 is rotated and aligned to one of the Bragg gratings 2950 wherein the reflected signal is coupled back as described in other embodiments of the invention exploiting reflective Bragg grating structures. It would be apparent that in other embodiments of the invention the reflective Bragg filters may be transmissive Bragg filters coupling to other waveguides at their distal ends away from the MOEMS structure or that Fabry-Perot filters may be employed. Optionally, no wavelength selective elements are present allowing the structure to operate as an 1×N optical switch. Optionally, rather than first and second electro-static MEMS actuators 2920A and 2920B respectively being rotational actuators these are linear actuators based upon appropriate positioning of the pivot point. Optionally, a single actuator may be employed.

Now referring to FIG. 29B and second wavelength selective filter 2900B an array of Bragg gratings 2950 are depicted as discussed and described supra in respect of embodiments of the invention. In contrast to the MOEMS mirror an input/output waveguide 2980 becomes unsupported waveguide 2990 and is disposed upon free standing beam 2970 which is coupled to a MEMS actuator 2960 such as described supra in respect of embodiments of the invention exploiting rotary electro-static actuation. Accordingly, rotation of the electro-static MEMS actuator 2960 rotates the free standing beam 2970 based upon its pivot point, the pivot not being depicted for clarity. Accordingly, the waveguide end facet of waveguide 2990 is rotated and aligned to one of the Bragg gratings 2950 wherein the reflected signal is coupled back as described in other embodiments of the invention exploiting reflective Bragg grating structures. It would be apparent that in other embodiments of the invention the reflective Bragg filters may be transmissive Bragg filters coupling to other waveguides at their distal ends away from the MOEMS structure or that Fabry-Perot filters may be employed. Optionally, no wavelength selective elements are present allowing the structure to operate as an 1×N optical switch. Within second wavelength selective filter 2900B the optical waveguide has been depicted absent the silicon dioxide layer for clarity.

It would be evident to one skilled in the art that the first and second wavelength selective filters 2900A and 2900B in FIGS. 29A and 29B respectively may be employed in the MOEMS optical circuits described supra in respect of receivers, transmitters, and transceivers within FIGS. 1 through 28 respectively.

Figure 30:
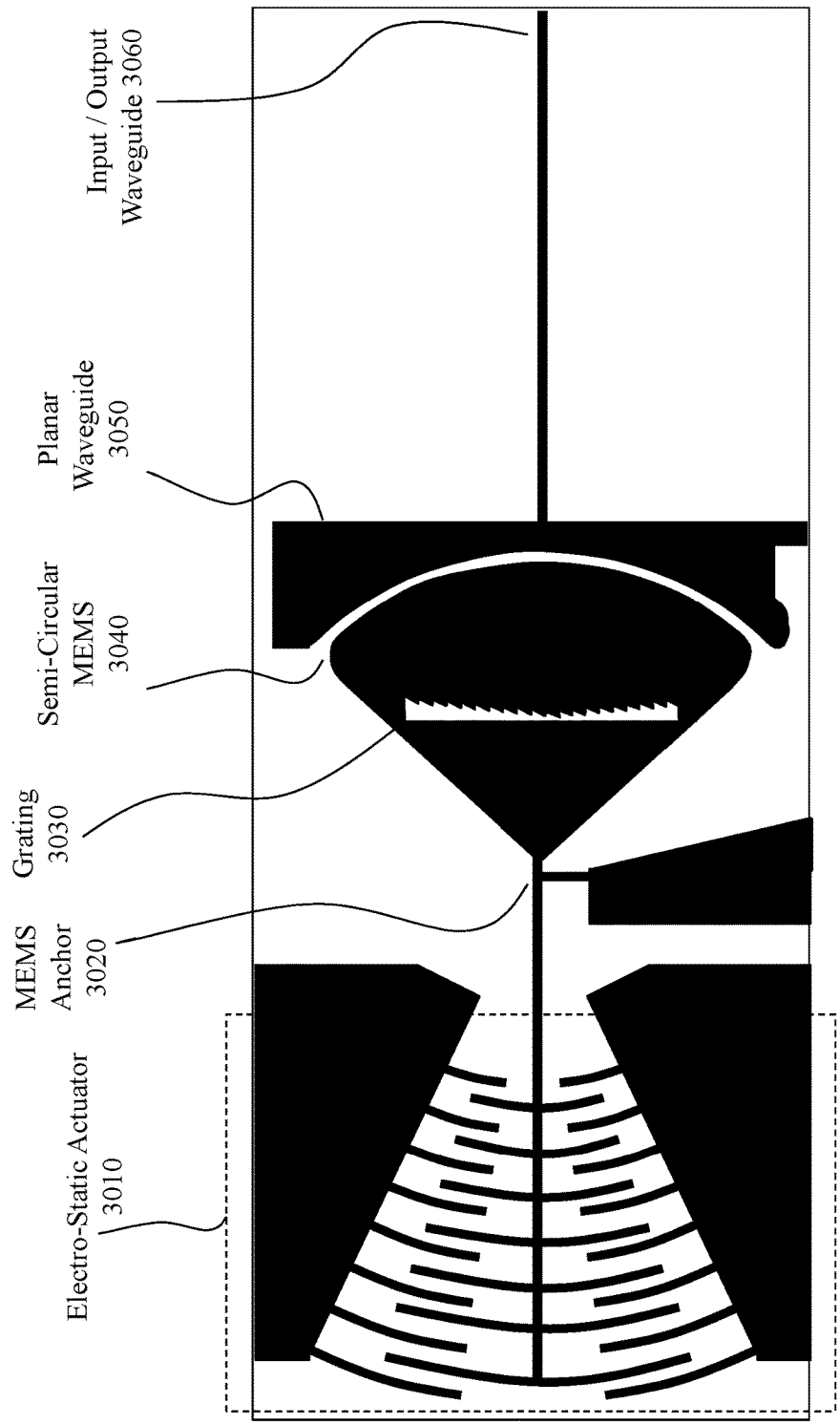
FIG. 30 depicts an alternate exemplary wavelength selective MOTUS optical engine according to an embodiment of the invention.

Now referring to FIG. 30 there is depicted an alternate exemplary MOTUS optical engine 3000 according to an embodiment of the invention employing a MEMS tuned grating 3030 for wavelength selective reflection. Accordingly, an input/output three-dimensional (3D) optical waveguide 3060 couples to/from a short planar waveguide region before coupling to a planar (two dimensional or 2D) waveguide which forms part of a semi-circular (SC) MEMS 3040 such as described supra in respect of embodiments of the invention. The SC-MEMS 3040 is coupled to an electro-static actuator 3010 such that movement of the electro-static actuator 3010 results in rotation of the SC-MEMS 3040 through the pivot point defined by the MEMS anchor 3010.

However, rather than the rotation of the SC-MEMS 3040 adjusting the point at which the input/output waveguide 3060 is re-imaged laterally to another waveguide the rotation of the SC-MEMS 3040 rotates the grating 3030 such that the wavelength reflected back to the input/output optical waveguide 3060 is adjusted. It would be evident that the grating 3030 within the planar (2D) optical waveguide on the surface of the SC-MEMS 3040 may be an echelle grating, echelon grating, or other reflective grating employing a plurality of distributed reflectors with offsets.

Optionally, the grating 3030 may also be formed upon the rear surface of the SC-MEMS 3030 rather than within the planar waveguide itself which may remove an additional lithography and etching sequence within the manufacturing flow. Optionally, the MEMS tuned waveguide grating optical routing described and depicted with respect to FIG. 30 may be employed within the other MOTUS optical engines described and addressed within this specification for wavelength selective filtering (either transmissive or reflective) and optical routing.

Within the embodiments of the invention described supra in respect of FIGS. 1 to 30 thin silicon and/or silicon nitride optical waveguides have been described. However, it would be evident that other embodiments may exploit thicker silica or silicon nitride or silicon oxynitride waveguide technologies in addition to others such as polymeric etc. Accordingly, thicker polarization independent optical waveguides may be employed as well as allowing implementation of athermal Bragg gratings.

Whilst embodiments of the invention described supra in respect of FIGS. 1 to 29B have been described primarily from the perspective of 1550 nm communications with C-band/L-band operation it would be evident that other embodiments may be implemented including those supporting the S-band, only C-band with band-splitting, only L-band with band-splitting, 1310 nm operation, and O-band operation and/or combinations thereof.

Within embodiments of the invention described above in respect of the Figures then it would be evident that an air gap is provided between the SC-MEMSM and the remaining optical circuit in order to allow the SC-MEMSM to freely rotate. However, once the wavelength is set it will typically be left at that wavelength for a significant period of time whereby removal of the requirement to maintain electrostatic actuation may be beneficial. Accordingly, within embodiments of the invention the SC-MEMSM is employed in conjunction with a linear actuator that pushes the SC-MEMSM towards the waveguides thereby reducing the gap or eliminating it such that friction may keep the SC-MEMSM in position.

Within other embodiments of the invention the upper surface of the SC-MEMS may have features formed upon it that the opposite shape to features formed on the upper surface of the optical waveguide section of the MOTUS. These may be formed, for example, using a metal deposited onto these surfaces whilst the air gap is filled within a sacrificial material, e.g. parylene, allowing one of the feature upon the SC-MEMSM or optical waveguide section to project forward of the optical sidewall. In this manner as the SC-MEMSM is moved forward under the action of a linear actuator then these features act to align the SC-MEMSM by their alignment and geometry. These features may therefore act to limit the subsequent lateral/rotational movement of the SC-MEMSM.

Within other embodiments of the invention the SC-MEMSM may be latched once set to the appropriate location. Such latching may, for example, be provided by a latching mechanism forming part of the lateral actuator or alternatively the latching may be achieved through a coupling another MEMS structure to the SC-MEMSM. Such a coupling may for example be a deformation of a MEMS formed above or adjacent to the SC-MEMSM to locate against a feature within the vertical surface of the SC-MEMSM or the sidewall of the SC-MEMS. With the knowledge of the rotation of the SC-MEMSM to one of a series of predetermined locations to align to the waveguides containing wavelength selective transmissive or reflective structures these features to latch the SC-MEMSM may be in predetermined locations.

Within other embodiments of the invention once the SC-MEMSM has been aligned to the appropriate waveguide then gripping latching actuators may grip the electrostatic actuators rotating the SC-MEMSM.

Within embodiments of the invention described above in respect of the Figures then it would be evident to one skilled in the art that these are specific but non-limiting embodiments. However, in other embodiments of the invention:

the Bragg gratings may be employed to filter forward propagating signals that proceed to other portions of the optical circuit and/optical system;

the Bragg gratings may be employed to reflect a predetermined portion and propagate the remainder;

optical filters contained in waveguides selected by the MEMS could be something else than a Bragg grating: e.g., Fabry-Perot cavities, ring resonators, photonic crystal, etc.

optical filters may be grating based such as echelle and echelon;

the SC-MEMSM mirror and/or the optical circuit may couple to free space optics rather than waveguide optical circuit elements;

the SC-MEMSM mirror may scan an optical signal;

the Bragg gratings may be formed using other techniques than cladding modulated first order gratings including, but not limited to, waveguide width variations, different optical materials, doping, ion implantation, and photoinduced refractive index variations;

the Bragg gratings may be uniform, sampled, apodized, chirped, and tilted.

Within embodiments of the invention described above in respect of the FIG. 1 then it would be evident to one skilled in the art that the embodiments have been described with respect to particular configurations. However, in other embodiments of the invention and wavelength tunable transmitters, receivers, and transceivers the Bragg gratings may be:

sequential in wavelength across the device;

pseudo-randomly sequenced; and according to a predetermined wavelength plan;

Within embodiments of the invention described above in respect of the Figures then it would be evident to one skilled in the art that these are specific but non-limiting embodiments. However, in other embodiments of the invention:

exploit multiple SC-MEMSM elements for increased angular range;

exploit paired SC-MEMSM elements to select/deselect a specific wavelength in different portions of an optical device;

exploit additional optical elements within the planar waveguide;

collimating/focusing transmissive grating;

collimating/focusing reflective grating;

polarizers;

multiple optical amplifiers coupling to multiple channel waveguides;

machined waveguide lens;

index induced waveguide lens;

waveguide Fresnel lens; and other variable optical properties of materials adjusted through mechanical transformation at sub-wavelength scales may be employed such as arising from compression, expansion, deformation, etc. of optically transparent media.

Within embodiments of the invention described above in respect of the Figures then it would be evident to one skilled in the art that these are specific but non-limiting embodiments. However, in other embodiments of the invention:

fluorinated polymers may be employed on the air gap facets of the waveguides for anti-reflection coatings;

the Bragg gratings within silicon nitride cored waveguides may be athermal or exhibit significantly reduced thermal wavelength shift, and that the MOTUS optical engine may be designed for operation at a predetermined elevated temperature allowing removal of cooling requirements within the assembled package that the MOTUS optical engine may be packaged with an external thermal heater to ensure that it operates at the desired elevated temperature.

that the MOTUS optical engine designed for operation at a predetermined elevated temperature may use the thermal dissipation requirements of the gain element in lieu or combination with the external thermal heater.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A device comprising:

a substrate;

a microoptoelectromechanical systems (MOEMS) element integrated upon the substrate in a first predetermined position comprising:

a rotatable microelectromechanical systems (MEMS) element;

an optical waveguide formed upon the rotatable MEMS element rotating under action of the rotatable MEMS element; and a mirror formed upon the rotatable MEMS element optically coupled to a facet of the optical waveguide;

a plurality of wavelength reflective filters integrated upon the substrate, each wavelength reflective filter of the plurality of wavelength reflective filters in a second predetermined position relative to the MOEMS element and optically coupled to the MOEMS element; and a reflective optical gain block disposed upon the substrate in a third predetermined position relative to the MOEMS element and optically coupled to the MOEMS element; wherein the MOEMS element optically couples optical signals to and from the reflective optical gain block and to and from a selected wavelength reflective filter of the plurality of wavelength reflective filters selected in dependence upon the rotation of the rotatable MEMS element; and the optical signals propagate within the optical waveguide formed upon the rotatable MEMS element and are reflected by the mirror formed upon the rotatable MEMS element.

2. The device according to claim 1, wherein the rotatable MEMS element is coupled to a rotational actuator for controlling the rotation of the rotatable MEMS element and a linear actuator for translating the rotatable MEMS element away from a facet of the optical waveguide thereby allowing rotational position setting of the rotatable MEMS actuator prior to re-engaging the rotatable MEMS element against the facet of the optical waveguide.

3. The device according to claim 1, wherein the rotatable MEMS element comprises:

at least one first feature upon a surface of the rotatable MEMS element with the planar waveguide; and a plurality of second features disposed upon a facet of the device; wherein the MOEMS device further comprises a linear actuator for translating the rotatable MEMS relative to the facet of the device such that:

in a first configuration the rotatable MEMS is moved towards the facet of the device such the at least one first feature is mated to a predetermined second feature of the plurality of second features once the rotatable MEMS element has been rotated to a first predetermined position associated with a selected first wavelength reflective filter of the plurality of wavelength reflective filters; and in a second configuration the rotatable MEMS is moved away from the facet of the device such that the rotatable MEMS element can be rotated to a second predetermined position associated with a selected second wavelength reflective filter of the plurality of wavelength reflective filters.

4. The device according to claim 1, wherein the reflective optical gain block comprises:

a first facet having a predetermined high reflectivity over a first optical passband disposed towards an input port of the device; and a second facet having a predetermined low reflectivity over the first optical passband; wherein the first optical passband covers the wavelengths reflected by the plurality of wavelength reflective filters; and the reflective optical gain block acts in combination with selected wavelength reflective filter of the plurality of wavelength reflective filters as a wavelength specific optical emitter having an optical emission wavelength and bandwidth established by the selected wavelength reflective filter of the plurality of wavelength reflective filters.

5. The device according to claim 1, further comprising a modulator either monolithically integrated with the reflective optical gain block or integrated upon the substrate.

6. The device according to claim 1, further comprising a first MEMS actuator coupled to first suspended waveguide portion of an optical circuit integrated upon the substrate which terminates in a first end; and a second MEMS actuator coupled to second suspended waveguide portion of an optical circuit integrated upon the substrate which terminates in a second end; wherein the first end of the first suspended waveguide portion is disposed towards a first facet of the reflective optical gain block;

the second end of the second suspended waveguide portion is disposed towards a second facet of the reflective optical gain block;

the first MEMS actuator provides adjustment of the position of the first end of the first suspended waveguide portion relative to a three-dimensional waveguide forming part of the reflective optical gain block;

the second MEMS actuator provides adjustment of the position of the second end of the second suspended waveguide portion relative to the three-dimensional waveguide forming part of the reflective optical gain block.

7. The device according to claim 1, further comprising an optical coupler integrated upon the substrate comprising:

a first port coupled to a first facet of the reflective optical gain block;

a second port coupled to the optical waveguide; and a third port coupled to an output port of the device;

an optical wavelocker coupled to a second facet of the reflective optical gain block.

8. The device according to claim 7, further comprising an optical modulator having an input coupled to the third port of the optical coupler and an output coupled to the output port of the device.

9. The device according to claim 1, further comprising either:

an optical detector disposed upon the substrate coupled a distal end of each wavelength filter of the plurality of wavelength filters to that disposed towards the rotatable MEMS;

or a plurality of optical detectors, each optical detector of the plurality of optical detectors coupled a distal end of each wavelength filter of a predetermined subset of the plurality of wavelength filters to that disposed towards the rotatable MEMS.

10. The device according to claim 1, further comprising a planar waveguide region disposed between the rotatable MEMS and an end of each wavelength reflective filter of the plurality of wavelength reflective filters.

11. A device comprising:

a substrate;

a microoptoelectromechanical systems (MOEMS) element integrated upon the substrate in a first predetermined position comprising:

a rotatable microelectromechanical systems (MEMS) element;

an optical waveguide formed upon the rotatable MEMS element rotating under action of the rotatable MEMS element; and a mirror formed upon the rotatable MEMS element optically coupled to a facet of the optical waveguide;

an optical coupler integrated upon the substrate comprising:

a first port coupled to an optical network for receiving optical signals;

a second port coupled to an optical detector at least one of disposed upon the substrate and integrated upon the substrate;

a third port for coupling first optical signals received by the optical coupler at the first port to the MOEMS element and coupling second optical signals received from the MOEMS element to the optical detector; and the optical detector disposed upon the substrate; wherein the first optical signals received from the network are coupled from the third port of the optical coupler to a selected wavelength reflective filter of a plurality of wavelength reflective filters via the optical waveguide and mirror;

the second optical signals are those optical signals within the first optical signals reflected by the selected wavelength reflective filter of the plurality of wavelength reflective filters and are coupled back to the third port of the optical coupler via the mirror and optical waveguide; and the selected wavelength filter of the plurality of wavelength reflective filters is established in dependence upon the rotation of the rotatable MEMS element to a predetermined position.

12. The device according to claim 11, wherein the rotatable MEMS element is coupled to a rotational actuator for controlling the rotation of the rotatable MEMS element and a linear actuator for translating the rotatable MEMS element away from a facet of the optical waveguide thereby allowing rotational position setting of the rotatable MEMS actuator prior to re-engaging the rotatable MEMS element against the facet of the optical waveguide.

13. The device according to claim 12, wherein the rotatable microelectromechanical systems MEMS element comprises:

at least one first feature upon a surface of the rotatable MEMS element with the planar waveguide; and a plurality of second features disposed upon a facet of the device; wherein the MOEMS device further comprises a linear actuator for translating the rotatable MEMS relative to the facet of the device such that:

in a first configuration the rotatable MEMS is moved towards the facet of the device such the at least one first feature is mated to a predetermined second feature of the plurality of second features once the rotatable MEMS element has been rotated to a first predetermined position associated with a selected first wavelength reflective filter of the plurality of wavelength reflective filters; and in a second configuration the rotatable MEMS is moved away from the facet of the device such that the rotatable MEMS element can be rotated to a second predetermined position associated with a selected second wavelength reflective filter of the plurality of wavelength reflective filters.

14. The device according to claim 11, further comprising a planar waveguide region disposed between the rotatable MEMS and an end of each wavelength reflective filter of the plurality of wavelength reflective filters.

15. A device comprising:
a substrate;
a microoptoelectromechanical systems (MOEMS) element integrated upon the substrate in a first predetermined position comprising:
  a rotatable microelectromechanical systems (MEMS) element;
  an optical waveguide formed upon the rotatable MEMS element rotating under action of the rotatable MEMS element; and
  a mirror formed upon the rotatable MEMS element optically coupled to a facet of the optical waveguide;
an optical coupler integrated upon the substrate comprising a first port coupled to an optical network for receiving optical signals and a second port for coupling the received optical signals to the optical waveguide; and
a plurality of transmissive wavelength filters integrated upon the substrate, each comprising a third port for receiving the received optical signals from the optical waveguide after reflection by the mirror and a fourth port for providing wavelength filtered optical signals to an optical detector;
wherein
rotation of the rotatable MEMS element to a predetermined position couples the received optical signals to a predetermined transmissive wavelength filter of the plurality of transmissive wavelength filters via the optical waveguide and mirror.

16. The device according to claim 15, wherein the rotatable MEMS element is coupled to a rotational actuator for controlling the rotation of the rotatable MEMS element and a linear actuator for translating the rotatable MEMS element away from a facet of the optical waveguide thereby allowing rotational position setting of the rotatable MEMS actuator prior to re-engaging the rotatable MEMS element against the facet of the optical waveguide.

17. The device according to claim 15, wherein the rotatable MEMS element comprises:
  at least one first feature upon a surface of the rotatable MEMS element with the planar waveguide; and
  a plurality of second features disposed upon a facet of the device; wherein
the MOEMS device further comprises a linear actuator for translating the rotatable MEMS relative to the facet of the device such that:
  in a first configuration the rotatable MEMS is moved towards the facet of the device such the at least one first feature is mated to a predetermined second feature of the plurality of second features once the rotatable MEMS element has been rotated to a first predetermined position associated with a selected first wavelength reflective filter of the plurality of wavelength reflective filters; and
  in a second configuration the rotatable MEMS is moved away from the facet of the device such that the rotatable MEMS element can be rotated to a second predetermined position associated with a selected second wavelength reflective filter of the plurality of wavelength reflective filters.

18. The device according to claim 15, wherein the optical detector is coupled to all fourth ports of the plurality of transmissive wavelength filters.

19. The device according to claim 15, wherein the optical detector is one of a plurality of optical detectors; and
each optical detector of the plurality of optical detectors is coupled to the fourth ports of a predetermined subset of the plurality of transmissive wavelength filters.

20. The device according to claim 15, further comprising a planar waveguide region disposed between the rotatable MEMS and an end of each wavelength reflective filter of the plurality of wavelength reflective filters.

21. A device comprising:
a substrate;
a microoptoelectromechanical systems (MOEMS) element integrated upon the substrate in a first predetermined position comprising:
  a rotatable microelectromechanical systems (MEMS) element;
  an optical waveguide formed upon the rotatable MEMS element rotating under action of the rotatable MEMS element; and
  a mirror formed upon the rotatable MEMS element optically coupled to a facet of the optical waveguide;
an optical coupler integrated upon the substrate comprising:
  a first port coupled to a first port of the device for coupling to a first predetermined portion of an optical network;
  a second port coupled to second port of the device for coupling to a second predetermined portion of the optical network;
  a third port coupled to the optical waveguide; and
  a plurality of fourth ports each coupled to a first end of a wavelength selective filter of a plurality of wavelength selective filters; and
the plurality of wavelength reflective filters, a second end of each wavelength reflective filter of the plurality of wavelength reflective filters being disposed at a predetermined position relative to the rotatable MEMS;
wherein
optical signals received at the first port of the coupler are coupled to the third port of the optical coupler to the rotatable MEMS and therein to a selected wavelength reflective filter of a plurality of wavelength reflective filters via the optical waveguide and mirror;
a first portion of the optical signals reflected by the selected wavelength reflective filter of the plurality of wavelength reflective filters are coupled back to the first port of the optical coupler via the optical waveguide, mirror, and third port of the coupler; and
a second portion of the optical signals not reflected by the selected wavelength reflective filter of the plurality of wavelength reflective filters are coupled to the second port of the optical coupler via the fourth port of the plurality of fourth ports associated with the selected wavelength reflective filter of the plurality of wavelength reflective filters.

22. The device according to claim 21, further comprising a planar waveguide region disposed between the rotatable MEMS and the second end of each wavelength reflective filter of the plurality of wavelength reflective filters disposed at a predetermined position relative to the rotatable MEMS.

* * * * *